United States Patent [19]

Murata et al.

[11] Patent Number: 5,734,188
[45] Date of Patent: Mar. 31, 1998

[54] SEMICONDUCTOR INTEGRATED CIRCUIT, METHOD OF FABRICATING THE SAME AND APPARATUS FOR FABRICATING THE SAME

[75] Inventors: Jun Murata, Kunitachi, Japan; Yoshitaka Tadaki, Palo Alto, Calif.; Hiroko Kaneko, Hamura-machi, Japan; Toshihiro Sekiguchi, Ohme, Japan; Hiroyuki Uchiyama, Fuchuu, Japan; Hisashi Nakamura; Toshio Maeda, both of Ohme, Japan; Osamu Kasahara, Hinode-machi, Japan; Hiromichi Enami, Tachikawa, Japan; Atsushi Ogishima; Masaki Nagao, both of Koganei, Japan; Michimasa Funabashi, Tachikawa, Japan; Yasuo Kiguchi, Kokubunji, Japan; Masayuki Kojima, Kokubunji, Japan; Atsuyoshi Koike, Kokubunji, Japan; Hiroyuki Miyazawa, Kodaira, Japan; Masato Sadaoka, Koganei, Japan; Kazuya Kadota, Hinode-machi, Japan; Tadashi Chikahara, Fuchuu, Japan; Kazuo Nojiri, Higashimurayama, Japan; Yutaka Kobayashi, Katsuta, Japan

[73] Assignee: Hitachi, Ltd., Tokyo, Japan

[21] Appl. No.: 674,185

[22] Filed: Jul. 1, 1996

Related U.S. Application Data

[63] Continuation-in-part of Ser. No. 620,867, Mar. 25, 1996, abandoned, and a division of Ser. No. 443,027, May 17, 1995, abandoned, which is a continuation of Ser. No. 112,719, Aug. 27, 1993, abandoned, which is a division of Ser. No. 881,314, May 7, 1992, Pat. No. 5,264,712, which is a continuation of Ser. No. 496,537, Mar. 20, 1990, abandoned, said Ser. No. 620,867, is a continuation of Ser. No. 254,562, Jun. 6, 1994, Pat. No. 5,504,029, which is a division of Ser. No. 894,351, Jun. 4, 1992, abandoned, which is a division of Ser. No. 246,514, Sep. 19, 1988, Pat. No. 5,153,658.

[30] Foreign Application Priority Data

| Sep. 19, 1987 | [JP] | Japan | 62-235906 |
|---|---|---|---|
| Sep. 19, 1987 | [JP] | Japan | 62-235909 |
| Sep. 19, 1987 | [JP] | Japan | 62-235910 |
| Sep. 19, 1987 | [JP] | Japan | 62-235911 |
| Sep. 19, 1987 | [JP] | Japan | 62-235912 |
| Sep. 19, 1987 | [JP] | Japan | 62-235913 |
| Sep. 19, 1987 | [JP] | Japan | 62-235914 |
| Mar. 20, 1989 | [JP] | Japan | 1-65848 |
| Mar. 20, 1989 | [JP] | Japan | 1-69069 |

[51] Int. Cl.$^6$ .......... H01L 29/76; H01L 29/94; H01L 31/062; H01L 3/119
[52] U.S. Cl. .......... 257/401; 257/390; 257/635
[58] Field of Search .......... 257/752, 390, 257/401, 635

[56] References Cited

U.S. PATENT DOCUMENTS

| 4,222,816 | 9/1980 | Noble, Jr. et al. |
| 4,355,374 | 10/1982 | Sakai et al. |

(List continued on next page.)

FOREIGN PATENT DOCUMENTS

| 56-21363 | 2/1981 | Japan. |
| 56-70657 | 6/1981 | Japan. |
| 61-6858 | 1/1986 | Japan. |
| 62-298159 | 12/1987 | Japan. |
| 63-193555 | 8/1988 | Japan. |
| 63-281457 | 11/1988 | Japan. |

*Primary Examiner*—Mahshid D. Saadat
*Assistant Examiner*—S. V. Clark
*Attorney, Agent, or Firm*—Antonelli, Terry, Stout & Kraus, LLP

[57] ABSTRACT

A semiconductor integrated circuit comprising first n-channel MISFETs constituting the memory cells of a storage system, second n-channel MISFETs constituting the peripheral circuits of the storage system, and third n-channel MISFETs constituting the output circuit among the peripheral circuits. The respective threshold voltages of the first n-channel MISFETs, the second n-channel MISFETs and the third n-channel MISFETs are decreased in that order when the respective gate lengths of those MISFETs are substantially the same.

13 Claims, 42 Drawing Sheets

U.S. PATENT DOCUMENTS

| | | |
|---|---|---|
| 4,551,741 | 11/1985 | Shimotori et al. . |
| 4,577,390 | 3/1986 | Haken . |
| 4,763,180 | 8/1988 | Hwang et al. . |
| 4,771,323 | 9/1988 | Sasaki . |
| 4,882,289 | 11/1989 | Moriuchi et al. . |
| 4,951,175 | 8/1990 | Kurosawa et al. . |
| 4,977,102 | 12/1990 | Ema . |
| 4,984,200 | 1/1991 | Satoo et al. . |
| 4,989,053 | 1/1991 | Shelton . |
| 4,994,889 | 2/1991 | Takeuchi et al. . |
| 5,056,895 | 10/1991 | Kahn . |
| 5,063,170 | 11/1991 | Okuyama . |
| 5,332,923 | 7/1994 | Takeuchi . |
| 5,410,173 | 4/1995 | Kikushima et al. . |
| 5,436,485 | 7/1995 | Shikatani et al. . |

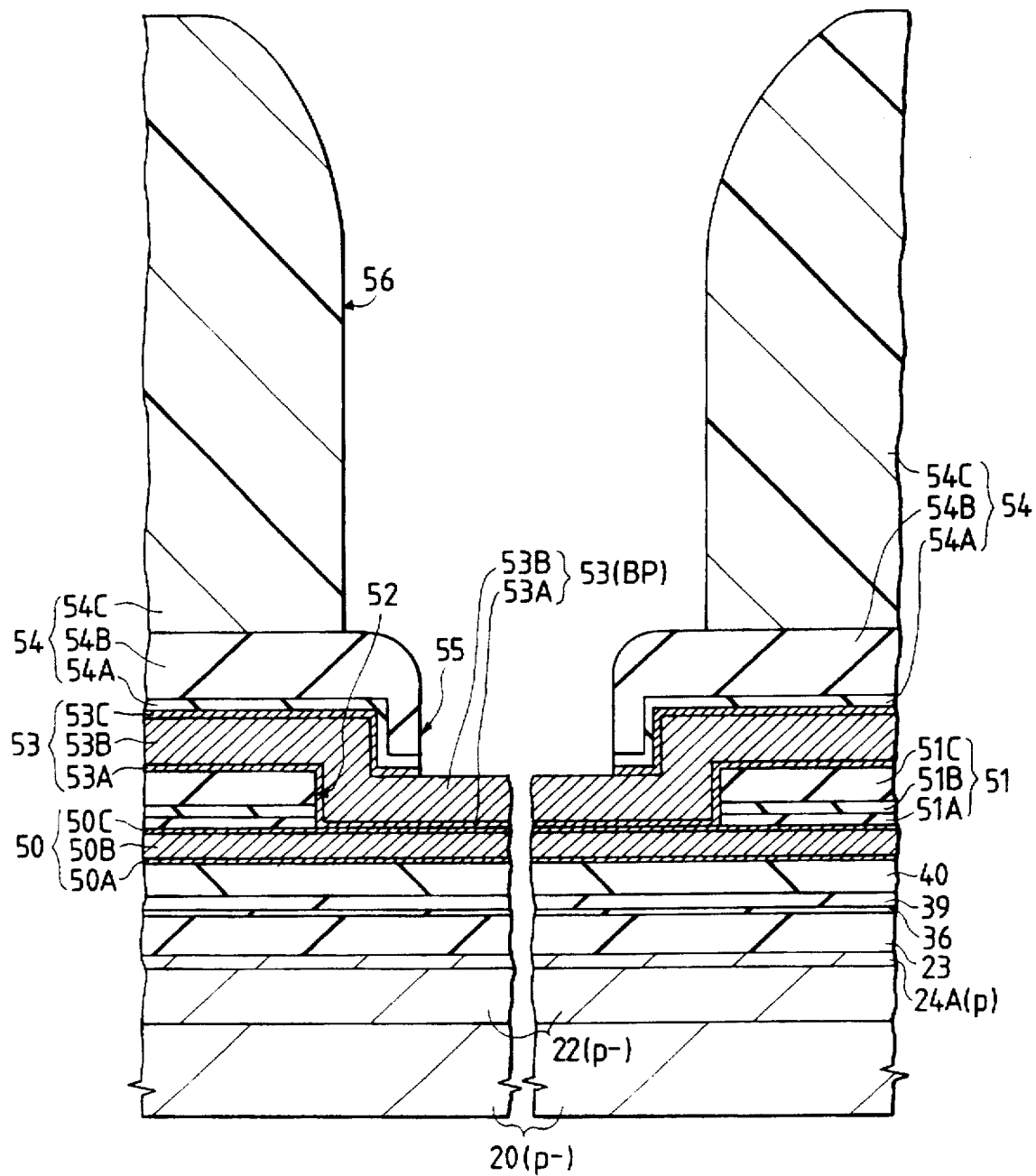

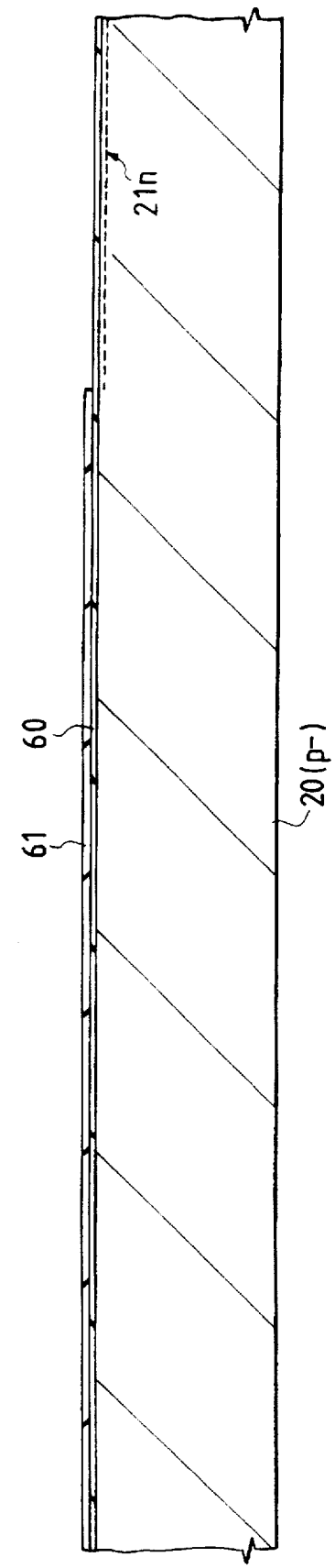
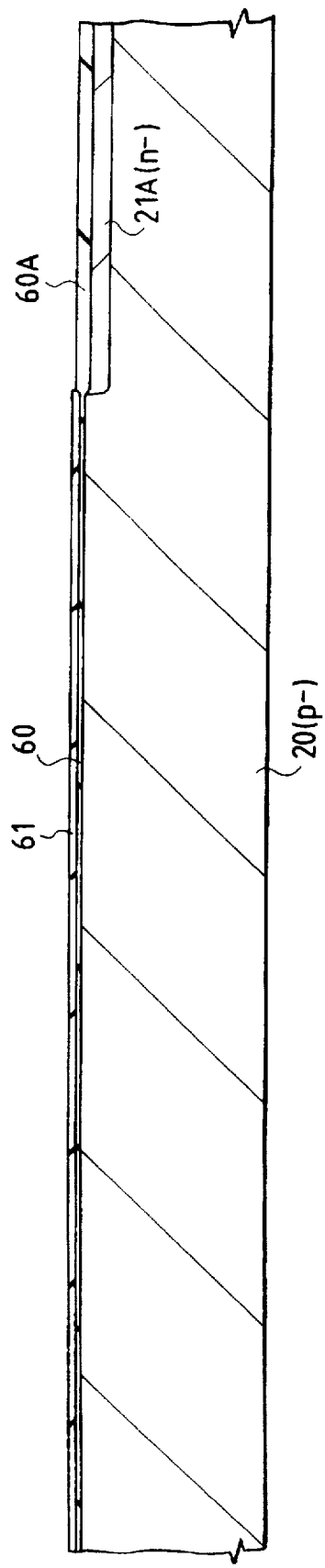

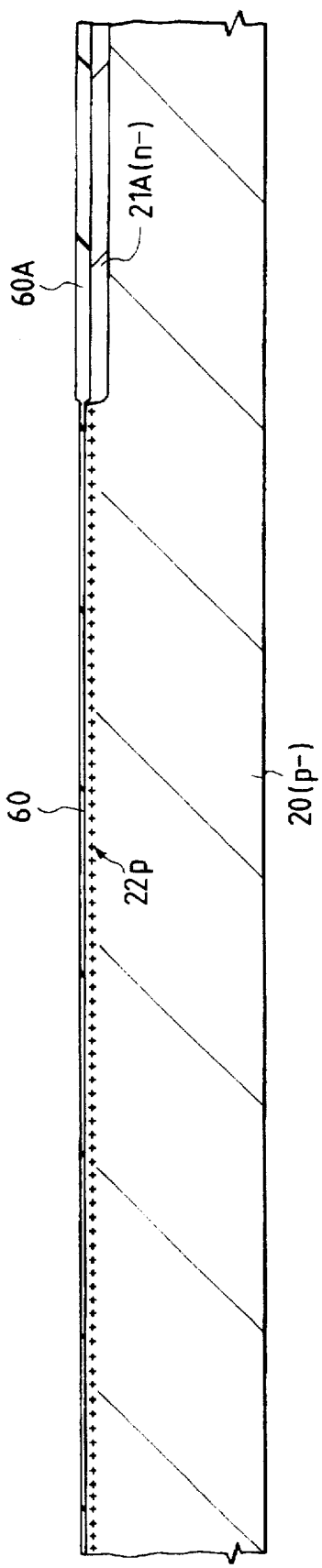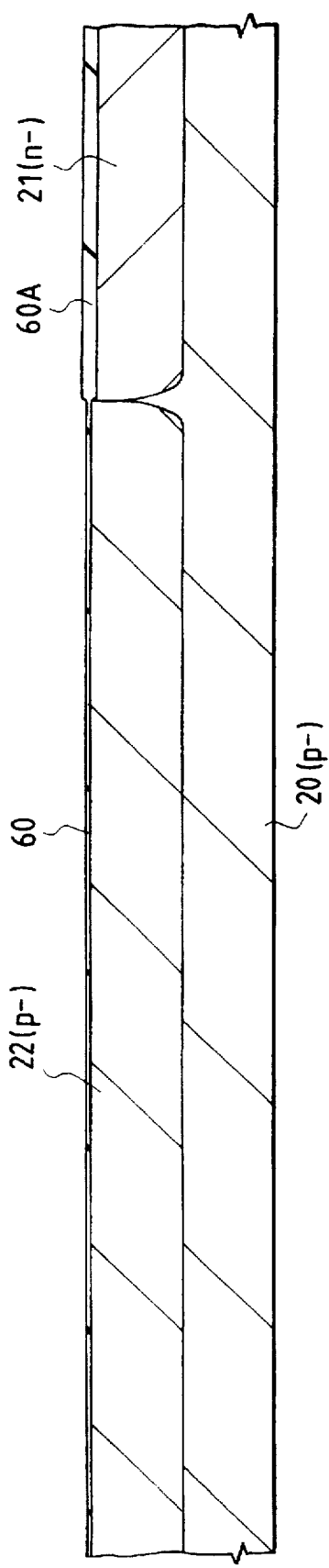

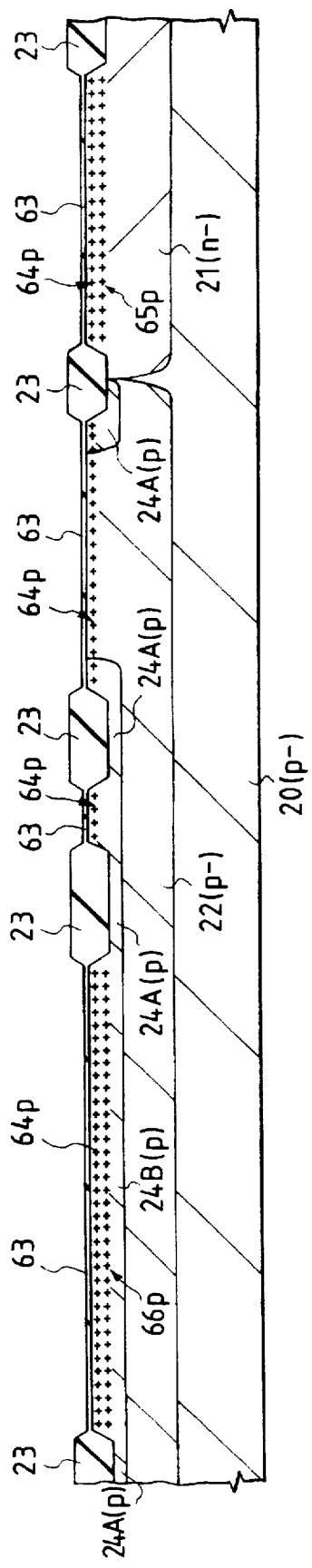
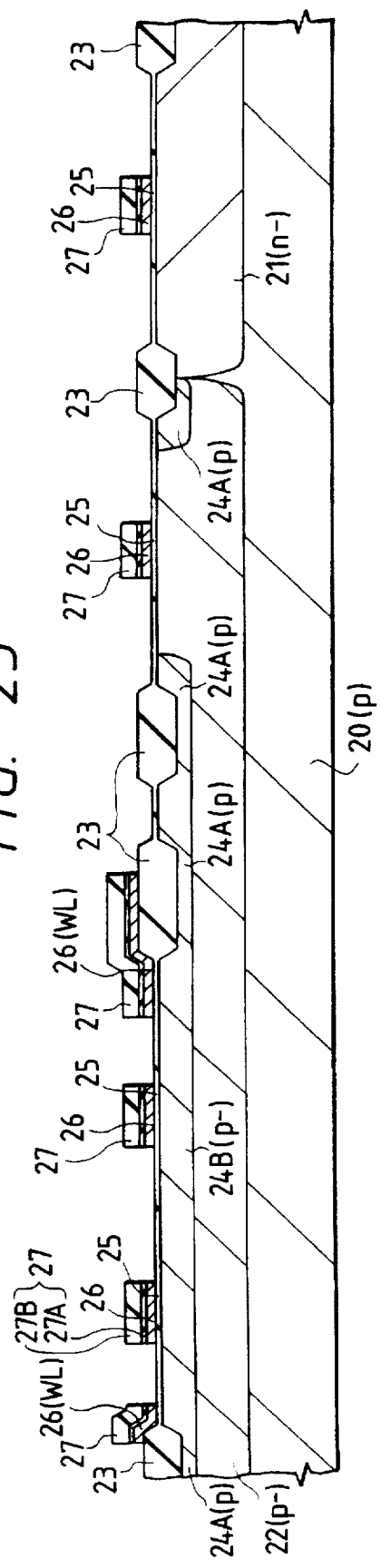
FIG. 22
FIG. 23

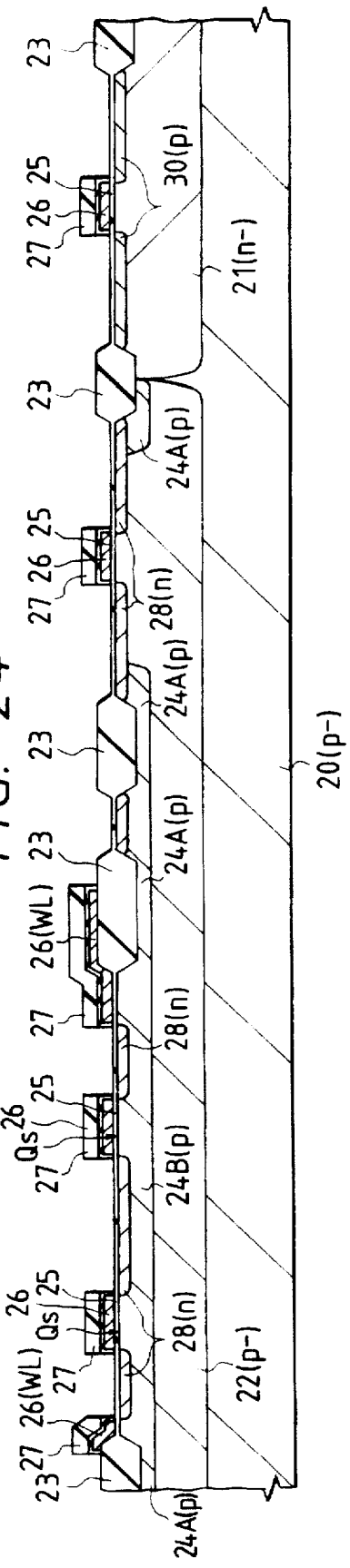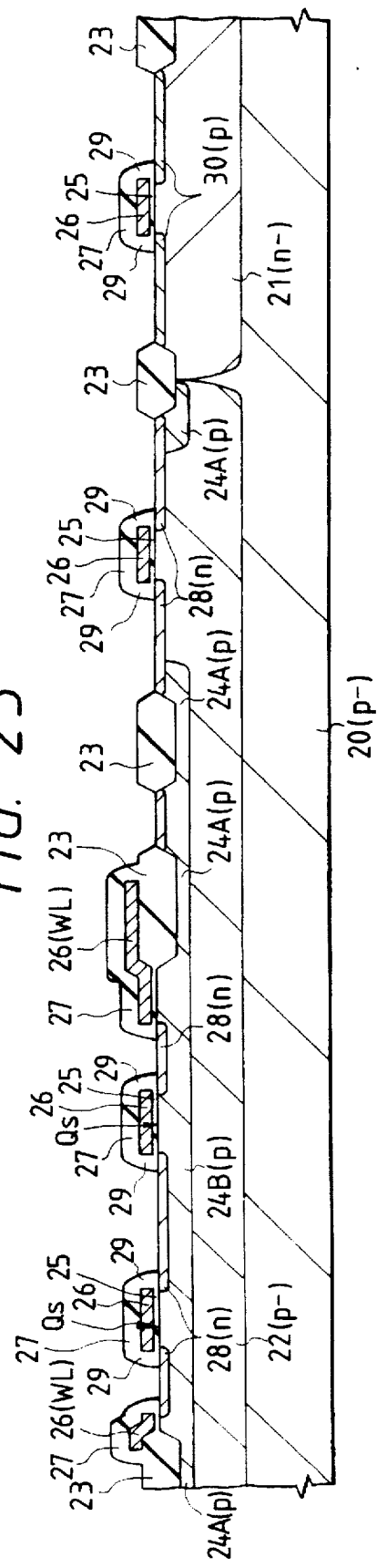

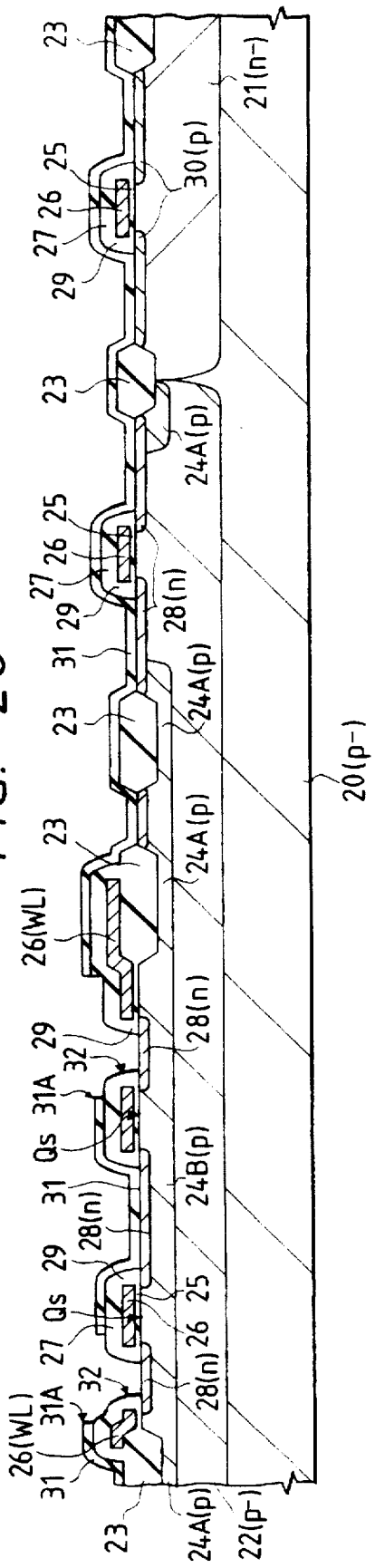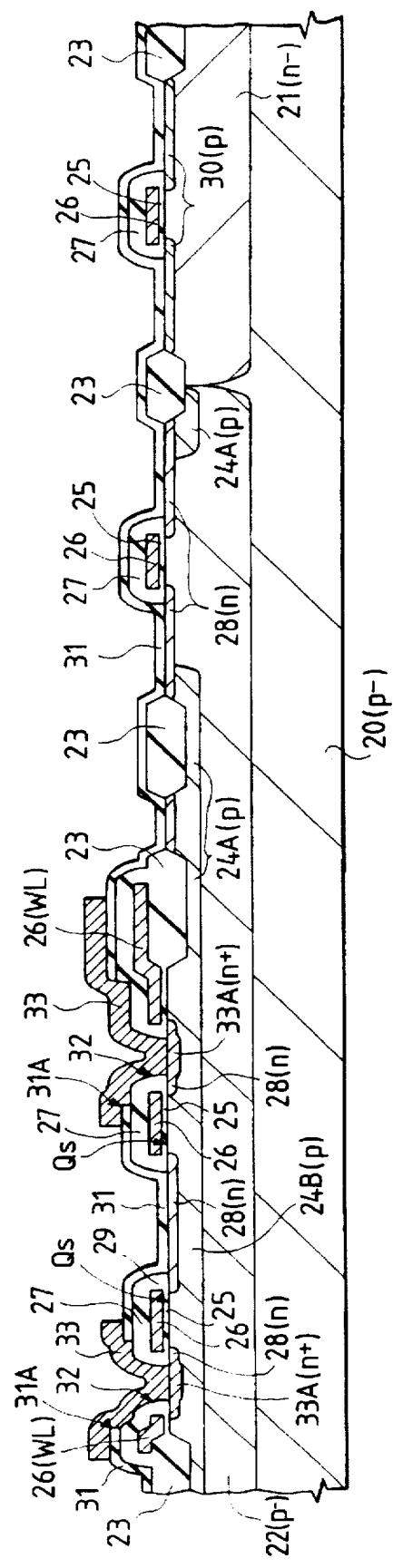

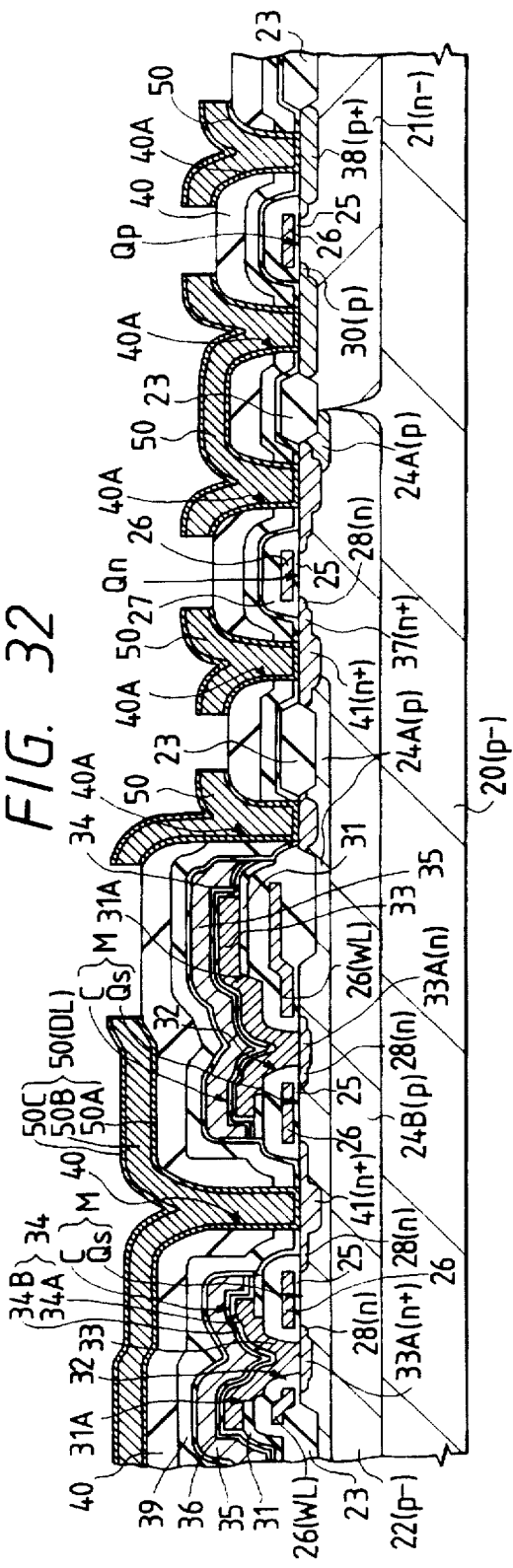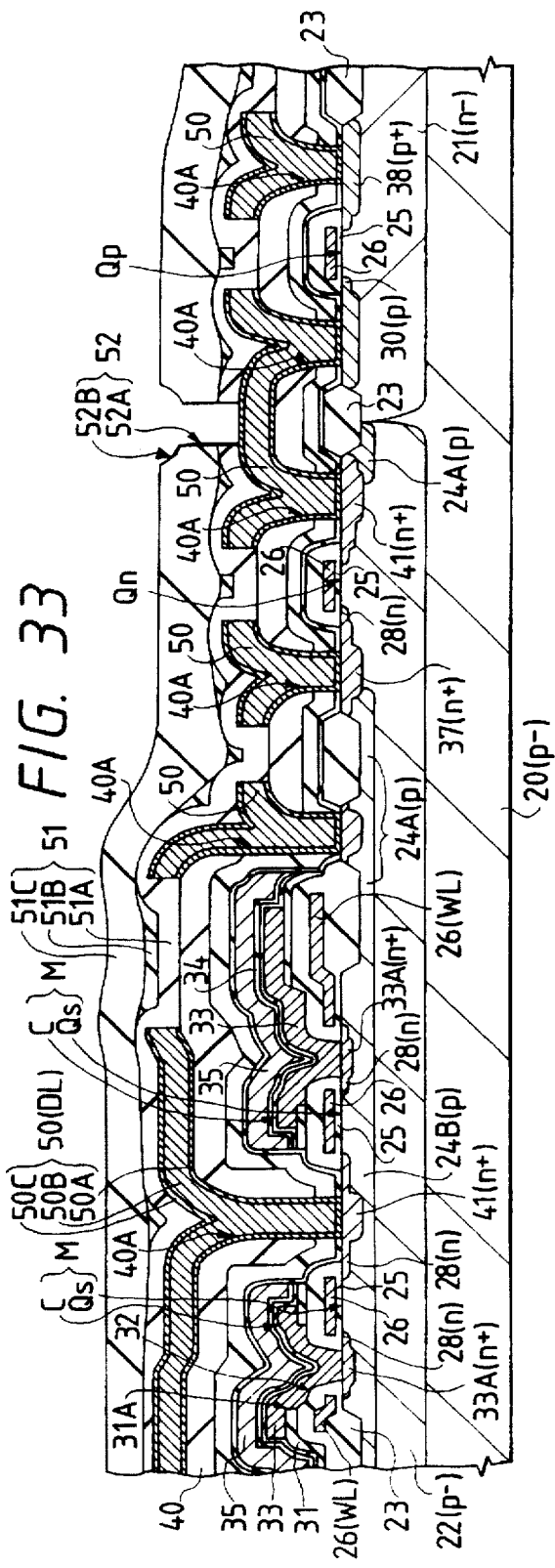

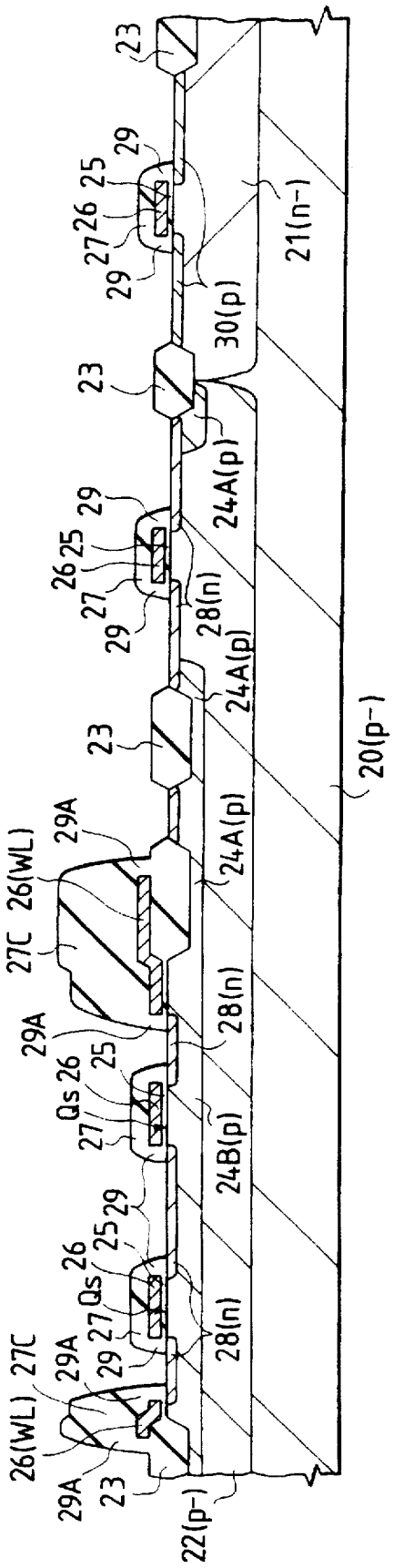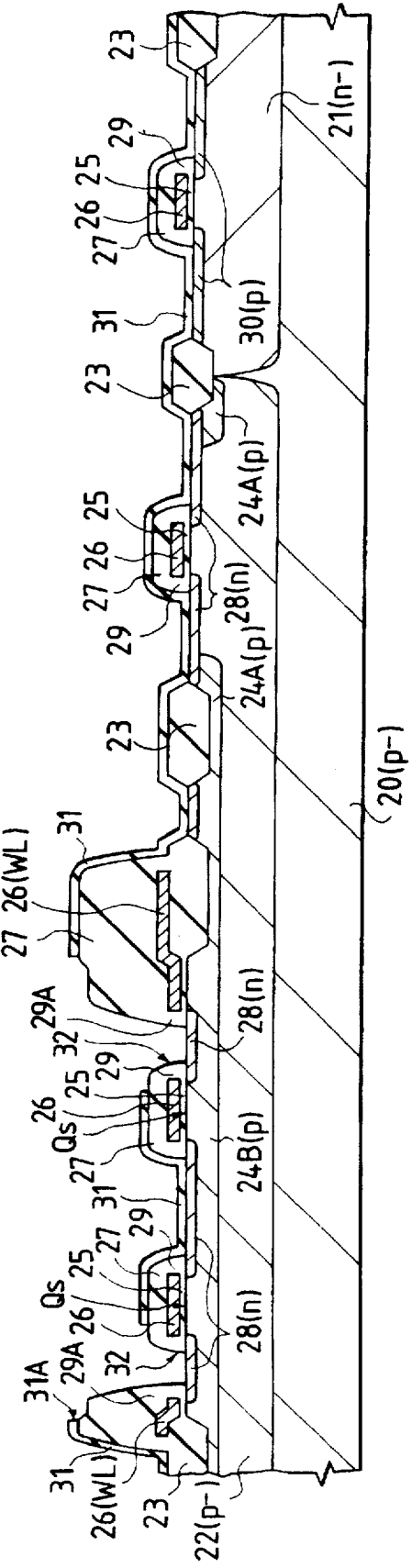

SEMICONDUCTOR INTEGRATED CIRCUIT, METHOD OF FABRICATING THE SAME AND APPARATUS FOR FABRICATING THE SAME

This is a Divisional application of application Ser. No. 08/443,027, filed May 17, 1995, in which is a Continuation application of application Ser. No. 08/112,719 filed Aug. 27, 1993, abandoned, which is a Divisional application of application Ser. No. 07/881,314, filed May 7, 1992 (now U.S. Pat. No. 5,264,712), which is a Continuation application of application Ser. No. 07/496,537, filed Mar. 20, 1990, abandoned; and this application is a Continuation-in-part application of application Ser. No. 08/620,867, filed Mar. 25, 1996, abandoned, which is a Continuation application of application Ser. No. 08/254,562, now U.S. Pat. No. 5,504,029, filed Jun. 6, 1994, which is a Divisional application of application Ser. No. 07/894,351, filed Jun. 4, 1992, abandoned, which is a Divisional application of application Ser. No. 07/246,514, now U.S. Pat. No. 5,153,685 filed Sep. 19, 1988.

BACKGROUND OF THE INVENTION

The present invention relates to semiconductor technology and, more particularly, to techniques effective for application to a semiconductor integrated circuit provided with DRAMs (dynamic random access memories) and to fabricating such a semiconductor integrated circuit.

The memory cell of a DRAM capable of storing 1 bit of information is a series circuit of a memory cell select MISFET and a capacitor. One of the semiconductor region of the memory cell select MISFET is connected to a complementary data line, and the other semiconductor region is connected to one of the electrodes of the data storage capacitor. The other electrode of the data storage capacitor is held at a predetermined potential.

To provide such a DRAM with a large storage capacity, the components are integrated and the miniaturization of the component memory cells has been desired. Since the data storage capacitors also is miniaturized when the memory cell is miniaturized, the charge storage capacity, i.e., data storage capacity, of the data storage capacitor is reduced involving reduction in the alpha particle soft error immunity of the DRAM. As for DRAMs, particularly DRAMs having a large storage capacity greater than 1M bits, the improvement of alpha particle soft error immunity is one of the important technical subjects.

In view of such a technical subject, the memory cell of recent DRAMs employs a data storage capacitor having stacked structure (hereinafter referred to as "stacked data storage capacitor"). The stacked data storage capacitor is constructed by sequentially stacking a lower electrode layer, a dielectric film and an upper electrode layer. Part of the lower electrode layer is connected to one of the semiconductor regions of the memory cell select MISFET, and the other region of the lower electrode layer is extended on a gate electrode. The lower electrode layer is formed in a predetermined pattern by etching a polycrystalline silicon film deposited by a CVD process through a photolithographic etching process. The dielectric film is formed on the upper and side surfaces of the lower electrode layer. The upper electrode layer is formed on the surface of the dielectric layer. The stacked data storage capacitors of the adjacent memory cells use a single upper electrode layer in common as a common plate electrode. The upper electrode layer is formed, similarly to the lower electrode layer, of a polycrystalline silicon layer.

A DRAM having memory cells employing stacked data storage capacitors is disclosed in U.S. Pat. No. 07/246,514 corresponding to Japanese Pat. Application No. 62-235906.

SUMMARY OF THE INVENTION

The inventors of the present invention found the following problems during the development of a 4M-bit DRAM of folded bit line system. This type of DRAM includes memory cells arranged alternately along the direction of extension of a complementary data line in an inverted pattern. The lower electrode of the stacked data storage capacitor of the memory cell is formed in a square shape. The gap between the lower electrode layers of the stacked data storage capacitors of the adjacent memory cells is increased in a connecting region where one of the semiconductor regions of the memory cell select MISFET and the complementary data line are connected relative to the other portion thereof; that is, the portion of the gap between the lower electrode layers corresponding to the connecting region is increased to secure an allowance for the alignment of the lower electrode layers with the upper electrode layer and contact holes during the fabricating processes, and a size for the electrical isolation of the lower electrode layers from each other. On the other hand, portions of the gap other than the portion corresponding to the connecting region in the least possible size or a size near the least possible size. Accordingly, in forming an etching mask for forming the lower electrode layers by a photolithographic process, a portion of the etching mask corresponding to the connecting region is over-exposed due to diffraction effect and reflection from the stepped portions of the gate electrodes. Consequently, the size of the lower electrode layers etched by using such an etching mask is considerably smaller than the design size, which reduces the charge storage capacity of the stacked data storage capacitors. Reduction in the charge storage capacity reduces the alpha particle soft error immunity increasing the possibility of malfunction of the DRAM. To avoid reduction in the charge storage capacity of the stacked data storage capacitors, the size of the stacked data storage capacitor must be increase, which, however, reduces the degree of integration of the DRAM.

OBJECTS OF THE INVENTION ARE (1) To provide a technique capable of providing a semiconductor integrated circuit for data storage having an increased degree of integration (2) To provide a technique capable of providing a semiconductor integrated circuit for data storage having an increased soft error immunity (3) To provide a technique capable of providing a semiconductor integrated circuit for data storage capable of operating at an increased operating speed (4) To provide a technique capable of providing a semiconductor integrated circuit for data storage having an improved electrical reliability (5) To provide a technique capable of improving processing accuracy in fabricating a semiconductor integrated circuit for data storage (6) To provide a technique capable of improving the yield of semiconductor integrated circuits for data storage (7) To provide a technique capable of fabricating a semiconductor integrated circuit for data storage by a reduced number of processes (8) To provide a technique capable of forming an insulating film of an improved quality for a semiconductor integrated circuit for data storage (9) To provide an apparatus capable of forming an insulating film of an improved quality for a semiconductor integrated circuit for data storage

(10) To provide a technique capable of improving the external device driving ability of a semiconductor integrated circuit for data storage

(11) To provide a technique capable of forming an element having a flat surface for a semiconductor integrated circuit for data storage

(12) To provide a technique capable of stabilizing processes of fabricating a semiconductor integrated circuit for data storage

(13) To provide an apparatus capable of stabilizing processes of fabricating a semiconductor integrated circuit for data storage

(14) To provide a technique capable of forming elements having an increased withstand voltage for a semiconductor integrated circuit for data storage The above and other objects, features and advantages of the present invention will become more apparent from the following description taken in conjunction with the accompanying drawings.

Representative means in accordance with the present invention are itemized as follows.

(1) In a semiconductor integrated circuit having a DRAM comprising memory cells each of a series circuit consisting of a memory cell select MISFET and a stacked data storage capacitor, the lower electrode layer of the stacked data storage capacitor of each memory cell of the DRAM is formed in a pattern with a compensation to increase the surface area of the lower electrode layer.

(2) In a semiconductor integrated circuit having a wiring pattern extended on a stepped surface, the wiring patter is formed of a composite film constructed by depositing a transition metal film by a CVD process, an aluminum or aluminum alloy film deposited on the transition metal film by a sputtering process.

(3) In the foregoing semiconductor integrated circuit of item (2), the wiring pattern is formed of a composite film constructed by depositing a transition metal film by a CVD process, an aluminum or aluminum alloy film formed on the transition metal film by a sputtering process, and a transition metal film deposited on the aluminum or aluminum alloy film by a sputtering process.

(4) In a semiconductor integrated circuit having bonding pads formed of the same conductive layer as internal wiring and connected through openings formed in a passivation film to bonding wires, the internal wiring is formed of a composite film constructed by depositing an aluminum or an aluminum alloy film, and a transition metal film formed on the aluminum or aluminum alloy film, and the bonding pads are portions of the composite film from which portions of the transition metal film are removed to expose the corresponding portions of the aluminum or aluminum alloy film.

(5) in the semiconductor integrated circuit of item (4), portions of the transition metal film formed on the aluminum or aluminum alloy film corresponding to the openings formed in the passivation film are removed.

(6) in a semiconductor integrated circuit comprising MISFETs and having a side wall spacer on the side wall of an insulating film covering the side wall and upper surface of the gate electrode of each MISFET, the insulating film formed on the gate electrodes, and the side wall spacers are silicon dioxide film deposited by a CVD process using an inorganic silane gas and nitrogen gas as source gases.

(7) In a semiconductor integrated circuit comprising stacked data storage capacitors each consisting of a lower electrode layer formed on a base insulating film, a dielectric film formed over the base insulating film and the lower electrode layer, and an upper electrode layer formed on the dielectric film, the dielectric film is a composite film including a silicon nitride film, and the base insulating film is a silicon dioxide film deposited by a CVD process using an inorganic silane gas and nitrogen oxide gas as source gases.

(8) In a semiconductor integrated circuit comprising memory cells comprising first MISFETs, peripheral circuits comprising second MISFETs, and an output circuit comprising third MISFETs, the respective threshold voltages of the first MISFETs, the second MISFETs and the third MISFETs are reduced in the order of the first, second and third MISFETs provided that the respective types of channel of the first, second and third MISFETs are the same and the lengths of the gates of the first, second and third MISFETs are substantially the same.

(9) The third MISFETs of the output circuit referred to in item (8) are formed in the major surface of a semiconductor substrate, the first MISFETs of the memory cells, and the second MISFETs of the peripheral circuits are formed in well regions formed in the major surface of the semiconductor substrate and having an impurity density higher than that of the semiconductor substrate.

(10) In a semiconductor integrated circuit including a DRAM comprising a memory cell array consisting of columns and rows of memory cells each consisting of a series circuit of a memory cell select MISFET and a stacked data storage capacitor formed over the memory select MISFET, and peripheral circuits arranged in a region enclosing the memory cell array, a leveling layer of the same type of conduction as the lower electrode of the stacked data storage capacitors, the upper electrode layer or both the upper and lower electrode layers is formed between the memory cell array and the peripheral circuits.

(11) In the semiconductor integrated circuit of item (10), a first leveling layer of the same type of conduction as the upper and-lower electrode layers of the data storage capacitors of stacked structure, and a second leveling layer of the same type as the upper or lower electrode layer are formed in that order between the memory cell array and the peripheral circuits from the former toward the latter.

(12) In the semiconductor integrated circuit of item (10), guardring regions are formed between the memory cell arrays and the peripheral circuits, and the leveling layer is formed in the guardring region.

(13) in a semiconductor integrated circuit for storage comprising a memory cell array comprising a plurality of memory cells disposed at the intersections of data lines and word lines, respectively, and shunt word lines formed in a layer formed over the word lines and connected to the word lines in regions other than that corresponding to the memory cell array, the junctions of the wor , nes and the shunt word lines are surrounded by a leveling .ayer.

(14) In a semiconductor integrate circuit including a DRAM of folded bit line system comprising memory cells each comprising a series circuit consisting of a memory cell select MISFET and a data storage capacitor, the memory cells are disposed at a first intersection of one of complementary data lines, i.e., a first data line, and a first word line, and a second intersection of the other of the complementary data lines, i.e., a second data line, and a second word line adjacent to the first word line with respect to the direction of rows, the first and second word lines are substantially the same in width and are extended in parallel to each other along the direction of columns with a predetermined gap therebetween, the first and second word lines are extended zigzag so as to turn respectively in opposite directions, a portion of the first word line at the first intersection on the side of the second word line is turned so as to conform to the shape of the memory cell, and a portion of the second word line at the second intersection on the side of the first word line is turned so as to conform to the shape of the memory cell.

(15) A method of fabricating a semiconductor integrated circuit, in which an aluminum film, an aluminum alloy film, a composite film consisting of an aluminum film and a transition metal film, or a composite film consisting of an aluminum alloy film and a transition metal film is formed in a pattern by anisotropic etching, comprises: a film forming process for depositing the aluminum film, the aluminum alloy film or the composite film; a photoresist mask forming process for forming a photoresist mask over the surface of the aluminum film, the aluminum alloy film or the composite film; a patterning process for patterning the aluminum film, the aluminum alloy film or the composite film in a predetermined pattern in a vacuum by anisotropic etching using an etching gas containing a halogen and a halide; a photoresist mask removing process for removing the photoresist mask in the same vacuum as that employed in the patterning process by low-temperature ashing at a temperature below a room temperature by using a halide gas and oxygen gas; and a baking process for baking the patterned aluminum, aluminum alloy or composite film in the same vacuum as that employed in the photoresist mask removing process.

(16) A method of fabricating a semiconductor integrated circuit, in which an aluminum film, an aluminum alloy film, a composite film consisting of an aluminum film and a transition metal film, or a composite film consisting of an aluminum alloy film and a transition metal film is formed in a pattern by anisotropic etching, comprises: a film forming process for depositing the aluminum film, the aluminum alloy film or the composite film; a photoresist mask forming process for forming a photoresist mask over the aluminum, aluminum alloy or composite film; a patterning process for patterning the aluminum, aluminum alloy or composite film in a predetermined pattern in a vacuum by anisotropic etching using an etching gas containing a halogen and a halide; a photoresist mask removing process for removing the photoresist mask in the same vacuum as that employed in the patterning process by ashing using a halide gas and oxygen gas; and a finishing process for removing chlorine produced by the anisotropic etching by washing, and for drying the patterned film.

(17) In a semiconductor integrated circuit including MISFETs each enclosed by a channel stopper region, each MISFET has semiconductor regions, one of the semiconductor regions, i.e., a first semiconductor region, to which a high voltage is applied is surrounded by the other semiconductor region, i.e., a second semiconductor region, to which a low voltage is applied, a channel forming region is formed between the semiconductor regions, a gate electrode is provided on a gate insulating film formed on the channel forming region at a position corresponding to the channel forming region, and the channel stopper region encloses the second semiconductor region.

(18) In the semiconductor integrated circuit of item (17), an upper wiring connected to the first semiconductor region of the MISFET is formed with its perimeter disposed on the gate electrode or is extended over the second semiconductor region.

(19) In a semiconductor integrated circuit including a DRAM comprising memory cells disposed at the intersections of complementary data lines and word lines, respectively, and each comprising a series circuit of a memory cell select MISFET and a stacked data storage capacitor and column select signal lines formed of the same conductive layer as the complementary data lines and each extended in parallel to each pair of complementary data lines, the lower electrode layer of the stacked data storage capacitor of the memory cell connected to one of the complementary data lines adjacent to the column select line has a size greater than the lower electrode layers of the stacked data storage capacitors of the other memory cells.

(20) In a semiconductor integrated circuit including a DRAM comprising memory cells disposed at the intersections of complementary data lines and word lines, respectively, and each comprising of a series circuit consisting of a memory cell select MISFET and a stacked data storage capacitor, the lower electrode layer of the stacked data storage capacitor of the memory cell is formed so as to overlap the gate electrode of the memory cell select MISFET of the same memory cell, and the word line for selecting the adjacent memory cell separated from the former memory sell in the direction of width of the gate electrode, and the layer insulating film formed between the lower electrode layer and the word line has a thickness greater than that of a layer insulating film formed between the lower electrode layer and the gate electrode.

(21) In a semiconductor integrated circuit, a memory cell array, direct peripheral circuits for directly controlling a write operation to write information in the memory cells and a read operation to read information from the memory cells, and indirect peripheral circuits are formed on the major surface of a semiconductor substrate and are coated with a resin film, and the resin film is divided into a plurality of sections.

(22) In item (21), a process for coating with a resin film the entire surface of a semiconductor wafer having a plurality of semiconductor integrated circuit forming regions before a scribing process arranged in columns and rows, a process for removing portions of the resin film corresponding to regions between the semiconductor integrated circuit forming regions, and portions corresponding to regions for the bonding pads of the semiconductor integrated circuit and dividing portions of the resin film corresponding to the semiconductor integrated circuit forming regions, and a process of scribing the semiconductor integrated circuit forming regions of the semiconductor wafer to form a plurality of semiconductor integrated circuits.

(23) A method of forming a semiconductor integrated circuit comprising steps of forming an insulating film over the surface of a substrate by application in a system isolated from the atmosphere, baking the applied insulating film, etching the applied insulating film, and depositing an insulating film on the applied insulating film.

(24) A method of forming a semiconductor integrated circuit having a film formed over the stepped surface of a substrate, the film is etched for patterning by repeating alternate processes of anisotropic etching and isotropic etching.

(25) in item (24), anisotropic etching is repeated before an organic polymer adhering to the side surface of the film etched in a pattern by anisotropic etching is destructed by isotropic etching.

(26) In a method of forming a semiconductor integrated circuit, employing a CVD process in which a semiconductor wafer is held in a reaction chamber, and inorganic silane gas and nitrogen oxide gas are supplied into the reaction chamber to form a silicon dioxide film over the surface of the semiconductor wafer, a source gas is produced by mixing the inorganic silane gas and the nitrogen oxide gas at a temperature below a temperature at which the thermal decomposition of the inorganic silane gas starts, and the source gas is supplied into the reaction chamber.

(27) In a method of fabricating a semiconductor integrated circuit, including a process of etching a polycrystalline silicon film by using an insulating film formed in a pattern over the polycrystalline silicon film, an oxide film is formed in the surface of the polycrystalline silicon film prior to forming the insulating film over the polycrystalline silicon film.

The means stated in item (1) forms the lower electrode layer in a pattern with a compensation to compensate the reduction in size of a portion of the etching mask for etching the lower electrode layer corresponding to an enlarged portion of the region between the adjacent lower electrode layers, i.e., a portion on the side of the data line, during exposure in a photolithographic process due to diffraction and reflection from the steps in the underlying surface. Accordingly, the lower electrodes are formed in a correct surface area, so that the charge storage capacity of the data storage capacitor can be increased and, consequently, a compact, high-density DRAM comprising memory cells formed in a reduced area, and having improved alpha particle soft error immunity can be obtained.

The means stated in item (2) increases the signal transmission speed to enable the circuit to operate at a high operating speed because the aluminum or aluminum alloy film has a small electrical resistivity, and improves the electrical reliability because the transition metal film covers the steps in the underlying surface satisfactorily to reduce defects attributable to the disconnection of wiring lines. The transition metal film underlying the aluminum or aluminum alloy film prevents the precipitation of silicon at the junction of the transition metal film and silicon.

The means stated in item (3) prevents the formation of aluminum hillocks by the upper transition metal film forming the top layer of the wiring pattern, assists forming an accurate wiring pattern because the upper transition metal film suppresses reflection from the aluminum or aluminum alloy film and diffraction during exposure in forming the etching mask, and prevents the fusion of aluminum or aluminum alloy film during the formation of the upper transition metal film because the upper transition metal film is formed at a low temperature as compared with the melting point of the aluminum or aluminum alloy film underlying the upper transition metal film.

The means stated in item (4) prevents faulty bonding and improves the yield of perfect semiconductor integrated circuits because the reflectance of the bonding pads higher than that of the passivation film ensures accurate recognition of the bonding pads, and the surfaces of the bonding pads formed of aluminum or aluminum alloy ensure firm bonding of the bonding pads and the bonding wires which, in most cases, are aluminum wires.

The means stated in item (5) omits a process for forming a mask for etching the transition metal film of the bonding pads to reduce the number of processes for forming the semiconductor integrated circuit because a mask for forming openings in the passivation film is used also as the mask for etching the transition metal film.

The means stated in item (6) reduces the possibility of separation of the side wall spacer from the insulating film, and prevents leakage across the gate electrode and the conductive layers improving the electrical reliability because the shrinkage of the silicon dioxide film forming the side spacers is smaller than that of a silicon dioxide film formed by a CVD process using organic silane as a source gas, improves the uniformity in thickness of the silicon dioxide film and the dielectric strength of the same can be improved because the silicon dioxide films forming the insulating film covering the gate electrodes, and the side wall spacers have a high step coverage, and enables the film covering the side wall to be formed in a comparatively small thickness because the silicon dioxide films have high step coverage, which facilitate processing the lower electrode layer.

The means stated in item (7) prevents the breakdown of the dielectric film, prevents current leakage across the lower electrode layer and the upper electrode layer and improves the electrical reliability because the shrinkage of the insulating film underlying the dielectric film of the stacked data storage capacitor is small to reduce the stress induced in the dielectric film by the shrinkage of the insulating film, and forms the silicon dioxide film in a uniform thickness because the insulating film underlying the dielectric film has high step coverage and high breakdown strength.

The means stated in item (8) improves the electrical reliability of the data write operation and the data read operation because the erroneous conduction of the first MISFET of an unselected memory cell due to noise in the power source can be prevented, raises the output signal level and improves the external device driving ability can because the substrate effect constant of the third MISFET of the output circuit can be reduced, and improves the transmission conductance to enhance the operating speed because the threshold voltage of the second MISFET of the peripheral circuits is lower than that of the first MISFET of the memory cell.

The means stated in item (9) enables the determination of the threshold voltage of the third MISFETs of the output circuit by simply controlling the impurity density of the major surface of the semiconductor substrate because the semiconductor substrate has a low impurity density, enhances the alpha particle soft error immunity because the first MISFET of the memory cell and the second MISFET of the peripheral circuits create a potential barrier by the difference in impurity density between the semiconductor substrate and the well region, and reduces the area of the memory cell through the enhancement of the alpha particle soft error immunity, which in turn increases the degree of integration.

The means stated in item (10) reduces the possibility of disconnection of the wiring lines and improves the yield of perfect semiconductor integrated circuits because the steps between the memory cell array and the peripheral circuits are covered with the leveling layer and stabilizes the photolithographic process for forming the wiring lines (for example, aluminum lines, extended in the regions.

The means stated in item (11) improves the yield of perfect semiconductor integrated circuits further because the leveling layer reduces stepwise the steps between the memory cell array and the peripheral circuits.

The means stated in item (12) reduces the area occupied by the leveling layer and increases the degree of integration because the guardring region can be used as the entire area or part of the area for the leveling layer.

The means stated in item (13) reduces the disconnection and faulty conduction of the wiring lines at the steps between the memory cell array and the region surrounding the junctions of the word lines and the shunt word lines, and increases the yield of perfect semiconductor integrated circuits because the height of the steps is reduced and the photolithographic process for processing the wiring lines including the shunt word lines extended in those regions (for example, aluminum lines) and the contact holes can be stabilized.

The means stated in item (14) prevents short channel effect and increases the degree of integration of the DRAM because the first word line and its turning portion are used at the first intersection as the gate electrode of the memory select MISFET, the second word line and its turning portion are used at the second intersection as the gate electrode of the memory cell select MISFET, and the length of the gate of the memory cell select MISFET is increased by a length corresponding to the turning portion, and increases the degree of integration of the DRAM can be increased because the memory cells disposed at the first and second intersections, respectively, can be arranged with a reduced gap therebetween.

The means stated in item (15) reduces the oxidation of aluminum contained in the side film formed over the side wall of the aluminum film and facilitates the removal of the side film because the ashing process is carried out at a low temperature in the same vacuum system, and suppresses the corrosion of the aluminum film because the anisotropic etching process through the baking process are carried out in the same vacuum system without exposing the aluminum film to the atmosphere, and the baking process reduces chlorine produced in the anisotropic etching process.

The means stated in item (16) suppresses the formation of alumina ($Al_2O_3$) in the side film formed in the side wall of the aluminum or aluminum alloy film because the ashing process and the etching process are carried out in the same vacuum system, and suppresses the corrosion of the aluminum or aluminum alloy film because chlorine produced in the anisotropic etching process can be removed by washing with water, and suppresses the corrosion of the aluminum or aluminum alloy film because chlorine produced in the anisotropic etching process can be removed by washing with water.

The means stated in item (17) enhances the withstand voltage of the pn junction of one of the semiconductor region of the MISFET entailing the enhancement of the withstand voltage of the MISFET because the same semiconductor region of the MISFET is isolated from the channel stopper region.

The means stated in item (18) improves the accuracy of processing the upper wiring layer because the surface of the layer insulating film formed between one of the semiconductor region and the upper wiring layer has a recess corresponding to the recessed shape of the gate electrode and the recess suppresses reduction in size of the etching mask for forming the upper wiring layer attributable to the reflection from the upper wiring layer during exposure.

The means stated in item (19) prevents the reduction of the size of the lower electrode layer below a set size, and secures the necessary charge storage capacity of the stacked data storage capacitor because the size of the lower electrode layer of the stacked data storage capacitor of the memory cell connected to one of the data lines adjacent to the column select line is increased by a value corresponding to the expected reduction in size of the etching mask for processing the lower electrode layer due to diffraction during exposure on the basis of the expansion of the gap between the complementary data lines corresponding to the region for arranging the column select lines. Thus, the means stated in item (19) increases the degree of integration of the DRAM through the enhancement of the alpha particle soft error immunity and the reduction of the area of the memory cells.

The means stated in item (20) increases the charge storage capacity of the stacked data storage capacitor by increasing the height of the lower electrode layer to increase the area of the same because the layer insulating film formed between the lower electrode layer and the word lines is formed in an increased thickness to increase the height of the step formed by the lower electrode layer, and reduces the aspect ratio of the junction of the memory cell select MISFET and the complementary data line and reduces the possibility of disconnection of the complementary data lines because the height of the junction is decreased. Thus, the means stated in item (20) enhances the alpha particle soft error immunity, increases the degree of integration of the DRAM and improves the electrical reliability of the DRAM.

The means stated in item (21) prevents the warp of the semiconductor substrate and cracks in the film formed over the semiconductor substrate because the stress induced by the difference between the semiconductor substrate and the resin film can be relaxed, and reduces the possibility of faulty contact of a probe with an object to improve the reliability of wafer testing because the resin film is formed by applying a resin in a film to the semiconductor substrate and baking the film prior to the scribing process.

The means stated in item (22) decreases the number of processes of fabricating the semiconductor integrated circuit by omitting a process for dividing the resin film because the process for dividing the resin film is included in the process for removing portions of the resin film corresponding to regions between regions for forming the semiconductor integrated circuit and regions for forming the bonding pads.

The means stated in item (23) reduces the moisture absorption of the insulating film formed by application and suppresses the deterioration of the applied insulating film because the applied insulating film is covered after baking with an insulating film formed by deposition before being exposed to the atmosphere, which enhances the adhesion between the applied insulating film and the deposited insulating film and prevents the variation of the etching rate of the applied insulating film.

The means stated in item (24) suppresses overetching and prevents damaging or destroying the surface underlying the film in patterning the film because the film is etched by anisotropic etching while residual portions of the film corresponding to the stepped portions of the surface underlying the film are removed by isotropic etching.

The means stated in item (25) reduces the side etching effect of isotropic etching to enhance the effect of anisotropic etching because the organic polymer produced in the anisotropic etching process serves as a stopper layer for isotropic etching.

The means stated in item (26) reduces particles of foreign matters, such as silicon particles scattered in the space between the source gas supplying part of the reaction chamber and the semiconductor substrate held in the reaction chamber and the adhesion of the particles to the inner surface of the vessel defining reaction chamber because a source gas having a low inorganic silane concentration can be prepared at a temperature below the temperature at which the thermal decomposition of inorganic silane gas starts and, consequently, reduces the foreign matter content of the silicon dioxide film formed on the surface of the semiconductor substrate to improve the quality of the silicon dioxide film and reduces the rate of accumulation of the foreign matters over the inner surface of the vessel defining the reaction chamber of the CVD apparatus.

The means stated in item (27) decomposes foreign matters and contaminants adhering to the surface of the polycrystalline silicon film by oxidation by forming an oxide film over the surface of the polycrystalline silicon film by thermal oxidation, and prevents the production of foreign matters by the interaction between the reaction gas used for forming the insulating film over the polycrystalline silicon film and the impurities over the surface of the polycrystalline silicon film because the impurities diffused outside from the surface of the polycrystalline silicon film in forming the insulating film over the polycrystalline silicon film are absorbed by the oxide film formed by thermal oxidation and the oxide film prevents the diffusion of the impurities.

BRIEF DESCRIPTION OF THE DRAWINGS

FIG. 15 is a sectional view of an essential portion of a region for the bonding pads of the DRAM of FIG. 1;

FIGS. 16 to 33 are sectional views of an essential portion of the DRAM of FIG. 1 respectively in different stages of fabrication;

FIGS. 46 to 50 are sectional views of an essential portion of a DRAM in a third embodiment according to the present invention in different stages of fabrication;

DETAILED DESCRIPTION OF THE INVENTION

Figure 1:
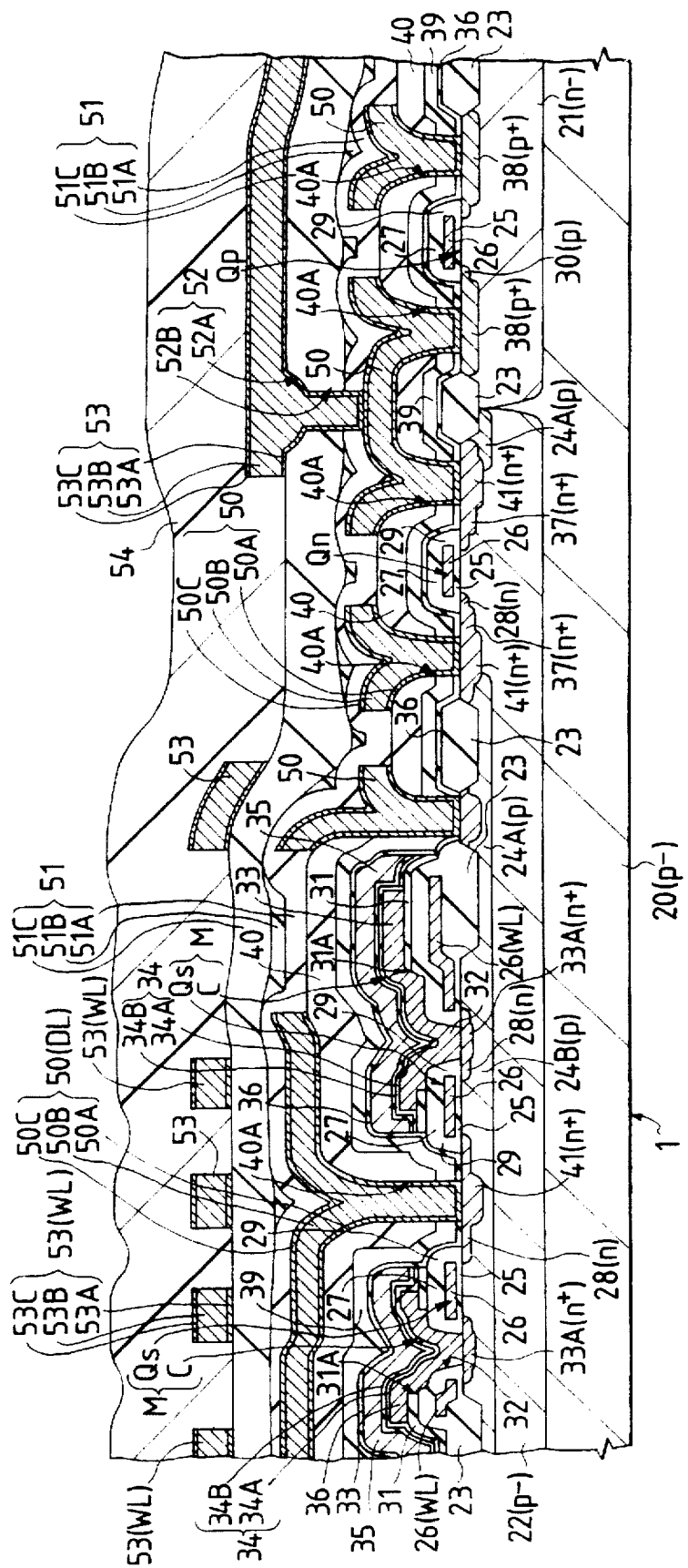
FIG. 1 is a sectional view of an essential portion of a DRAM in a first embodiment according to the present invention.

The present invention will be described hereinafter with reference to DRAMs each comprising memory cells each consisting of a memory cell select MISFET and a stacked data storage capacitor connected in series to the memory cell select MISFET, in which like and corresponding parts are designated by the same reference characters and the repeated description of the same parts will be omitted.

First Embodiment

Figure 2:
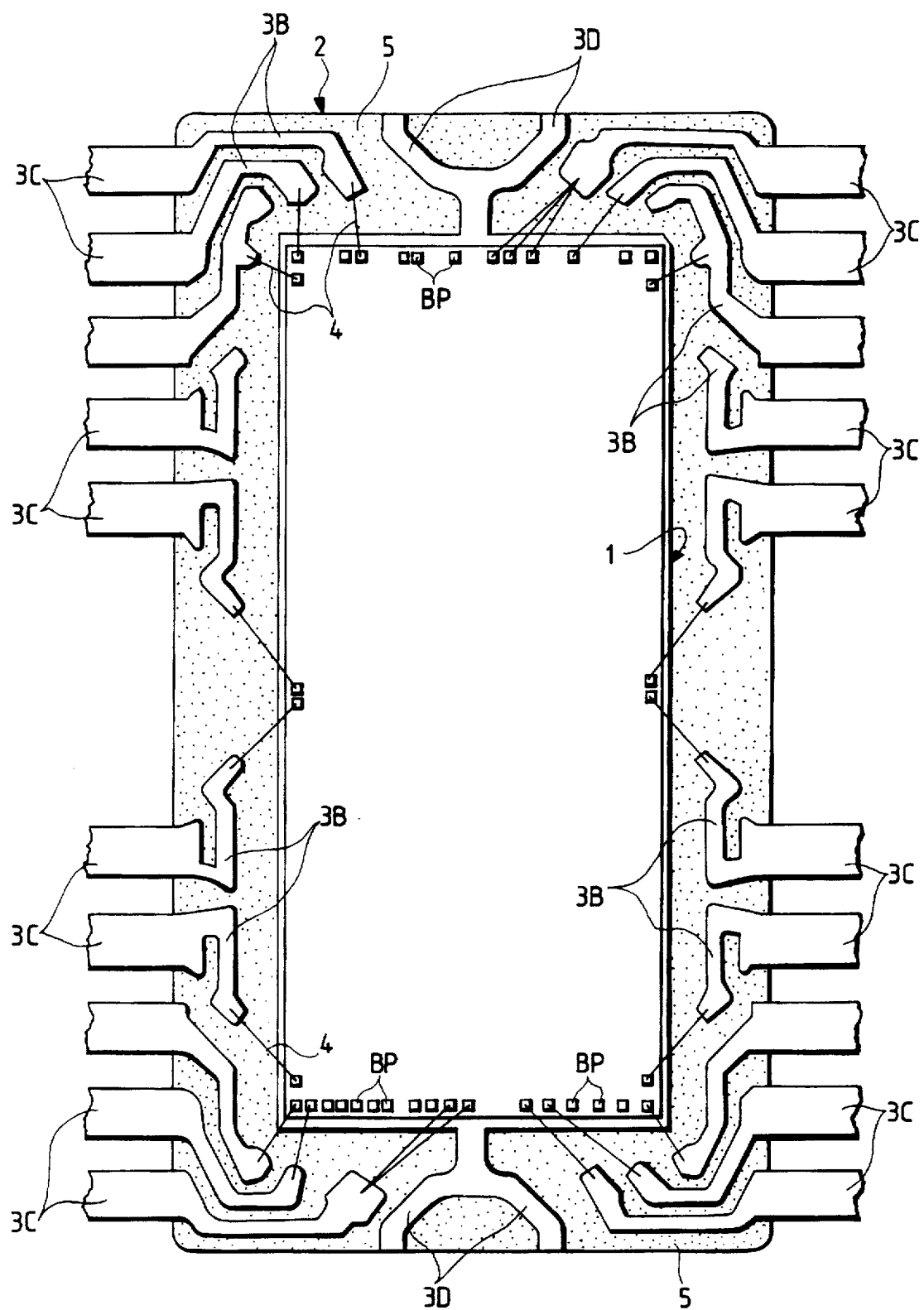
FIG. 2 is a partly sectional plan view of a resin-sealed semiconductor integrated circuit including the DRAM of FIG. 1.

FIG. 2 shows a resin-sealed semiconductor device including a DRAM in a first embodiment according to the present invention.

As shown in FIG. 2, a DRAM (semiconductor pellet) 1 of 4M-bit capacity is attached adhesively to the tab 3A of a resin-sealed semiconductor device 2 of 350 mil. The DRAM 1 has a matrix of memory cells (memory elements) each capable of storing 1 bit of information and arranged in columns and rows. A direct peripheral circuit for directly controlling the read-and-write operation of the memory cells, and an indirect peripheral circuit for indirectly controlling the operation of the direct peripheral circuits are arranged on the DRAM 1. The direct peripheral circuit includes row address decoder circuits, column-address decoder circuits and sense amplifier circuits. The indirect peripheral circuit includes a clock signal generating circuit and a buffer circuit.

Bonding pads BP are arranged in the periphery of the DRAM 1 along the short sides and in the respective middle portions of the long sides of the DRAM 1. The bonding pads BP are connected to inner leads 3B by aluminum bonding wires 4, respectively. The bonding wires 4 may be Au wires, Cu wires or insulated wires coated with an insulating resin. The bonding wires BP 4 are bonded to the bonding pads 3B by a bonding method using both a thermocompression bonding process and an ultrasonic welding process.

Outer leads 3C are formed integrally with the inner leads 3B, respectively. The inner leads 3B, the outer leads 3C and the tab 3A are formed by cutting a lead frame formed of, for example, Cu or an Fe—Ni alloy, such as an Fe—Ni alloy of 42% Ni content. The short sides of the tab 3A are connected to tab suspension leads 3D, respectively.

The outer leads 3C are assigned to specific signals in accordance with standards and are numbered. In FIG. 2, the outer lead 3C at the upper left-hand corner is a terminal No. 1, the outer lead 3C at the lower left-hand corner is a terminal No. 10, the outer lead 3C at the lower right-hand corner is a terminal No. 11, and the outer lead 3C at the upper right-hand corner is a terminal No. 20. Signals to be applied to the outer leads 3C, respectively, will be described afterward in connection with the bonding pads BP.

The DRAM 1, the tab 3A, the bonding pads 4, the inner leads 3B and the tab suspension leads 3D are sealed in a mixed resin 5 containing an epoxy resin, a phenol hardener, silicone rubber and a filler, and having a comparatively low thermal expansion coefficient. The mixed resin 5 is determined selectively so that the DRAM 1 may not excessively stressed. The filler is spherical silicon dioxide particles.

Figure 3:
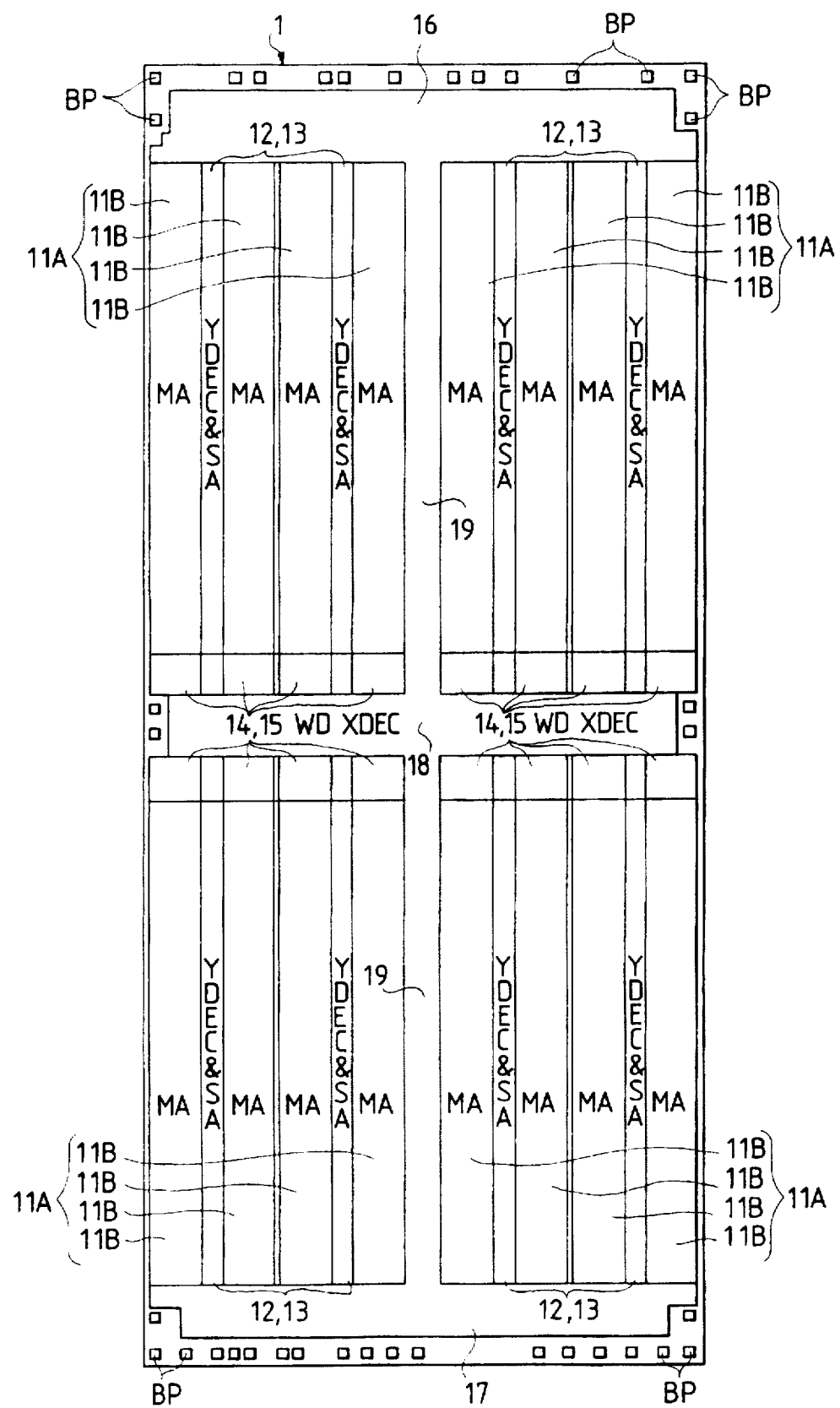
FIG. 3 is a diagram showing the chip layout of the DRAM of FIG. 1.

Referring to FIG. 3 showing the layout of the DRAM 1 sealed in the resin-sealed semiconductor device 2, the memory cells are arranged in a memory cell array (MA) 11 in the central portion of the substrate of the DRAM 1. The memory cell array 11 is divided into four memory cell arrays 11A in a mat construction, namely, two memory cell arrays 11A in the upper section and two memory cell arrays 11A in the lower section. Each of the memory cell arrays 11A is divided further into four memory cell arrays 11B. Thus, the DRAM 1 has sixteen memory cell arrays 11B. The capacity of each memory cell array 11B is 256K bits.

The sixteen memory cell arrays 11B are divided into eight pairs of memory cell arrays 11B, and some of the column address decoder circuits (YDECs) 12 and the sense amplifier circuits (SAs) are disposed between the pairs of memory cell arrays 11B. The sense amplifier circuit 13 comprises complementary MISFETs (CMOSs). Some of the sense amplifier circuits 13 each consist of n-channel MISFETs, and others of the same each consists of p-channel MISFETs, which are disposed at the ends of the memory cell arrays 11B opposite to the n-channel MISFETs, respectively. The DRAM 1 is of folded bit line system having complementary data lines (two data lines) extending from one end of each sense amplifier circuit 13 over the memory cell array 11B.

Disposed at one end of each memory cell array 11B on the side of the central portion of the DRAM 1 are a row-address decoder circuits (XDEC) 14 and a word driver circuit (WD) 15. The circuits 12 to 15 comprise the direct peripheral circuit.

An upper peripheral circuit 16 and a lower peripheral circuit 17 are disposed in the upper and lower sides of the DRAM 1, respectively, and a middle peripheral circuit 18 is disposed between the two upper memory cell arrays 11A in the upper section of the DRAM1 and the two lower memory cell arrays 11A in the lower section of the same. Central peripheral circuits 19 are disposed between the two upper memory cell arrays 11A and between the two lower memory cell arrays 11A, respectively. The peripheral circuits 16 to 19 comprise the indirect peripheral circuit.

Figure 4:
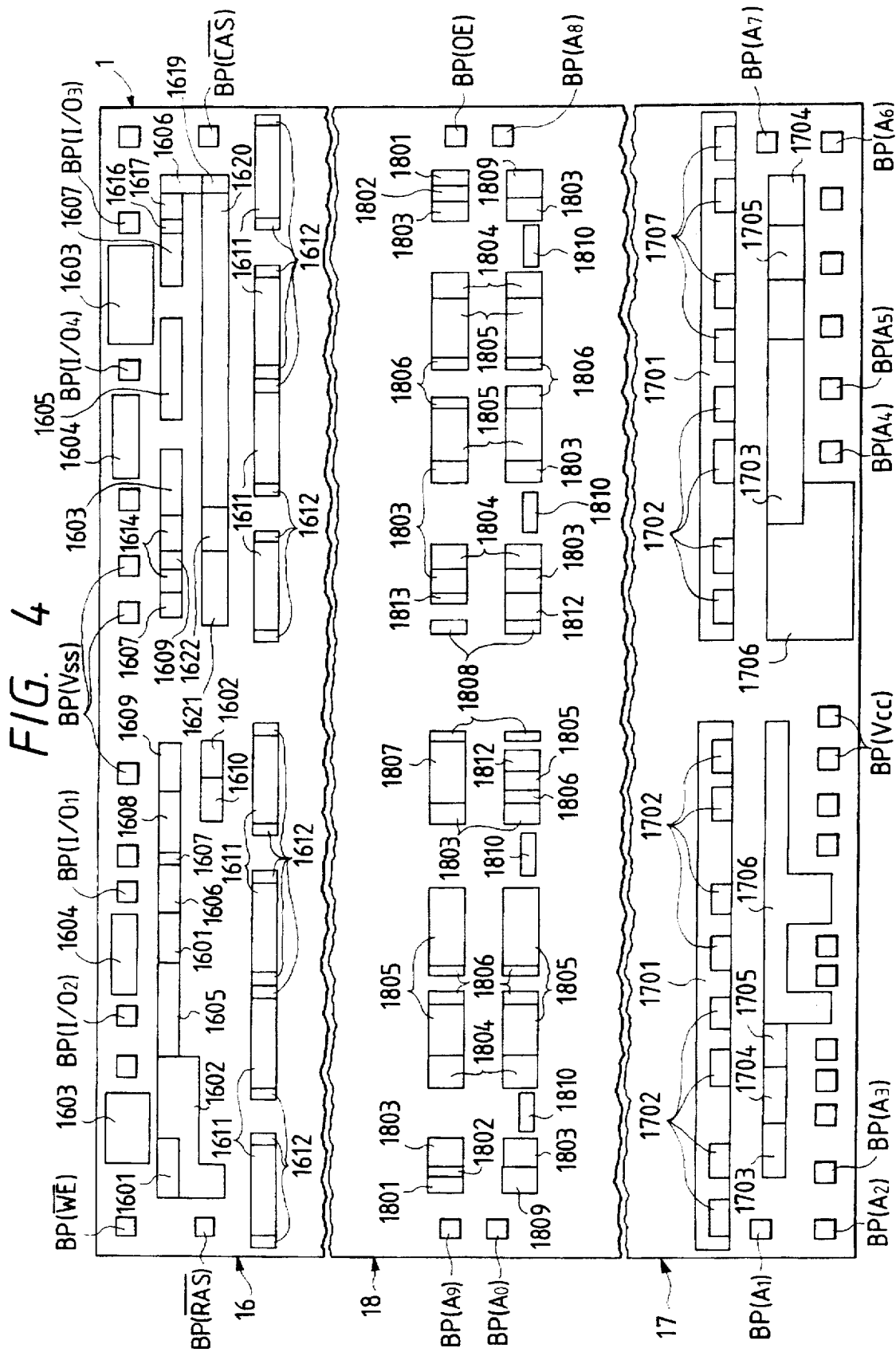
FIG. 4 is an enlarged fragmentary diagram showing the layout of an essential portion of the DRAM of FIG. 1.

The functions of the bonding pads BP and the circuit configuration of the peripheral circuits will be described hereinafter with reference to FIG. 4.

The bonding pads BP ($A_0$ to $A_g$) are assigned to address signals; the bonding pads BP ($I/O_1$ to $I/O_4$) are assigned to input/output signals; the bonding pad BP ($\overline{RAS}$) is assigned to row-address strobe signal; the bonding pads BP ($\overline{CAS}$) is assigned to column-address strobe signal; the bonding pad BP ($\overline{WE}$) is assigned to write enable signal; and the bonding pad BP ($\overline{OE}$) is assigned to output enable signal. The bonding pads BP ($V_{ss}$) are held at a reference potential, for example the ground potential of 0 V of the circuit, and the bonding pads BP ($V_{cc}$) are held at a power supply potential, for example, the operating potential of 5 V of the circuit. An input protective circuit (static electricity breakdown preventive circuit), not shown, is provided near each bonding pads BP assigned to an input signal.

Basically, the component circuits of the upper peripheral circuit 16 of the indirect peripheral circuit are arranged near the associated bonding pads BP. Shown in FIG. 4 are a write circuit 1601, RAS control circuits 1602, substrate potential producing circuits 1603 for producing a substrate voltage $V_{BB}$ of, for example, from −2.5 V to −3.5 V, data output buffer circuits 1604, data I/O circuits 1605, data output control circuits 1606, CAS control circuits 1607, a read/write control circuit 1608, test mode control circuits 1609, a main amplifier control circuit 1610, IO select circuits 1611, mat select and common source drive circuits 1612, bonding master control circuits 1614, an ATD circuit 1616, X-address buffer circuit 1617, a y-address buffer circuit 1619, a main amplifier circuit 1620, a nibble counter circuit 1621, and a test logic circuit 1622.

The middle peripheral circuit 18 comprises: Y-address buffer circuits 1801, ATD circuits 1802, mat select circuits 1803, X predecoder circuits 1804, X redundant circuits 1805, refresh counter circuits 1806, a column equalize circuit 1807, decoder monitor circuits 1808, X-address buffer circuits 1809, common I/O equalize control circuits 1810, an X-address latch circuit 1812, and a refresh control circuit 1813.

The lower peripheral circuit 17 comprises: mat select and common source drive circuits 1701, Y predecoder circuits 1702, X-address buffer circuits 1703, Y-address buffer circuits 1704, ATD circuits 1705, Y redundant circuits 1706, and X predecoder circuits 1707.

The essential portion of the memory cell array 11B and that of the associated circuits of the DRAM 1 will be described hereinafter with reference to FIG. 5.

Figure 5:
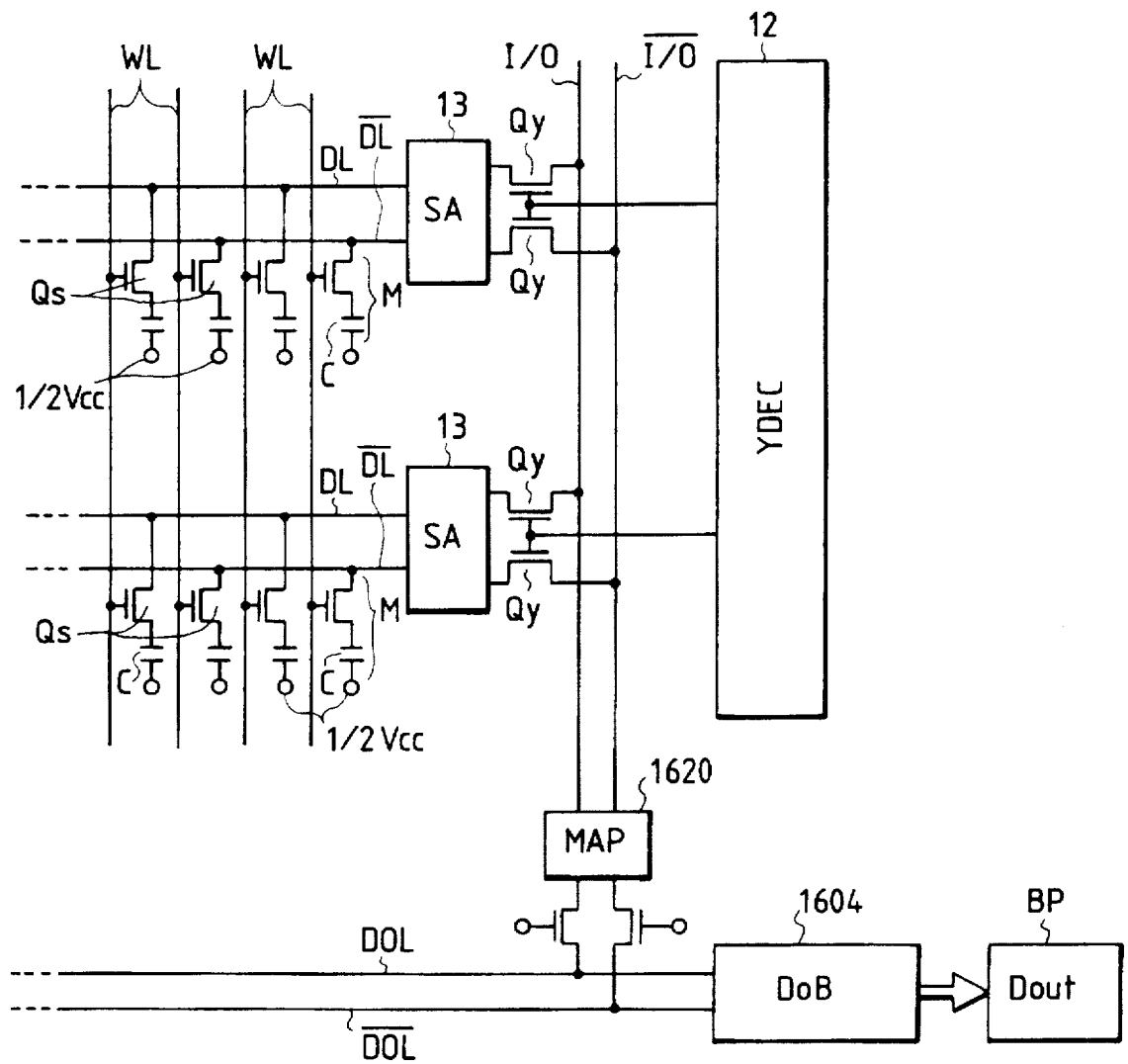
FIG. 5 illustrates the equivalent circuit of an essential portion of the DRAM of FIG. 1.

Referring to FIG. 5, complementary data lines DL and $\overline{DL}$ are extended along the direction of row in the memory cell array 11B of the DRAM 1 of folded bit line system and are connected to the sense amplifier circuits (SA) 13.

In the memory cell array 11B, a plurality of word lines WL are extended across the complementary data lines DL in the direction of column. The word lines WL are connected to row-address decoder circuits (XDEC), not shown in FIG. 5, for selecting the word lines WL.

The memory cells M each capable of storing 1 bit of information are disposed at the junctions of the complementary data lines DL and the word lines WL, respectively. Each memory cell M consists of a memory cell select n-channel MISFET $Q_s$ and a data storage capacitor C connected in series to the n-channel MISFET $Q_s$.

The memory cell select MISFET $Q_s$ of the memory cell M has one semiconductor region connected to the complementary data line DL and the other semiconductor region connected to one of the electrodes of the data storage capacitor C. The gate electrode of the memory select MISFET $Q_s$ is connected to the word line WL. The other electrode of the data storage capacitive element C is held at a voltage $V_{cc}/2$ ($V_{cc}$ is supply voltage). The voltage $V_{cc}/2$ is, for example, 2.5 V which is between the reference voltage $V_{ss}$ and the supply voltage $V_{cc}$. The voltage $V_{cc}/2$ reduces the field strength across the data storage capacitor C to suppress the reduction of the dielectric strength of the dielectric film.

The sense amplifier circuit 13 amplifies the information transferred from the memory cell M to the complementary data line DL. The information amplified by the sense amplifier 13 is transmitted through a column switching n-channel MISFET $Q_y$ to the common data lines I/O and $\overline{I/O}$. The column address decoder circuit (YDEC) controls the column switching MISFET $Q_y$.

The common data line I/O is connected to the main amplifier circuit (MA0) 1620, which in turn is connected through switching MISFETs, output signal lines DOL and $\overline{DOL}$, the data output buffer circuit (DOB) 1604 to the output bonding pads ($D_{out}$) BP connected to an external device.

Figure 6:
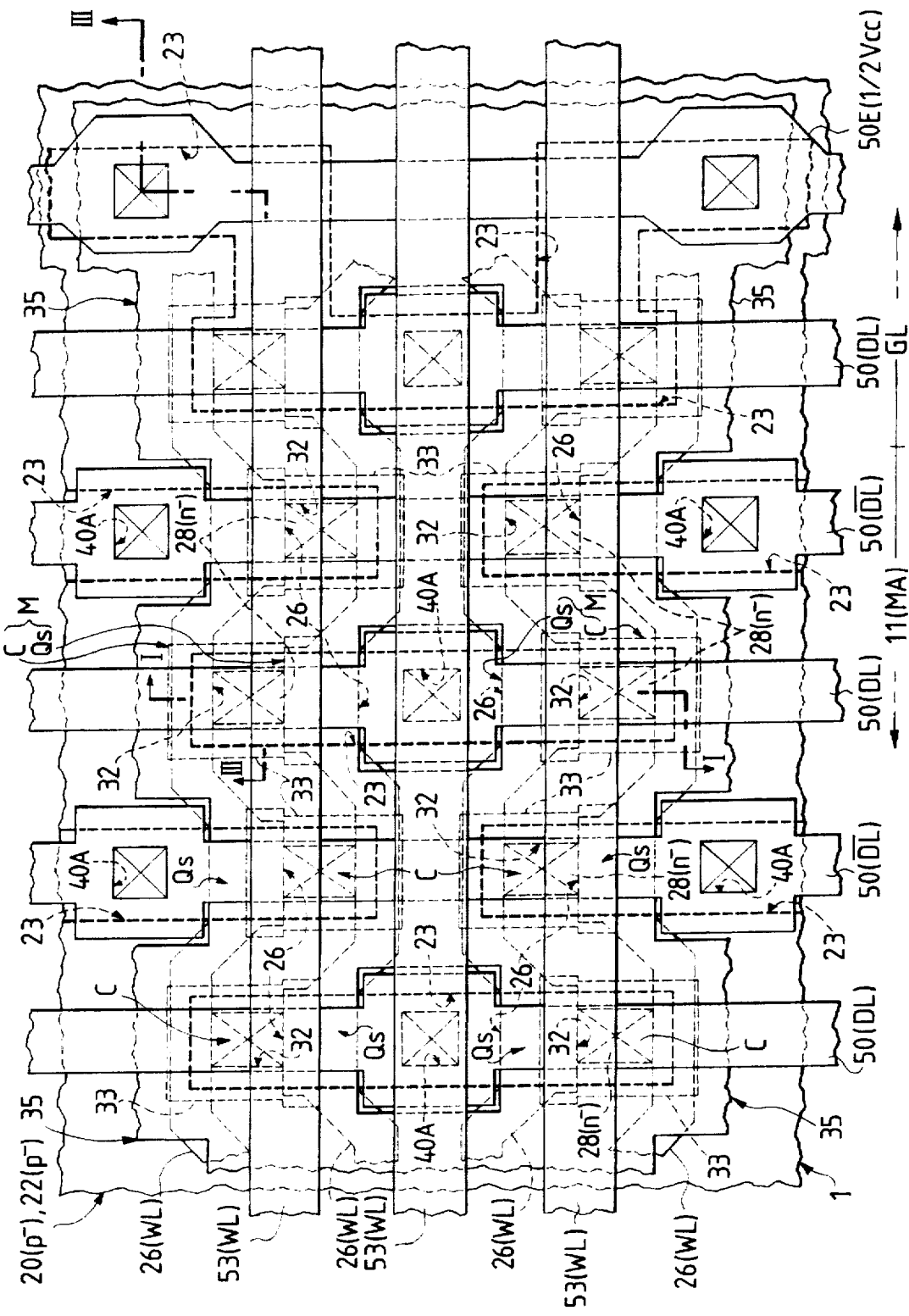
FIG. 6 is a plan view of an essential portion of the DRAM of FIG. 1.

The component elements of the memory cells M and peripheral circuits including the sense amplifier circuits and decoder circuits of the DRAM 1 will be described hereinafter. FIG. 6 is a plan view of an essential portion of the memory cell array 11B, and FIG. 1 shows the cross sections of the memory cell array 11B and the elements of the peripheral circuits. The left-hand portion of FIG. 1 shows the cross section of the memory cell M taken on line I—I in FIG. 6, and the right-hand portion of FIG. 1 shows the cross section of the CMOS of the peripheral circuit.

Referring to FIGS. 1, and 6, the DRAM 1 has a $p^-$-type semiconductor substrate 20 formed of single crystal silicon. The elements are formed on the crystal face (100) of the semiconductor substrate 20. A portion of the major surface of the semiconductor substrate 20 is not subjected to an ion implantation process for introducing an impurity in a density not less than about $10^{15}$ atoms/cm². At least a portion of the major surface is shared to the memory cell arrays 11B. Since the impurity introduced into the semiconductor substrate 20 many defects in the crystal causing charge representing information to leak, the impurity is introduced into only limited regions. limited regions. To suppress contamination by heavy metals, such as Na, the DRAM 1 employs a semiconductor wafer having a gettering layer in a deep region as the semiconductor substrate 20. The gettering layer is formed in a region of a depth not less than about 10 μm from the major surface, namely, a region deeper than well regions 21 and 22.

The $p^-$-type well region 22 is formed in a region in the major surface for the memory cells M of the memory cell array 11 and n-channel MISFETs $Q_n$. The $n^-$-type well region is formed in a region in the major surface for the p-channel MISFETs $Q_p$. The DRAM 1 is of a twin well structure.

A field insulating film 23 is formed in regions between the well regions 21 and 22 for semiconductor elements. A p-type channel stopper region 24A is formed under the field insulating film 23 in the $p^-$-type well region 22. A parasitic MOS is subject to n-type inversion when the field insulating film 23 is used as a gate insulating film, the channel stopper region 24A is formed at least in the $p^-$-type well region 22.

A p-type semiconductor region 24B is formed over the $p^-$-type well region 22 of the memory cell forming region for the memory cell array 11, namely, substantially over the entire region for the memory cell array 11. The p-type semiconductor region 24B and the p-type channel stopper region 24A are formed simultaneously by the same process by using the same mask through the lateral diffusion of a p-type impurity B for the p-type channel stopper region 24A. The width of the gates of the memory cell select n-channel MISFETs $Q_s$ of the memory cells M is smaller than that of the n-channel MISFETs $Q_n$ of the peripheral circuits; that is, the p-type semiconductor region 24B is formed substantially over the entire region for the memory cells M by the lateral diffusion of the p-type impurity. The impurity density of the p-type semiconductor region 24B is higher than that of the $p^-$-type well region 22 higher than that of the $p^-$-type semiconductor substrate 20. The p-type semiconductor region 24B is able to raise the threshold voltage of the memory cell select MISFETs $Q_s$. The p-type semiconductor region 24B acts as a potential barrier region with minority carrier.

Figure 7:
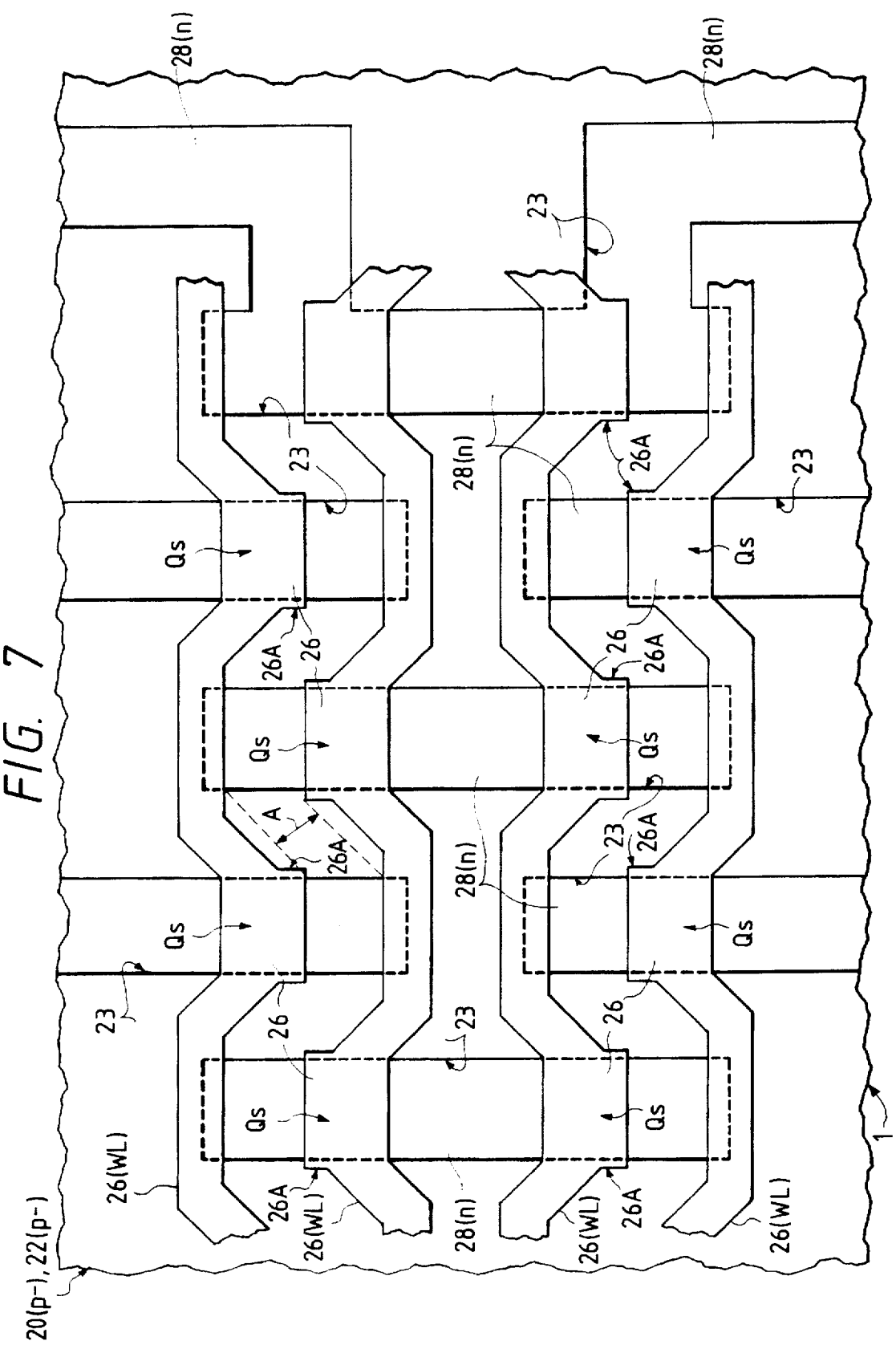
FIGS. 7 and 8 are plan views of the DRAM of FIG. 1 respectively in different stages of fabrication.

As shown in FIGS. 1, 6 and 7, the memory cell select MISFET $Q_s$ of each memory cell M is formed in the $p^-$-type well region 22, actually, in the p-type semiconductor region 24B, in a region defined by the field insulating film 23 and the p-type channel stopper region 24A. The memory cell select MISFET $Q_s$ consists mainly of the $p^-$-type well region 22, a gate insulating film 25, a gate electrode 26, and a pair of n-type semiconductor regions 28 serving as a source region or a drain region.

The $p^-$-type well region 22 is a channel forming region. The gate insulating film 25 is a silicon dioxide film formed by oxidizing the surface of the $p^-$-type well region 22.

Gate electrodes 26 are formed over a gate insulating film 6. The gate electrodes 26 is formed of, for example, polycrystalline silicon film deposited by a CVD process in a thickness on the order of 200 to 300 nm. The polycrystalline silicon film is doped with an n-type impurity, such as P or As, to reduce the resistance. The gate electrode 26 may be a single film of a metal having a high melting point, such as Mo, Ti, Ta or W, or the silicide of a metal having a high melting point, such as $MoSi_2$, $TiSi_2$, $TaSi_2$ or $WSi_2$, or may be a composite film formed by depositing a film of such a metal having a high melting point or such a silicide of a metal having a high melting point over a polycrystalline silicon film.

As shown in FIGS. 6 and 7, the gate electrodes 26 are formed integrally with word lines (WL) 26 extending in the direction of column; that is, the gate electrodes 26 and the word lines 26 are formed by the same conductive layer. Each word line 26 is connected to the gate electrodes 26 of the memory cell select MISFETs $Q_s$ of memory cells M on the same column.

As shown in FIG. 7, the length of the gate electrodes 26 of the memory cell select MISFETs is greater than the width of the word lines 26. For example, the length of the gate electrodes 26 is 1.0 μm and the width of the word lines 26 is 0.6 μm. The DRAM 1 is fabricated by a so-called 0.8 μm process in which the lower limit of size of the components is 0.8 μm except that the width of the word lines 26 is 0.6 μm.

As shown in FIGS. 6 and 7, the memory cells M are disposed at first intersections, namely, the intersections of the first data lines DL of the complementary data lines 50 and the word lines 26, and at second intersections, namely, the intersections of the second data lines DL of the complementary data lines 50 and the word lines 26 adjacent to the former word lines 26, respectively. The word lines 26 are substantially the same in width and are extended in the direction of column in parallel to each other at predetermined intervals. The two word lines 26 are zigzag lines alternately turning in opposite directions, respectively, at the data lines DL and the other data lines $\overline{DL}$. Each word line 26 has turning portions 26A each turning in conformity with the shape of the memory cell M toward the adjacent word line 26 at the first intersection. The other word line has a turning portion 26A turning in conformity with the shape of the memory cell M toward the former word line 26 at the second intersection. Substantially, the turning portions 26A are the gate electrodes 26 of the memory cell select MISFETs. The turning portions 26A have a width greater than that of the word lines 26. Each turning portion 26A overlaps the field insulating film 23 defining the periphery of the memory cell M with a slight allowance for alignment with the field insulating film 23 and turns so as to conform to the shape of the memory cell M. The width of the turning portion 26A is substantially the same as the length of the gate of the corresponding memory cell select MISFET $Q_s$. Thus, the memory cells M can be arranged at reduced intervals smaller than those between the memory cells M when the with of the word lines 26 corresponds simply to the length of the gate of the memory cell select MISFET $Q_s$ with respect to the direction of extension of the word lines 26 because a sufficiently large interval can be secured between the word lines 26 on the field insulating film 23 as shown in FIG. 7.

The memory cells M each consisting of a series circuit of the memory cell select MISFET $Q_s$ and the data storage capacitor C are thus arranged. In the DRAM 1 of folded bit line system, the memory cells M are disposed at the first intersection, namely, the intersection of the first data line DL of the complementary data lines 50 and the word line 26, and at the second intersection, namely, the intersection of the second data line $\overline{DL}$ and the word line 26 adjacent to the former word line 26, respectively, the first and second word lines 26 are substantially the same in width and are extended in the direction of column in parallel to each other with a predetermined interval therebetween, the first and second word lines 26 are zigzag lines alternately turning in opposite directions, respectively, at each first data line DL and each second data line $\overline{DL}$, the first word line 26 has turning portions 26A each turning in conformity with the shape of the memory cell M toward the adjacent second word line 26 at the first intersection, and the second word line 26 has turning portions 26A each turning in conformity with the shape of the memory cell M toward the adjacent first word line 26 at the second intersection. Thus, the first word line 26 and its turning portions 26A are used as the gate electrodes 26 of the memory cell select MISFETs $Q_s$ at the first intersections, the second word line 26 and its turning portions 26A are used as the gate electrodes 26 of the memory cell select MISFETs $Q_s$ at the second intersections, and the turning portions 26a provide gates of the memory select MISFETs $Q_s$ having a sufficiently large length; consequently, the short channel effect can be suppressed and the memory cells M can be arranged at comparatively small intervals at the first and second intersections. Accordingly, the memory cells M require a comparatively small area as compared with those of the conventional DRAM, the regions separating the memory cells M from each other require a comparatively small area as compared with those of the conventional DRAM, and hence the DRAM 1 has a degree of integration greater than that of the conventional DRAM.

At least a portion of the n-type semiconductor region 28 on the side connected to the data storage capacitor C has an impurity density smaller than that of the $n^+$-type semiconductor region 37 of the MISFET $Q_s$. Concretely, the impurity is introduced into the n-type semiconductor region 28 by an ion implantation process in a low impurity density less than $10^{14}$ atoms/cm$^2$. That is, the n-type semiconductor region 28 is formed so that crystalline defects attributable to the introduction of the impurity into the region can be reduced and the crystalline defects produced by the introduction of the impurity into the region can be removed satisfactorily by heat treatment subsequent to the introduction of the impurity into the region. Accordingly, leak current across the pn junction of the n-type semiconductor region 28 and the $p^-$-type well region 22 is reduced, and hence the data storage capacitor C is able to hold stably the charge representing information.

Since the n-type semiconductor region 28 conforms automatically to the gate electrode 26, and the portion of the n-type semiconductor region 28 on the side of the channel forming region has a comparatively small impurity density, the memory cell select MISFET $Q_s$ is of a LDD (lightly doped drain) structure.

The n-type semiconductor region 28 of the memory cell select MISFET $Q_s$ to be connected to the complementary word line is formed integrally with the $n^+$-type semiconductor region 41, the other semiconductor region 28 of the same to be connected to the data storage capacitor C is formed integrally with the $n^+$-type semiconductor region 33A. The $n^+$-type semiconductor region 41 is formed in a region corresponding to the contact hole 40A for connecting complementary data line 50 and one of the n-type semiconductor regions 28. The $n^+$-type semiconductor region 41 is formed so as to prevent short circuit across the complementary data line 50 and the $p^-$-type well region 22. The $n^+$-type semiconductor region 33A is formed in a region corresponding to a contact hole 32 for connecting the lower electrode 33 of the data storage capacitive element C and the other n-type semiconductor region 28. The $n^+$-type semiconductor region 33A is formed by diffusing an n-type impurity introduced into a film for the lower electrode 33.

The gate electrode 26 of the memory select MISFET $Q_s$ is covered with an insulating film 27. Side wall spacers 29 are formed over the side walls of the gate electrode 26 and the insulating film 27. The insulating film 27 is formed mainly to isolate the gate electrode 26 and the electrodes of the data storage capacitor C, particularly, the electrode 33, formed over the gate electrode 26 electrically from each other. The side wall spacer 29 constitutes mainly the memory cell select MISFET $Q_s$ of LDD structure. The insulating film 27 and the side wall spacer 29 are silicon dioxide films deposited by a CVD process using inorganic silane gas and nitrogen oxide gas as source gases, which will be described afterward. The silicon dioxide film deposited by a CVD process using inorganic silane gas as a source gas has step coverage higher than that of a silicon dioxide film deposited by a CVD process using organic silane gas, and shrinkage lower than that of the latter.

In the DRAM 1 having the insulating film 27 covering the gate electrode 26 of the memory select MISFET $Q_s$, and the side wall spacer 29 covering the side walls of the insulating film 27 and the gate electrode 26, the insulating film 26 covering the gate electrode 26, and the side wall spacer 29 are formed of silicon dioxide films deposited by a CVD process using inorganic silane gas and nitrogen oxide gas as source gases, and the silicon dioxide films, i.e., the insulating film 27 and the side wall spacer 29, has a shrinkage smaller than that of a silicon dioxide film formed by using organic silane gas as a source gas. Therefore, the the possibility of separation of the insulating film 27 and the side wall spacer 29 is reduced, current leakage across the gate electrode 26 and the adjacent conductive layer, such as the film for the lower electrode 33, is prevented and the DRAM 1 is able to secure high electrical reliability. Since the insulating film 27 covering the gate electrode 26, and the side wall spacer 29 have high step coverage, the silicon dioxide film can be formed in a uniform thickness to improve the dielectric strength of the same. The high step coverage of the silicon dioxide film enables a thinner film to cover steps satisfactorily and facilitates the formation of the lower electrode 33.

Figure 8:
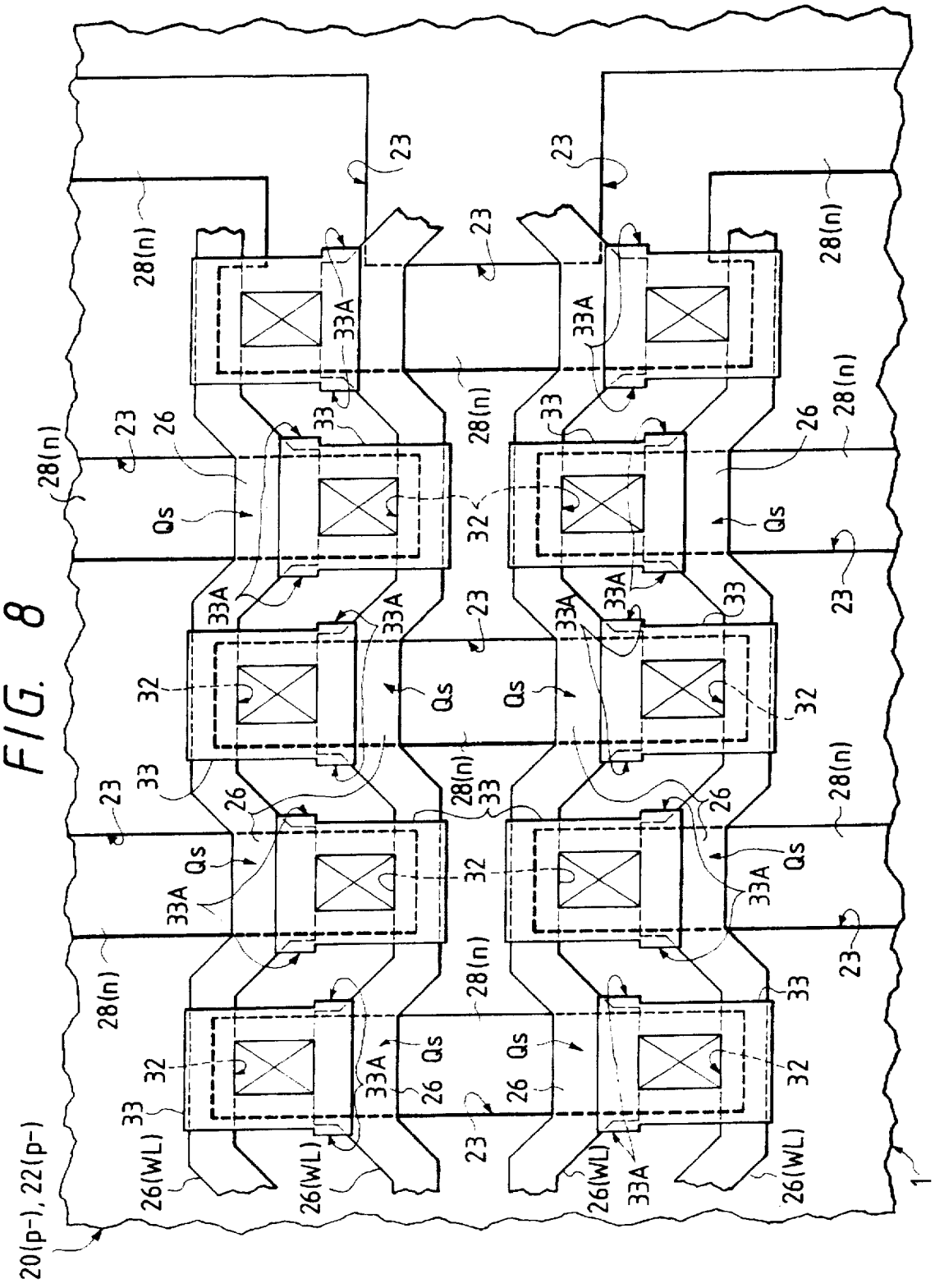

As shown in FIGS. 1, 6 and 8, the data storage capacitor C of the memory cell M is constructed by successively forming a film for the lower electrode 33, the dielectric film 34, and a film for the upper electrode 35 in that order.

The central portion of the data storage capacitor C is connected to connected to one of the n-type semiconductor regions 28 of the memory cell select MISFET $Q_s$ through the contact hole 31A formed in the layer insulating film 31, and the contact hole 32 defined by the side wall spacer 29. The size of the contact hole 32 with respect to the direction of row is defined by the gap between the gate electrode 26 of the memory cell select MISFET $Q_s$ and the adjacent word line 26. The difference between the size of the contact hole 31A and that of the contact hole 32 is greater than an allowance for mask alignment. The peripheral portion of the lower electrode 33 extends over the gate electrode 26 and the word line 26.

The layer insulating film 31, the insulating film 27 underlying the layer insulating film 31, and the side wall spacer 29 are formed of the same insulating film, i.e., a silicon dioxide film deposited by a CVD process using inorganic silane gas and nitrogen oxide gas as source gases.

The film for the lower electrode 33 is a polycrystalline silicon film deposited, for example, by a CVD process. The polycrystalline silicon film is doped in a high density with an n-type impurity, such as As or P. The lower electrode 33 is formed in a comparatively large thickness, for example, on the order of 200 to 400 nm by utilizing the stepped shape of the underlying surface and the side walls to increase the storage capacity of the stacked data storage capacitor C.

As shown in FIG. 8, the lower electrode 33 has a rectangular shape in plan view with its longer sides extending in the direction of row along which the complementary data lines 50 extend. The lower electrode 33 arranged along the direction of column as shown in FIG. 8 is formed in a size equal to or near the minimum possible processing size of the process. Similarly, the size of the interval between the sides of the lower electrodes 33 not connected to the complementary data lines 50 among those arranged along the complementary data lines 50, i.e., the direction of row, separated by the field insulating film 23 is equal to or near the minimum possible processing size of the process, while the sides of the lower electrodes 33 connected to the complementary data line 50 are separated by a size sufficient to secure a region for connecting the n-type semiconductor region 28 of the memory cell select MISFET $Q_s$ and the complementary data lines 50, a sufficient dielectric strength across the upper electrode 35 and the complementary data line 50, a sufficient over lap of the lower electrode 33 and the upper electrode 35, and a sufficient dielectric strength across the lower electrode 33 and the complementary data line 50. The rectangular lower electrode 33 has correction portions 33A laterally projecting therefrom on the side of the connection of the n-type semiconductor region 28 and the complementary data line 50. The size of an etching mask (photoresist film) for processing the film for the lower electrode 33 is reduced by diffraction in the expanded region between the lower electrode 33 corresponding to the region for connecting the n-type semiconductor region 28 and the complementary data line 50 and by reflection from steps in the word line 26, thereby the lower electrode 33 is reduced to a size smaller than a predetermined size reducing the charge storage capacity of the data storage capacitor C. Accordingly, the lower electrode 33 is provided with the correction portion 33A to make allowance for the reduction in size. Although the correction portion 33A is formed on the side of the connecting region where a sufficient space is available, the position of the correction portion 33A need not be limited thereto but may be formed on the opposite side. Practically, the corners of the rectangular lower electrode 33 are rounded considerably and hence the actual lower electrode 33 has a generally roundish shape.

Thus, the portions of the etching mask corresponding to the expanded region between the lower electrodes 33 on the side of the complementary data line is expanded to form the correction portions 33A in fabricating the DRAM 1 comprising the memory cells each consisting of the series circuit of the stacked data storage capacitor C and the memory cell select MISFET $Q_s$ and, consequently, the reduction in the size of the portion of the etching mask corresponding to the expanded region attributable to diffraction and reflection from the word lines 26 can be suppressed in the photolithographic process of forming the etching mask for forming the lower electrodes 33. Accordingly, the lower electrode 33 can be formed in the design size and hence the data storage capacitor C having the design charge storage capacity can be formed, which enhances the alpha particle soft error immunity, reduces the area of the memory cell M and increases the degree of integration of the DRAM 1.

Basically, the dielectric film 34 is of a two-layer structure consisting of a silicon nitride film 34A formed over the film for the lower electrode layer 33 formed of a polycrystalline silicon by a CVD process, and a silicon dioxide film 34B formed by oxidizing the silicon nitride film 34A under a high pressure. Actually, the dielectric film 34 is of a three-layer structure consisting of a very thin silicon dioxide film of a thickness less than 3 nm, the silicon nitride film 34A and the silicon dioxide film 34B because the very thin silicon dioxide film is formed by the natural oxidation of the surface of the polycrystalline silicon film. Since the silicon nitride film 34A of the dielectric film 34 is deposited by a CVD process, the conditions of the CVD process can be determined without dependence on the crystalline condition and stepped shape of the polycrystalline silicon film, i.e., the film for the lower electrodes 33, underlying the silicon nitride film 34A. Thus, the silicon nitride film 34A has a dielectric strength higher than that of the silicon dioxide film formed by oxidizing the surface of a polycrystalline silicon film and the number of defects per unit area of the former is smaller than that of the latter, and hence the current leakage across the silicon nitride film 34A is very small. More over, the dielectric constant of the silicon nitride film is higher than that of the silicon dioxide film. Since the silicon dioxide film 34B can be formed in a high quality, the advantage of the silicon nitride film 34A can further be improved. The silicon dioxide film 34B is formed by oxidation under a high pressure in the range of 1.5 to 10 atm. Oxidation under a high pressure requires less time for oxidation than oxidation under the atmospheric pressure. When the silicon dioxide film 34B is as thin as 2 nm or below and a sufficient time is available, the silicon dioxide film may be formed by oxidation under the atmospheric pressure.

The dielectric film 34 is formed so as to cover the upper surface and side surfaces of the lower electrode 33 in order that the area of the dielectric film 34 is increased by an area corresponding to the height of the side surfaces of the lower electrode 33 to provide the stacked data storage capacitor C with an increased charge storage capacity. The plane shape of the dielectric film 34 is dependent on that of the upper electrode 35 and is substantially the same with that of the upper electrode 35.

The upper electrode 35 is formed over the dielectric film 34 formed over the lower electrode 33. The upper electrode 35 is common to the stacked data storage capacitors C of the adjacent memory cells M. The voltage $V_{cc}/2$ is applied to the upper electrode 35. The film for the upper electrode 35 is a polycrystalline silicon film formed by, for example, a CVD process and doped with an n-type impurity to reduce its electrical resistivity. The thickness of the upper electrode 35 is equal to or less than that of the lower electrode 33.

Thus, the DRAM 1 comprises the stacked data storage capacitors C each consisting of the lower electrode 33 formed over the layer insulating film 31, the dielectric film 34 formed over the layer insulating film 31 and the lower electrode 33, and the upper electrode 35 formed over the dielectric film 34, in which the dielectric film 34 is a composite film including the silicon nitride film 34A, and the layer insulating film 31 is a silicon dioxide film deposited by a CVD process using inorganic silane gas and nitrogen oxide gas as source gases. Thus, the shrinkage of the layer insulating film 31 relative to the dielectric film 34 of the stacked data storage capacitor C is reduced to suppress the induction of stress in the dielectric film 34 attributable to the shrinkage of the layer insulating film 31 and, consequently, the destruction of the dielectric film 34 is prevented, the leakage of current across the lower electrode 33 and the upper electrode 35 is prevented and hence the electrical reliability of the DRAM 1 is improved. Since the layer insulating film 31 has a high step coverage, the layer insulating film 31 has a uniform thickness and a high dielectric strength.

As shown in FIGS. 1, 6, 7 and 8, the memory cell M is connected to the other memory cell M adjacent thereto with respect to the direction of row; that is, one of the n-type semiconductor regions 28 of the memory cell select MISFET $Q_s$ of one of the two adjacent memory cells M with respect to the direction of row is formed integrally with one of the n-type semiconductor regions 28 of the memory cell select MISFET $Q_s$ of the other memory cell M, and hence this n-type semiconductor region 28 is symmetrical with respect to the junction of the adjacent memory cells M. Pairs of the adjacent memory cells M are arranged along the direction of column. Each memory cell M of the pairs of memory cells M arranged along the direction of column is shifted by half a pitch relative to each memory cell M of other pairs of memory cells M adjacent to the former pairs of memory cells M with respect to the direction of column.

As shown in FIGS. 1 and 6, one of the n-type semiconductor region 28 of the memory cell select MISFET $Q_s$ of the memory cell M is connected to the complementary data line 50 (DL) through a contact hole 40A formed through the layer insulating films 36, 39 and 40. The complementary data line 50 may be connected to the n-type semiconductor region 28 through the n⁺-type semiconductor region 41.

The layer insulating films 36 and 39 are silicon dioxide films deposited by a CVD process. The layer insulating film 40 is formed of silicon dioxide film containing phosphorus and boron (BPSG) capable of being flattened by reflowing. The layer insulating film 39 secures sufficient dielectric strength and the diffusion of boron and phosphorus contained in the layer insulating film 40 overlying the layer insulating film 39 into the elements.

The complementary lines are of three-layer structure formed by sequentially stacking a transition metal film (barrier metal film) 50A, an aluminum or aluminum alloy film 50B and a transition metal film (protective film) 50C in that order.

The lower transition metal film 50a of the complementary data line 50 prevents the precipitation of single crystal silicon at the junction of the aluminum film 50B and the n-type semiconductor region 28 (actually, the n⁺-type semiconductor region 41), which increases the resistance at the junction; that is, the lower transition metal film 50A functions as a barrier metal film. The lower transition metal film 50A being formed before the overlying aluminum film 50B, the CVD process for forming the lower transition metal film 50A can be carried out at a temperature near or above the melting point of the aluminum film 50B. The lower transition metal film 50A is, for example, a $WSi_2$ film, a $TaSi_2$ film or a TiN film deposited by a CVD process; that is, the term "transition metal film" in this specification is the general designation of a transition metal film, a transition metal silicate film and a transition metal nitride film. The lower transition metal film 50A covers satisfactorily large steps in the underlying layer, particularly, steps at the junction of the complementary data line 50 and the n-type semiconductor region 28. When deposited by a low-temperature sputtering process, the lower transition metal film 50A must be subjected to a high-temperature heat treatment at a temperature on the order of 900° C. for the reduction of the resistance and stabilization. Since the lower transition metal film 50A is connected to the n-type semiconductor region 28 and regions for the peripheral circuits and is formed over the layer insulating film 40, the high-temperature heat treatment causes the interdiffusion of the impurities between the transition metal film 50A and the associated regions increasing resistances at the junctions. Therefore, it is desirable, from the viewpoint of preventing increase in resistance at the junctions, to form the lower transition metal film 50A by a CVD process at a temperature in the range of 650° to 900° C.

Basically, the aluminum film 50B, namely, the middle layer, of the complementary data line 50 is the principal conductor of the complementary data line 50. The middle layer may be formed of an aluminum alloy containing Cu, or Cu and Si. Cu suppresses migration. The Cu content of the aluminum alloy is, for example, on the order of 0.5% by weight. Si suppresses the alloy spike phenomenon. The Si content of the aluminum alloy is, for example, in the range of 1.0 to 1.5% by weight. The aluminum film 50B is deposited by, for example, a sputtering process.

The principal function of the upper transition metal film 50C of the complementary data line 50 is to suppress the formation of aluminum hillocks on the surface of the aluminum film 50B. The upper transition metal film 50C reduces the reflectance of the surface of the complementary data line 50 below the reflectance of the surface of the aluminum film 50B in order to suppress reduction in size of the etching mask for processing the complementary data line 50 during exposure due to diffraction effect and reflection from steps in the layer underlying the complementary data line 50. The upper transition metal film 50C is formed over the aluminum film 50B by a sputtering process to be carried out at a comparatively low temperature at which the aluminum film 50B is not fused. Since the substantial reduction of the resistance of the upper transition metal film 50C is not necessary, the upper transition metal film 50C need not be subjected to a high-temperature heat treatment. The upper transition metal film 50C is a film of $MoSi_2$, $WSi_2$, $TaSi_2$ or $TiSi_2$.

Thus, the complementary data line (wiring) 50 consisting of the lower transition metal film 50A, the aluminum (or aluminum alloy) film 50B and the upper transition metal film 50c is formed over the layer insulating film 40. Having a low electrical resistivity, the aluminum film 50B transmits signal at a high signal transmission speed to enable high-speed write operation and high-speed read operation. The lower transition metal film 50A covers steps in the underlying layer insulating film 40 satisfactorily to reduce the possibility of disconnection of the complementary data line 50 and to enhance the electrical reliability of the DRAM 1. The lower transition metal film 50A prevents the precipitation of Si at the junction of the complementary data line 50 and the associated regions including the n-type semiconductor region 28.

The complementary data line 50 is a composite film consisting of the lower transition metal film 50A deposited by a CVD process, the aluminum film 50B deposited by a sputtering process and the upper transition metal film 50C deposited by a sputtering process, which are stacked in that order. The formation of aluminum hillocks is prevented by the upper transition metal film 50C, and the upper transition metal film 50C reduces the reflectance of the aluminum (or aluminum alloy) film 50B to prevent over-exposure due to reflection from the layer underlying the complementary data line 50 and diffraction effect in forming the etching mask, so that the accuracy of the etching mask is improved. The aluminum film 50B is never fused because the temperature of the process of forming the upper transition metal film 50C is lower than the melting point of the aluminum (or aluminum alloy) film 50B.

The complementary data line 50 is formed by the first wiring forming process of the manufacturing process in a comparatively small thickness as compared with a wiring layer 53 formed over the complementary data line 50 by the second wiring forming process of the manufacturing process to lessen steps in the surface peculiar to the multilayer structure. The DRAM 1 in this embodiment has a two-layer wiring structure having two aluminum wiring layers and three-layer gate structure having three layers of polycrystalline silicon films.

As shown in FIGS. 1 and 6, The shunt word lines (WL) 53 is extended along the direction of column on a layer insulating film 51 covering the complementary data lines 50. The shunt word line (WL) 53 is connected to the word lines 26 in regions corresponding to several tens to several hundreds memory cells M. The word lines 26 are divided into a plurality of groups each for each memory cell array 11B, and the shunt word line 53 is connected to the plurality of word lines of each group. The shunt word line 53 is formed in a low resistance to enable high-speed write operation and high-speed read operation.

Referring to FIG. 1, the layer insulating film 51 is a composite film consisting of a deposited lower silicon dioxide film 51A, an applied middle silicon dioxide film 51B and a deposited upper silicon dioxide film 51C stacked in that order. The lower silicon dioxide film 51A and the upper silicon dioxide film 51C are formed by plasma CVD processes, respectively. The middle silicon dioxide film 51B is formed by applying silicon dioxide by a SOG (spin on glass) process in a film and baking the applied silicon dioxide film to form the layer insulating film 51 in a flat surface. The baked middle silicon oxide film 51B is etched to remove its portions other than those filling up recesses in the surface underlying the middle silicon dioxide film 51B. The middle silicon dioxide film 51B is etched so that junctions (contact holes 52) of the complementary data lines 50, i.e., the first wiring layer, and the shunt word lines 53, i.e., the second wiring layer, are not covered with the middle silicon dioxide film 51B. The middle silicon dioxide film 51B is formed so as to suppress the corrosion of the aluminum forming complementary data lines 50 and the shunt word lines 53 by the moisture contained in the middle silicon dioxide film 51B.

The shunt word line 53 is analogous in sectional structure with the complementary data line 50. The shunt word line 53 is a composite film consisting of a lower transition metal film 53A, an aluminum (or aluminum alloy) film 53B and an upper transition metal film 53C stacked in that order. The lower transition metal film 53A and the upper transition metal film 53C are formed of, for example, $MoSi_2$ deposited respectively by sputtering processes, which are carried out at lower temperatures. The principal purpose of the lower transition metal film 53A is to reduce the resistance at the junction of the shunt word line 53 and the complementary data line 50. The principal purpose of the upper transition metal film 53C is to suppress the formation of aluminum hillocks and to suppress reflection and diffraction effect. The shunt word line 53 has, as mentioned above, a thickness greater than that of the complementary data line 50 and a comparatively small resistance.

Figure 9:
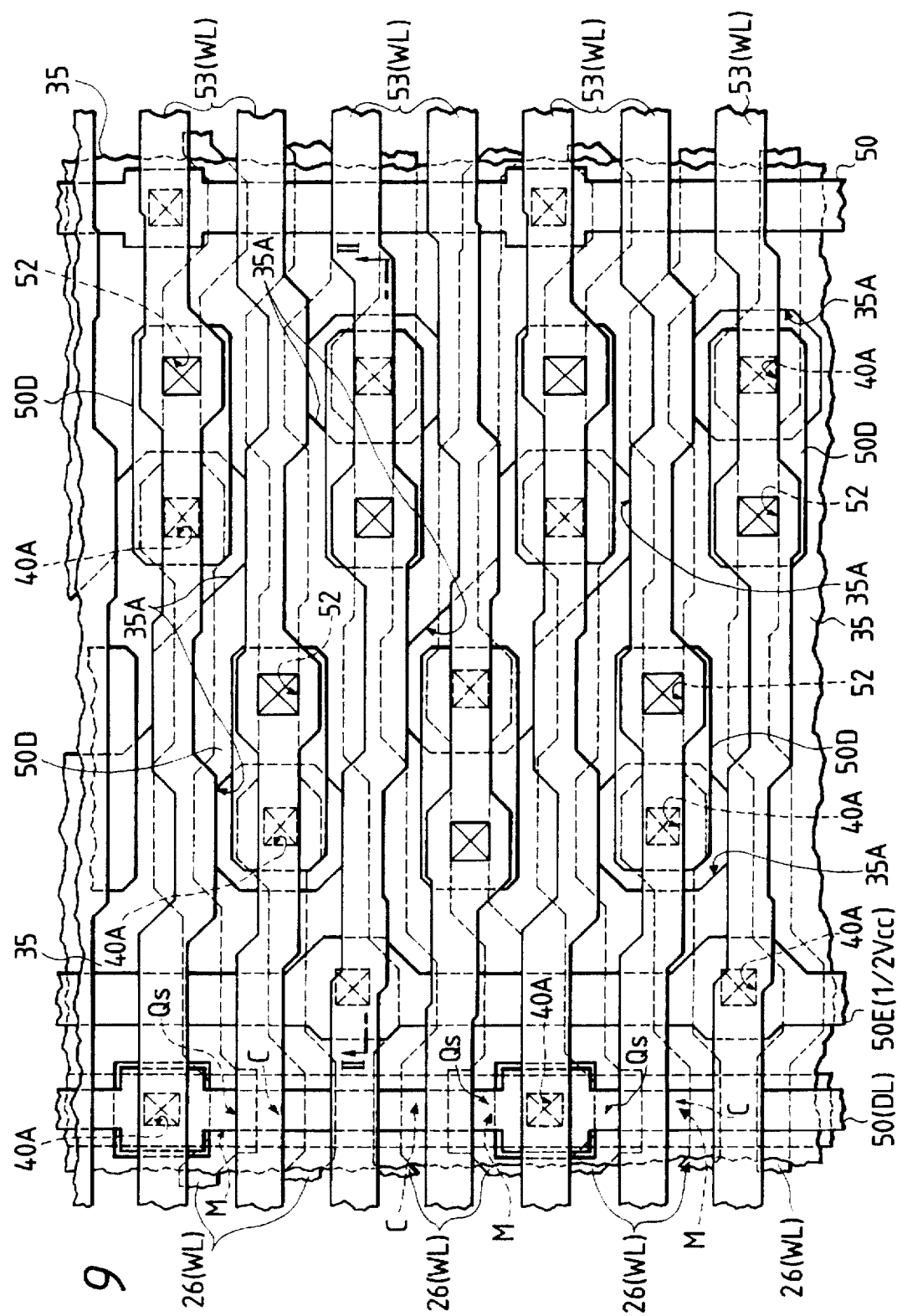
FIG. 9 is a plan view showing junctions of word lines and shunt word lines of the DRAM of FIG. 1.
Figure 10:
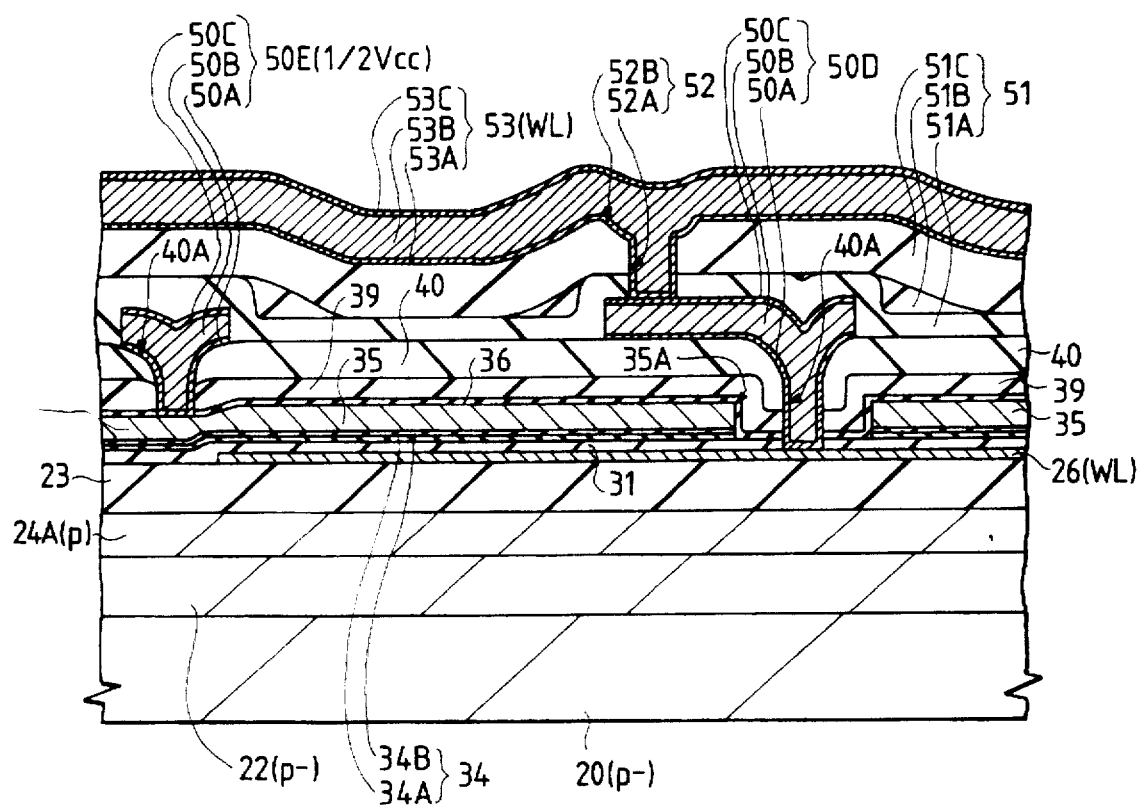
FIG. 10 is a sectional view taken on line II—II in FIG. 9.

As shown in FIGS. 9 and 10, the shunt word line 53 is connected to the word line 26 through an intermediate conductive layer 50D. The shunt word line 53 is connected through the contact hole 52 to the intermediate conductive layer 50D. The contact hole 52A has an upper section 52A having a substantially cylindrical shape formed by anisotropic etching and an upper section 52B having a flaring shape formed by isotropic etching. Thus, the contact hole 52 is formed so as to improve the step coverage of the shunt word line 53 and to reduce the possibility of breakage of the shunt word line 53. The intermediate conductive layer 50d is extended along the direction of extension of the shunt word line 53 and is connected to the word line 26 through a contact hole 40A formed at a position separate from the contact hole 52. The intermediate conductive layer 50d is formed simultaneously with the complementary data line 50 in the same conductive layer, namely, the first wiring layer. The intermediate conductive layer 50D is formed to lessen steps in the junction of the shunt word line 53 and the word line 26 and to prevent the breakage of the shunt word line 53.

The upper electrode 35 of the stacked data storage capacitors C is extended from the memory cell array 11B to a region in the vicinity of the contact hole 40A. The contact hole 40A through which the intermediate conductive layer 50D is connected to the word line 26 is disposed in a region including an opening 35A formed in the upper electrode 35. The upper electrode 35 is extended over the connecting regions in which the shunt word lines 53 and the word lines 26 are connected because the steps in the memory cell array 11B comprising memory cells M each consisting of the memory cell select MISFET $Q_s$ and the stacked data storage capacitor C stacked one over the other is greater than those of other regions; that is, the film for the upper electrode 35 is formed so as to flatten the surfaces of regions between the connecting regions underlying the first wiring layer for the complementary data lines 50, for example, the intermediate conductive layer 50D, and the surfaces underlying the second wiring layer, for example, the shunt word lines 53.

Thus, the DRAM 1 has the memory cell array 11 comprising the memory cells M disposed at the intersections of the complementary data lines 50 and the word lines 26, respectively, the shunt word lines 53 are extended over the word lines 26 and are connected to the word lines 26 in the regions other than the region occupied by the memory cell array 11 (actually, specific regions within the memory cell array 11), respectively, and the stepped connecting regions in which the word lines 26 and the shunt word lines 53 are connected, respectively, are surrounded by the upper electrode 35 serving as a leveling layer. Therefore, the steps between the peripheries of the connecting regions for connecting the word lines 26 and the shunt word lines 53 and the regions occupied by the memory cells M of the memory cell array 11 is lessened, so that the wiring lines including the shunt word lines 53 overlying those regions, and the contact holes 40A and 52 for interconnecting the wiring lines can satisfactorily be formed by photolithographic processes, the possibility of breakage or disconnection of the wiring lines at the steps is reduced, and the yield of perfect DRAMs is increased.

Since the leveling layer is a portion of the upper electrode 35 of the stacked data storage capacitor C, any special process for forming the leveling layer is not necessary.

Referring again to FIGS. 9 and 10, the upper electrode layer 35 is connected to a power supply line 50E, to which $V_{cc}/2$ is applied, in a region between the memory cell arrays 11B, and in connecting regions for connecting the shunt word lines 53 and the word lines 26.

Figure 11:
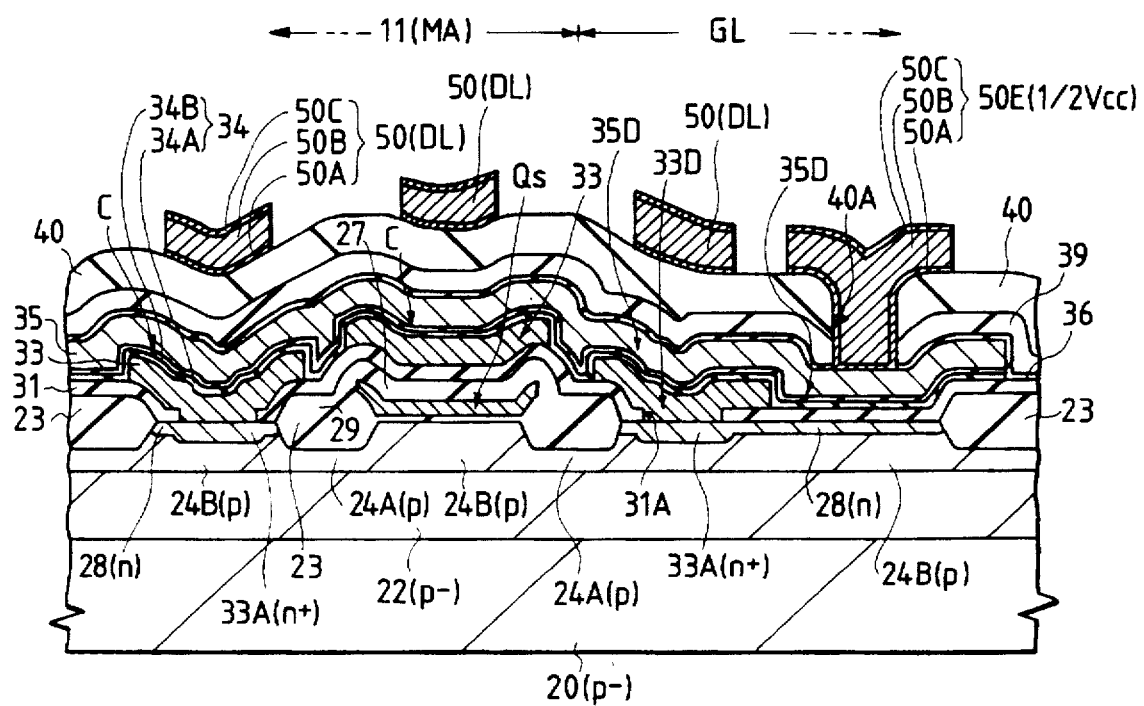
FIG. 11 is a sectional view taken on line III—III in FIG. 6.

Referring to FIGS. 6 and 11 (a cross section taken on line III—III in FIG. 6, in which the complementary data lines 50 and the layers overlying the same are omitted) the memory cell array 11B is surrounded by a guardring region GL. The guardring region GL is formed to arrest minority carriers emitted mainly from the substrate potential generating circuit ($V_{BB}$ generator circuit) 1603. The guardring region GL is formed between the memory cell array 11B and the peripheral circuits. The guardring region GL consists of the n-type semiconductor region 28 formed in the major surface of the p⁻-type well region 22, and the n⁺-type semiconductor region 33A in a region defined by the field insulating film 23 and the p-type channel stopper region 24A. The guardring region GL is formed by using the shape of the memory cells M in the substantially the same width as that of the gates of the memory cell select MISFETs $Q_s$ so that the repeating pattern of the memory cell arrangement is not put into disorder. The voltage $V_{cc}/2$ is applied through the power supply line 50 to the guardring region GL.

A first leveling layer (33D and 35D) of a two-layer structure, and a second leveling layer (35D) are formed in that order from the side of the memory cell array 11B toward the side of the guardring region GL between the memory cell array 11B and the guardring region GL. The lower leveling layer 33D of the first leveling layer (33D and 35D) and the lower electrode 33 of the stacked data storage capacitor C are formed in the same conductive layer. The second leveling layer (35D or 33D) and the upper electrode 35 of the stacked data storage capacitor C are formed in the same conductive layer. The leveling layers 33D and 35D are formed to reduce the size of the step between the memory cell array 11B and the guardring region GL.

Thus, the DRAM 1 having the memory cell arrays 11B each comprising a matrix of the memory cells M each consisting of a series circuit of the memory cell select MISFET $Q_s$ and the stacked data storage capacitor C, and the peripheral circuits arranged around the memory cell arrays 11B is provided with the leveling layers (33D and 35D) formed in the lower electrode 33 or upper electrode 35 of the stacked data storage capacitor C or both the lower electrode 33 and upper electrode 35 of the stacked data storage capacitor C. Therefore, the steps between the memory cell array 11B and the peripheral circuits are lessened by the leveling layers 33D and 35D, so that the wiring lines including the complementary data lines 50 and the shunt word lines 53 overlying those regions can be formed satisfactorily by photolithographic processes, the possibility of breakage of the wiring lines is reduced and hence the yield of perfect DRAMS is improved.

The first leveling layer (33D and 35D) formed in the same conductive layers as the lower electrode 33 and upper electrode 35 of the stacked data storage capacitor C, and the second leveling layer (33D or 35D) formed in the same conductive layer as the lower electrode 33 or the upper electrode 35 are formed in that order from the side of the memory array 11B toward the side of the peripheral circuits, so that the steps between the memory cell array 11B and the peripheral circuits are lessened gradually by the first leveling layer (33D and 35D) and the second leveling layer (33D or 35D), and hence the yield of perfect DRAMS is improved.

The guardring region GL is formed between the memory cell array 11B and the peripheral circuits, and the leveling layers 33D and 35D are formed in the guardring region GL so that all or part of the area occupied by the leveling layers 33D and 35d is included in the area occupied by the guardring region GL; consequently, the degree of integration of the DRAM is increased.

The entire surface of the DRAM 1 including the shunt word line 53 is covered with a passivation film 54 as shown in FIG. 1. The passivation film 54 is a composite film consisting of a silicon dioxide film 54A deposited by a CVD process (FIG. 15), a silicon nitride film 54B deposited by a plasma CVD process and a resin film 54C, such as a polyimide resin film, formed by application, which are stacked in that order. The principal purpose of the upper resin film 54C of the passivation film 54 is to suppress the penetration of alpha particles to the memory cell arrays 11B and part of the direct peripheral circuit. The resin film 54C improves the alpha particle soft error immunity of the DRAM 1. The region including the bonding pads BP to which bonding wires 4 are connected is not covered with the resin film 54C. The region including the bonding pads BP will be described afterward.

The CMOS device of the peripheral circuits of the DRAM 1 is shown in the right-hand portion of FIG. 1. The n-channel MISFET $Q_n$ of the CMOS device is formed in a region surrounded by the field insulating film 23 and the p-type channel stopper region 24A on the major surface of the p⁻-type well region 22. The n-channel MISFET $Q_n$ comprises, as principal components, a p⁻-type well region 22, a gate insulating film 25, a gate electrode 26, a pair of n-type semiconductor regions 28 (a source region and a drain region), and a pair of n⁺-type semiconductor regions 37.

The p⁻-type well region 22, the gate insulating film 25, the gate electrode 26 and the n-type semiconductor regions 28 and those of the memory cell select MISFET $Q_s$ are formed by the same processes and are substantially the same in function. The n-channel MISFET $Q_n$ is of a LDD structure.

The n⁺-type semiconductor regions 37 having a high impurity density forms source and drain regions having a low electrical resistivity. The n⁺-type semiconductor regions 37 self-align with the gate electrode 26 under regulation by the side wall spacer 29 self-aligning the side walls of the gate electrode 26.

The n⁺-type semiconductor region 37 as the source region is connected through a contact hole 40A to a line 50 to which the reference voltage $V_{ss}$ is applied. The n⁺-type semiconductor region 37 as the drain region is connected through a contact hole 40A to a line for carrying an output signal. The n⁺-type semiconductor regions 37 are connected electrically to the lines 50 through n⁺-type semiconductor regions 41 formed in regions corresponding to the contact holes 40A, respectively. The liens 50 are formed in the same conductive layer as that for the complementary data lines 50.

The p-channel MISFET $Q_p$ of the CMOS device is formed in a region surrounded by the field insulating film 23 on the major surface of the n$^-$-type well region 21. The p-channel MISFET $Q_p$ comprises, as principal components, an n$^-$-type well region 21, a gate insulating film 25, a gate electrode 26, a pair of p-type semiconductor regions 30 (a source region and a drain region), and a pair of p$^+$-type semiconductor regions 38.

The n$^-$-type well region 21, the gate insulating film 25 and the gate electrode 26 are substantially the same in function as those of the memory select MISFET $Q_s$ and the n-channel MISFET $Q_n$. The p-channel MISFET $Q_p$ is of a LDD structure.

The p-type semiconductor regions 30 have a low impurity density. The p$^+$-type semiconductor region 38 having a high impurity density as a source region is connected through a contact hole 40a to a line 50 to which the supply voltage Vcc is applied. The p$^+$-type semiconductor region 38 as a drain region is connected through a contact hole 40A to a line 50 for carrying an output signal formed integrally with the line 50 for carrying an output signal. The line 50 for carrying an output signal is connected through a contact hole 52 to an upper line 53, which is formed in the same conductive layer as the shunt word line 53.

Figure 12:
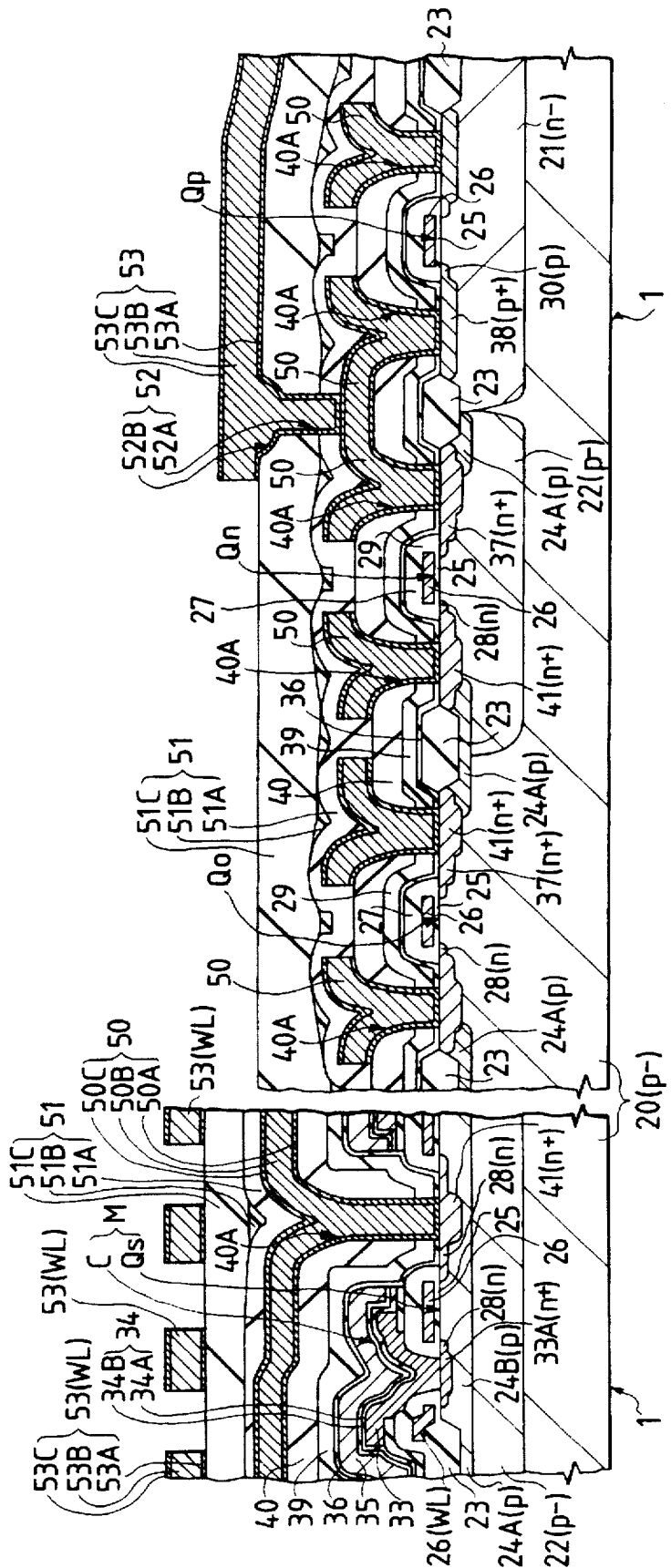
FIG. 12 is a sectional view of an essential portion of the DRAM of FIG. 1 including a region for the output circuit section.

In FIG. 12 showing the construction of the DRAM 1 including the output circuit, the memory cell M is shown in the left-hand portion. Basically, the memory cell M is provided in the p$^-$-type well region 22. A potential barrier is created between the p$^-$-type well region 22 and the p$^-$-type semiconductor substrate 20 having an impurity density lower than that of the p$^-$-type well region 22 to enhance the alpha particle soft error immunity. The memory cell select MISFET $Q_s$ of the memory cell M is formed on the major surface of a p-type semiconductor region 24B formed by the lateral diffusion of the impurity of a p-type channel stopper region 24A and having an impurity density higher than that of the p$^-$-type well region 22. The p-type semiconductor region 24A has, as mentioned above, a comparatively high impurity density due to the lateral diffusion of the impurity of the p-type channel stopper region 24A. When necessary, the impurity density may be increased further by expressly and selectively introducing a p-type impurity (an impurity for the adjustment of threshold voltage) into the regions for the memory cell arrays 11B by, for example, ion implantation. The p-type semiconductor region 24B sets the memory cell select MISFET $Q_s$ for a high threshold voltage. The threshold voltage of the memory cell select MISFET $Q_s$ of the DRAM 1 is as high as about 0.8 V or above when the gate length is 1.0 μm (effective channel length is in the range of 0.7 to 0.8 μm). The memory cell select MISFET $Q_s$ of the memory cell M is set for a high threshold voltage because noise generated in the power supply line $V_{ss}$ or $V_{cc}$ causes the potential of the shunt word line 53 to float at the intersection of the power supply line $V_{ss}$ or $V_{cc}$, and the unselected word line 26 or the shunt word line 53 ($V_{ss}$) entailing malfunction (erroneous conduction). The possibility of malfunction of the unselected memory cell M increases with increase in the degree of integration.

The CMOS device of the peripheral circuit is shown in the right-hand portion of FIG. 12. The n-channel MISFET $Q_n$ and p-channel MISFET $Q_p$ of the n-channel CMOS device are used in the direct peripheral circuit, such as the sense amplifier circuit 13, and the indirect peripheral circuit, such as the clock circuit. The n-channel MISFET $Q_n$ is provided in the p$^-$-type well region 22 having an impurity density higher than that of the p$^-$-type semiconductor substrate 20 to suppress short channel effect resulting from increase in the degree of integration. The n-channel MISFET $Q_n$, particularly, the n-channel MISFET $Q_n$ for a part of the direct peripheral circuit for which sufficient alpha particle immunity is required, is provided in the p$^-$-type well region 22. The n-channel MISFET $Q_n$ is the standard (reference) MISFET of the DRAM 1. The threshold voltage of the n-channel MISFET $Q_n$ is uniquely dependent on the density of the impurity for threshold voltage adjustment introduced into the p$^-$-type well region 22 and its major surface. The gate length of the n-channel MISFET $Q_n$ varies with objective circuits; the threshold voltage is in the range of about 0.3 to 0.8 V when the gate length is 1.0 μm (the effective channel length is in the range of 0.7 to 0.8 μm). Since performance at a high operating speed is essential to the n-channel MISFET $Q_n$, the threshold voltage is determined to secure a high transfer conductance.

An n-channel MISFET $Q_o$ of the output circuit is shown in the central portion of FIG. 12. Basically, the n-channel MISFET $Q_o$ has the same LDD structure as the n-channel MISFET $Q_n$ of the peripheral circuit. The n-channel MISFET $Q_o$ comprises the p$^-$-type semiconductor substrate 20, a gate insulating film 25, a gate electrode 26, a pair of n-type semiconductor regions 28 (a source region and a drain region), and a pair of n$^+$-type semiconductor regions 37. The p$^-$-type semiconductor substrate 20 has an impurity density lower than that of the p$^-$-type well region 22. The channel region of the n-channel MISFET $Q_o$ is formed in the p$^-$-type semiconductor substrate 20. The n-channel MISFET $Q_o$ constitutes, for example, a push-pull output circuit. The gate length of the n-channel MISFET $Q_o$ varies with objective circuits and required specifications. The threshold voltage is as low as about 0.3 V when the gate length is 1.0 μm (effective channel length is in the range of 0.7 to 0.8 μm). The n-channel MISFET $Q_o$ is constructed so as to reduce the substrate effect constant and to raise the output signal level. The low impurity density of the surface of the p$^-$-type semiconductor substrate 20 facilitates setting the n-channel MISFET $Q_o$ for a low threshold voltage. In fabricating a twin well type DRAM, it is general to form the p$^-$-type well regions 22 in all the regions for the n-channel MISFETs $Q_n$ and $Q_o$ to obviate increase in the number of processes, however, the DRAM 1 of the present invention uses the major surface of a portion of the p$^-$-type semiconductor substrate 20 because of the foregoing reason.

Thus, the DRAM 1 has the memory select MISFET $Q_s$ of the memory cell M, the n-channel MISFET $Q_n$ of the peripheral circuit, and the n-channel MISFET $Q_o$ of the output circuit. When all the MISFETs $Q_s$, $Q_n$ and $Q_o$ are of n-channel type and are the same in gate length (effective channel length), the respective threshold voltages of the memory cell select MISFET $Q_s$, the n-channel MISFET $1_n$ and the n-channel MISFET $Q_o$ are decreased in that order. Thus, the erroneous conduction of the memory cell select MISFET $Q_s$ of the unselected memory M due to noise generated in the power supply can be prevented to improve the electrical reliability of data write operation and data read operation. Furthermore, since the substrate effect constant of the n-channel MISFET $Q_o$ of the output circuit can be reduced, the output signal level is raised and external device driving ability is enhanced. Since the threshold voltage of the n-channel MISFET $Q_n$ of the peripheral circuit is lower than that of the memory cell select MISFET $Q_s$ of the memory cell M, transfer conductance is improved and the operating speed is increased.

Since the n-channel MISFET $Q_o$ of the output circuit is formed on the major surface of the p⁻-type semiconductor substrate 20, and the memory cell select MISFET $Q_s$ of the memory cell M and the n-channel MISFET $Q_n$ of the peripheral circuit are formed on the major surfaces of the p⁻-type well regions 22 having an impurity density higher than that of the p⁻-type semiconductor substrate 20, the n-channel MISFET $Q_o$ of the output circuit can simply be set for a comparatively low threshold voltage by adjusting the impurity density of the major surface of the p⁻-type semiconductor substrate 20. Since the difference in impurity density between the p⁻-type semiconductor substrate 20 and the p⁻-type well regions 22 enables the formation of potential barrier, the alpha particle soft error immunity of the memory cell select MISFET $Q_s$ of the memory cell M, and the n-channel MISFET $Q_n$ of the peripheral circuit can be improved, which in turn enables reduction in the area of the region occupied by the memory cells M and increase in the degree of integration.

Figure 13:
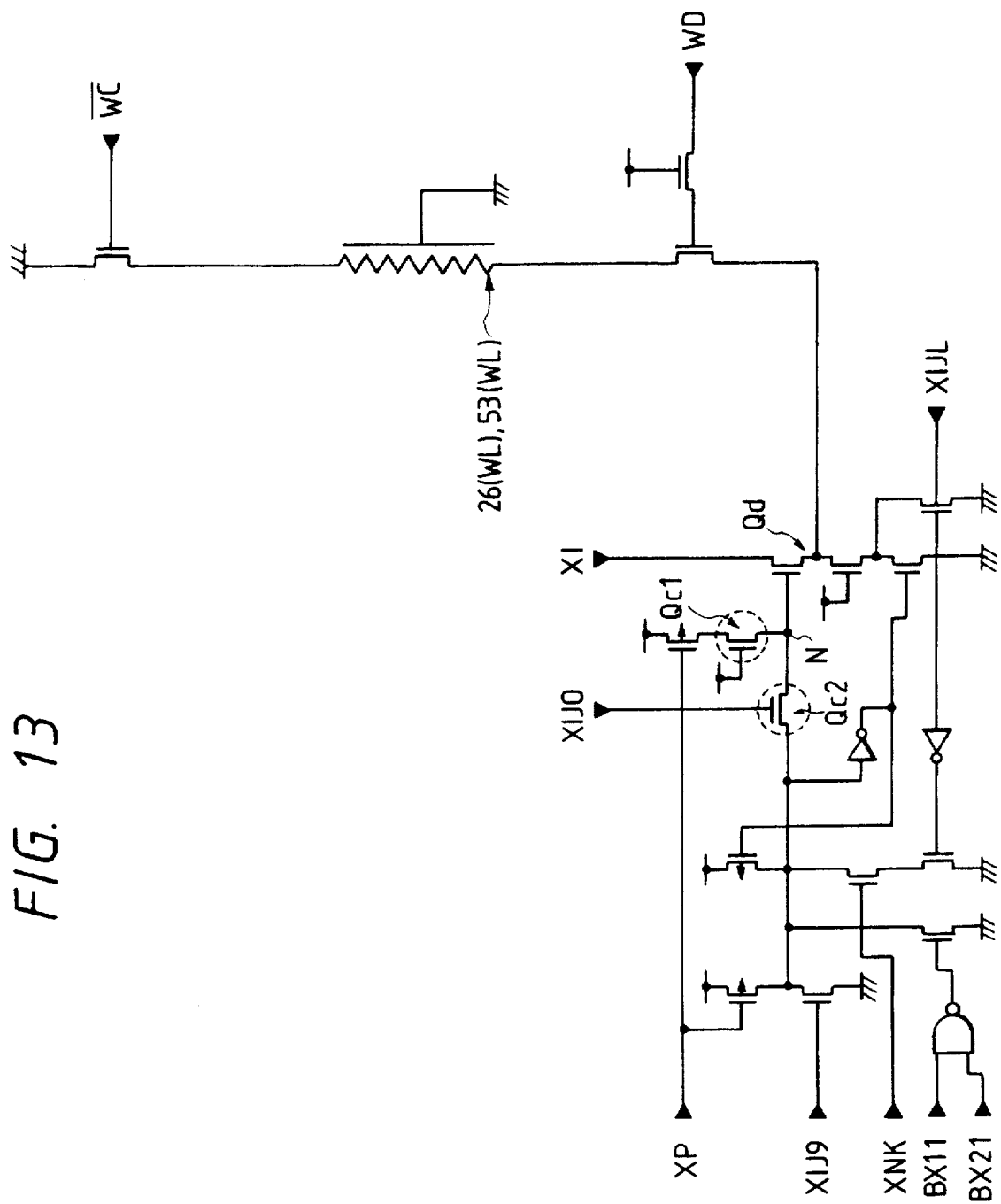
FIG. 13 is the equivalent circuit of an essential portion of the word boost circuit of the DRAM of FIG. 1.

FIG. 13 is a circuit diagram of a circuit equivalent to the input signal generator circuit of the word line driver circuit (WL) 15 (FIG. 3) of the DRAM 1. In FIG. 13, indicated at $\overline{WC}$ is a word clear signal, at WD is a word decode signal, at XI is a word boost potential, at XP is a self-boost node precharge signal, at XIJL is a word boost potential discharge signal, and at XIJ0, XIJ0, XIJ9, XNK, BX1I and BX2I are decode signals of the generator circuit. The generator circuit has n-channel MISFETs $Q_c1$ and $Q_c2$ in regions enclosed in dashed lines.

When the self-boost node precharge signal XP goes LOW, the node N of the generator circuit is precharged at (supply voltage $V_{cc}$)–(threshold voltage $V_{th}$). When the word boost potential XI increases beyond the supply voltage $V_{cc}$, the potential of the node N increases to a high potential (about 10 V or above) which is dependent on stray capacity due to the capacity between the gate and source or drain of an n-channel MISFET $Q_d$. The respective drain regions of the MISFETs $Q_c1$ and $Q_c2$ are connected to the node N.

Figure 14:
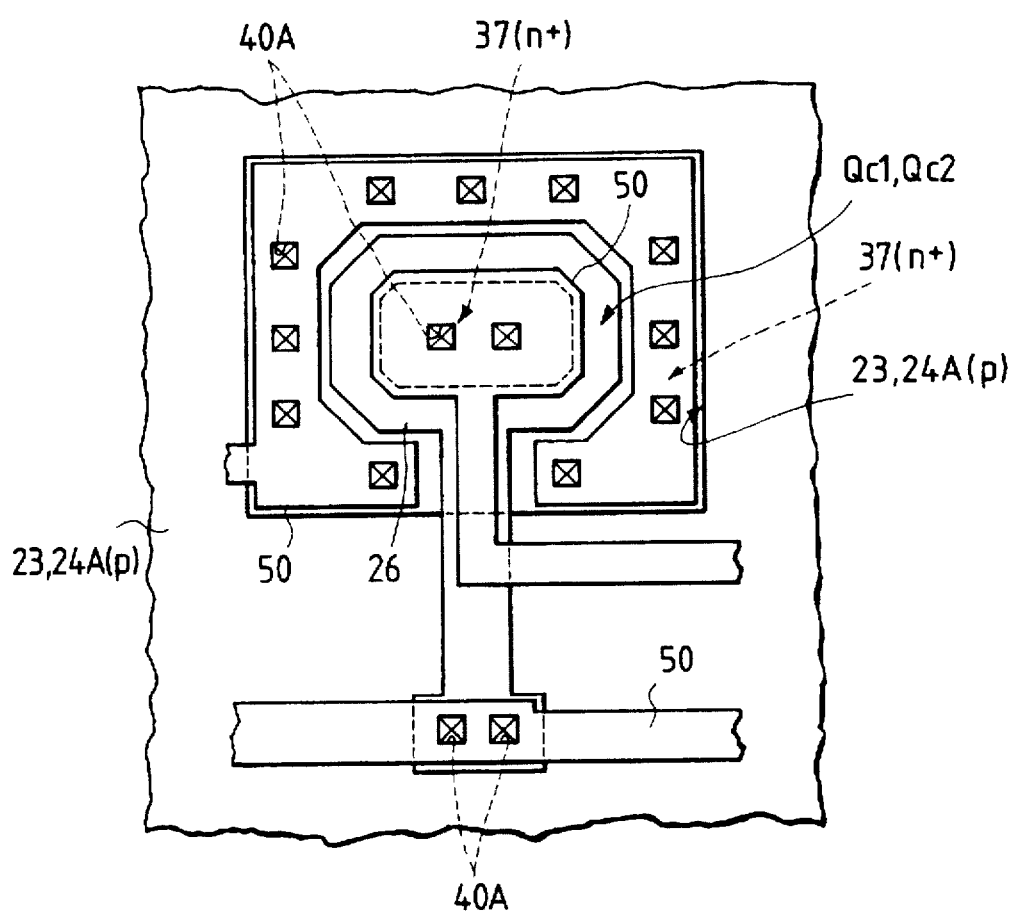
FIG. 14 is a plan view of of an essential portion of an element employed in the word boost circuit of FIG. 13.

FIG. 14 shows the construction of the MISFETs $Q_c1$ and $Qc^2$. Each of the MISFETs $Q_c1$ and $Q_c2$ is formed in a region surrounded by a field insulating film 23 and a p-type channel stopper region 24A on the major surface of a p⁻-type well region 22 and comprises the p⁻-type well region 22, a gate insulating film 25, a gate electrode 26, a pair of n-type semiconductor regions 28 (a source region and a drain region), and a pair of n⁺-type semiconductor regions 37.

The gate electrode 26 has the shape of a ring in the region surrounded by the field insulating film 23 and the p-type channel stopper region 24A. The gate electrode 26 has a T-shaped branch connected to a signal line 50 on the field insulating film 23. One of the pair of n⁺-type +semiconductor regions 37 serving as a drain region is formed in a region defined by the gate electrode 26 having the shape of a ring, and the other n⁺-type semiconductor region 37 serving as a source region is formed so as to surround the ring-shaped gate electrode 26 in a region surrounded by the p-type channel stopper region 24A; that is, one of the pair of n⁺-type semiconductor regions 37 is formed around the other n⁺-type semiconductor region 37 with a channel forming region therebetween and is isolated from the p-type channel stopper region 24A. A high voltage is applied to the former n⁺-type semiconductor region 37.

The n⁺-type semiconductor regions 37 are connected through contact holes 40A to signal lines 50. The signal line 50 connected to the high-voltage n⁺-type semiconductor region 37 is extended over the gate electrode 26 (or the source region). The ring-shaped gate electrode 26 has a stepped shape and forms a recess in the layer insulating film 40 underlying the signal lien 50 in a portion corresponding to the central portion of the ring-shaped gate electrode 26. In exposing a photoresist film to form an etching mask for processing the signal lines 50, the recess reduces the size of the etching mask by reflection from the surface of the signal lines 50 and diffraction effect. Therefore, the signal lines 50 (the etching mask for processing the signal lines 50) is processed in a region in which no diffraction effect is produced.

Thus, each of the MISFETs $Q_c$ surrounded by the p-type channel stopper region 24A of the DRAM 1 is formed by surrounding the high-voltage n⁺-type semiconductor region 37 by the low-voltage n⁺-type semiconductor region 37 with the channel forming region (p⁻-type well region 22) therebetween, disposing the gate electrode 26 on the gate insulating film 25 formed on the channel forming region, and surrounding the low-voltage n⁺-type semiconductor region 37 by the p-type channel stopper region 24A, and one of the n⁺-type semiconductor regions 37 is separated from the p-type channel stopper region 24A. Accordingly, the break-down voltage of the pn junction of one of high-voltage n⁺-type semiconductor regions 37 is increased and hence the breakdown voltage of the MISFETs $Q_c$ is increased.

The periphery of the signal line 50 connected to one of the n⁺-type semiconductor regions 37 of the MISFET $Q_c$ is located on the gate electrode 26 or extended over the other n⁺-type semiconductor region 37. Accordingly, a recess corresponding to the stepped shape of the gate electrode 26 is formed in the surface of the layer insulating film 40 formed between the former n⁺-type semiconductor region 37 and the overlying signal line 50. Since the reduction in size of the etching mask for processing the signal lines 50 due to reflection from the upper wiring layer for forming the lines 50 caused by the recess can be suppressed, the upper signal lines 50 can be processed accurately.

FIG. 15 shows a cross section of one of the bonding pads BP arranged in the peripheral area of the DRAM 1. As shown in FIG. 15, the bonding pad BP is formed in the second wiring layer for the lines 53. As mentioned above with reference to the shunt word line 53, the line 53 consists of a lower transition metal film 53A, an aluminum film 53B and an upper transition metal film 53C stacked in that order in a three-layer structure. The bonding pad BP consists of the lower transition metal film 53A and the aluminum film 53B stacked in that order in a two-layer structure. In bonding a bonding wire 4 to the bonding pad BP, a bonding device is located by identifying the bonding pad BP from the difference in reflectance between the surface f the bonding pad BP and the surface of the passivation film 54. Since the difference in reflectance between the upper transition metal film 53C and the passivation film 54 is small, and hence the portion of the upper transition metal film 53C corresponding to the bonding pad BP is removed to expose the surface of the aluminum film 53B having a reflectance higher than the upper transition metal film 53C.

The portion of the upper transition metal film 53C corresponding to the bonding pad BP is removed to expose the surface of the aluminum film 53B in the process of forming a bonding opening 55 in the silicon dioxide film 54A and silicon nitride film 54B of the passivation film 54 overlying the wiring layer by using the same mask. A bonding opening 56 greater than the bonding opening 55 is formed in the upper resin film 54C of the passivation film 54.

Thus, the DRAM 1 has the internal wiring lines 53 and the bonding pads BP formed in the same conductive layer, the internal wiring lines are a three-layer composite film formed by stacking the lower transition metal film 53A, the aluminum (or aluminum alloy) film 53B and the upper transition metal film 53C in that order, and the bonding pads BP are a two-layer composite film formed by stacking the lower transition metal film 53A and the aluminum (or aluminum alloy) film 53B in that order. The difference in reflectance between the exposed surface of the aluminum (or aluminum alloy) film 53B of the bonding pads BP and the surface of the passivation film 54 ensures the recognition of the bonding pads BP, so that the possibility of faulty bonding is reduced and the yield of the DRAM assembling process is increased.

Since a portion of the upper transition metal film 53C formed over the aluminum film 53B corresponding to the bonding pad BP is removed in removing the corresponding portion of the passivation film 54 to form the bonding opening 55 in the passivation film 54 by using the same etching mask and by the same etching process without requiring any additional step particularly for removing the portion of the upper transition metal film 53C.

Concrete processes of fabricating the DRAM 1 will be described hereinafter with reference to FIGS. 16 to 33.

Well Forming Process

A silicon dioxide film 60 and a silicon nitride film 61 are stacked in that order over the major surface of a p⁻-type semiconductor substrate 20 of single crystal silicon. The silicon dioxide film 60 is formed in a thickness in the range of 30 to 50 μm by a high-temperature steam oxidation method at a temperature in the range of about 900° to 1000° C. The silicon dioxide film 60 serves as a buffer layer. The silicon nitride film 61 is formed in a thickness in the range of 30 to 60 nm by, for example, a CVD process using a doping mask and an antioxidation mask.

Portions of the silicon nitride film 61 corresponding to regions for n⁻-type well regions 21 are removed by a photolithographic etching process to form a mask.

Then, as shown in FIG. 16, an n-type impurity 21n, such as P (phosphorus), is introduced into the major surface of the p⁻-type semiconductor substrate 20 through the silicon dioxide film 60 by, for example, an ion implantation process of an energy level in the range of 120 to 150 KeV by using the remaining portion of the silicon nitride film 61 as a mask in an impurity density on the order of $10^{13}$ atoms/cm₂.

Subsequently, exposed portions of the silicon dioxide film 60 are caused to grow by using the same mask to form a silicon dioxide film 60A of a thickness greater than that of the silicon dioxide film 60 only in regions for the n⁻-type well regions 21 as shown in FIG. 17. The silicon dioxide film 60A serves as a mask for removing the silicon nitride film 61 and for doping. The silicon dioxide film 60A is formed by a high-temperature steam oxidation process at a temperature in the range of about 900° to 1000° C. in a thickness in the range of 110 to 150 nm. During the formation of the silicon dioxide film 60A, the n-type impurity 21n introduced into the major surface of the p⁻-type semiconductor substrate 20 is caused to diffuse to some extent to form n⁻-type semiconductor regions 21A, which finally form the n⁻-type well regions 21.

Then, portions of the silicon nitride film 61 are removed selectively by, for example, hot phosphoric acid, and then a doping mask (a photoresist mask) is formed over regions for forming the n-channel MISFETs $Q_o$ of the output circuit of the DRAM 1.

Then, as shown in FIG. 18, a p-type impurity 22p, such as BF₂ or B, is introduced into the major surface of the p⁻-type semiconductor substrate 20 through the silicon dioxide film 60 by using the silicon dioxide film 60A and the doping mask, not shown in an impurity density in the range of $10^{12}$ to $10^{13}$ atoms/cm² by an ion implantation process of an energy level in the range of 50 to 70 KeV. Since the silicon dioxide film 60A is comparatively thick, the areas for the n⁻-type well regions 21 are not doped with the p-type impurity 22p.

Then, the semiconductor substrate 20 is subjected to a high-temperature heat treatment at a temperature in the range of 1100° to 1300° C. to cause the n-type impurity 21n and the p-type impurity 22p to diffuse to form the n⁻-type well regions 21 and the p⁻-type well regions 22 as shown in FIG. 19. As the result, the p⁻-type well regions 22 self-aligns with the n⁻-type well regions 21. Subsequently, the doping mask covering the region for the output circuit is removed.

Isolating Region Forming Process

A silicon nitride film 62 is formed over the entire surface of the semiconductor substrate 20 including regions covered with the silicon dioxide films 60 and 60A in a thickness in the range of 100 to 150 nm by, for example, a CVD process. The silicon nitride film 62 is used as a doping mask and an antioxidation mask.

Figure 20:
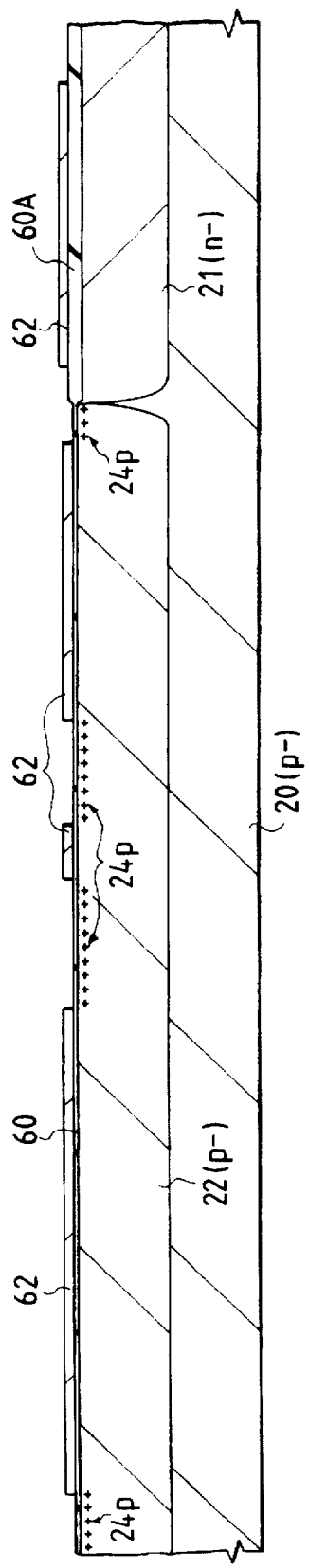

Then, portions of the silicon nitride film 62 corresponding to areas between regions for MISFETs, i.e., areas for a field insulating film, are removed by a photolithographic etching process to form a mask by the remaining portion of the silicon nitride film 62. Then, a p-type impurity 24p, such as BF₂, is introduced through the silicon dioxide film 60 into the uncovered major surface of the p⁻-type well regions 22 in an impurity density on the order of $10^{13}$ atoms/cm² by, for example, an ion implantation process of an energy level in the range of 50 to 70 KeV by using the mask, i.e., the remaining portion of the silicon nitride film 62 as shown in FIG. 20. The comparatively thick silicon dioxide film 60A prevents the penetration of the p-type impurity 24p to the major surface of the n⁻-type well regions 21; that is, the p-type impurity is introduced selectively in the major surface of the p⁻-type well regions 22. An etching mask (a photoresist mask) formed by processing the mask formed of the silicon nitride film 62 may be used additionally in introducing the p-type impurity 24p into the p⁻-type well regions 22.

Then, exposed portions of the silicon dioxide films 60 and 60A uncovered with the mask formed of the silicon nitride film 62 are grown to form a field insulating film 23. The field insulating film 23 is formed by a heat treatment in a nitrogen gas atmosphere at a temperature on the order of 1000° C. for about 100 to 140 minutes and a subsequent steam oxidation process for oxidation for about 140 to 170 minutes. The field insulating film 23 may be formed only by the steam oxidation process. The thickness of the filed insulating film 23 is, for example, in the range of 600 to 800 nm.

Figure 21:
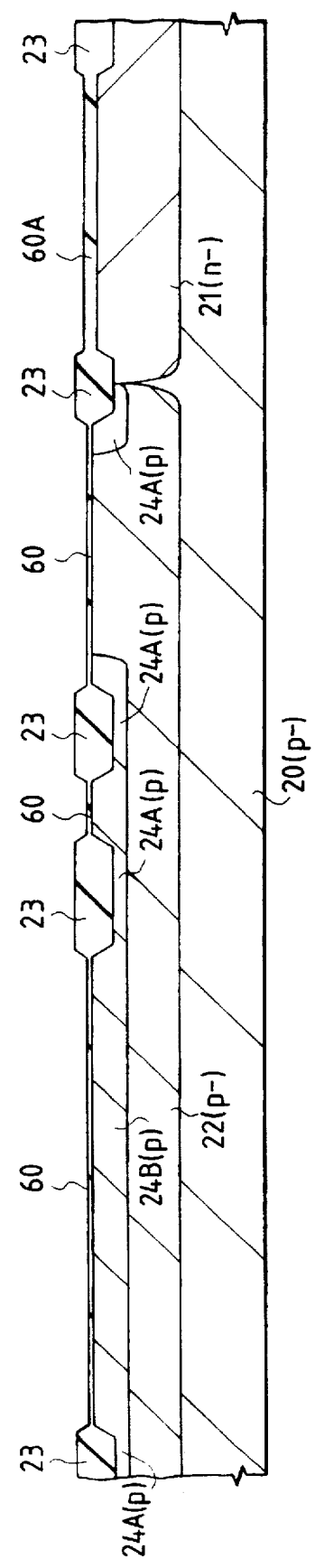

The p-type impurity 24p introduced into the major surface of the p⁻-type well regions 22 is diffused by substantially the same process as that employed in forming the field insulating film 23 to form p-type channel stopper regions 24A. Since the p-type channel stopper regions 24A are formed by a comparatively long heat treatment, the p-type impurity 24p diffuses laterally to a large extent and, consequently, the p-type impurity is diffused in substantially all the regions for forming the memory cells M of the memory cell arrays 11B to form p-type semiconductor regions 24B. The degree of lateral diffusion of the p-type impurity is comparatively small in regions for the n-channel MISFETs $Q_n$ and $Q_o$ and the p-type impurity diffuses only in the vicinity of the field insulating film 23 because the size including the gate width of the n-channel MISFETs $Q_n$ and $Q_o$ is comparatively large as compared with that of the memory cells M; that is, substantially no p-type semiconductor region 24B is formed in the regions for the n-channel MISFETs $Q_n$ and $Q_o$ of the peripheral circuit. Accordingly, the p-type semiconductor regions 24B are not formed in the regions for the n-channel MISFETs $Q_n$ and $Q_o$ and are formed selectively in the regions for the memory cell arrays 11B. The p-type semiconductor regions 24B and the p-type channel stopper regions 24a are formed by the same process. The impurity density of the p-type channel stopper regions 24a and the p-type semiconductor regions 24B is in the range of $10^{16}$ to $10^{17}$ atoms/cm². Subsequently, the mask formed of the silicon nitride film 62 is removed as shown in FIG. 21.

Then, the silicon dioxide film 60 covering the major surface f the p⁻-type well regions 22, and the silicon dioxide film 60A covering the major surface of the n⁻-type well regions 21 are removed to expose the major surfaces of the p⁻-type well regions 22 and the n⁻-type well regions 21.

Gate Insulating Film forming Process

A silicon dioxide film 63 of a thickness in the range of 40 to 100 nm is formed over the exposed major surfaces of the p⁻-type well regions 22 and the n⁻-type well regions 21 by a high-temperature steam oxidation process at a high temperature, for example, in the range of 900° to 1000° C. The silicon dioxide film 63 is formed to oxidize silicon nitride, i.e., so-called white ribbons, formed in the edge of the field insulating film 23 by the mask formed of the silicon nitride film 62 in forming the field insulating film 23.

Then, a p-type impurity 64p, such as B, for adjusting threshold voltage is introduced into regions demarcated by the field insulating film 23, namely, the entire major surface of the p⁻-type semiconductor substrate 20 including the p⁻-type well regions 22, the p-type semiconductor regions 24B and the n⁻-type well regions 21, in an impurity density, for example, in the rage of $5 \times 10^{11}$ to $9 \times 10^{11}$ atoms/cm² by an ion implantation process of an energy level in the range of 20 to 40 KeV. The principal purpose of the p-type impurity 64p is the adjustment of the respective threshold voltages of the n-channel MISFETs $Q_s$, $Q_n$ and $Q_o$.

Subsequently, a p-type impurity, such as B, for adjusting threshold voltage is introduced into the major surface of the n⁻-type well regions 21 demarcated by the field insulating film 23 in an impurity density, for example, on the order of $10^{12}$ atoms/cm² by an ion implantation process of an energy level in the range of 20 to 40 KeV. The principal purpose of the p-type impurity is the adjustment of the threshold voltage of the p-channel MISFET $Q_p$.

Then, as shown in FIG. 22, a p-type impurity 660, such as B, for adjusting threshold voltage, is introduced into the major surface of the p⁻-type well regions 22 for the memory cell arrays 11B demarcated by the filed insulating film 23 in an impurity density, for example, on the order of $10^{11}$ atoms/cm² by an ion implantation process of an energy level in the range of 20 to 40 KeV. The principal purpose of the p-type impurity 66p is the adjustment of the threshold voltage of the memory cell select MISFETs $Q_s$ of the memory cells M. Doping with the p-type impurity 66p may be omitted when the impurity density of the p-type semiconductor regions 24B is changed or the impurity density of the regions doped with the p-type impurity 66p is nearly the same as that of the regions doped with the p-type impurity 65p. The sequence of the doping processes respectively using the p-type impurities 64p, 65p and 66p may be changed. Some of the doping processes respectively using the impurities 64p, 65p and 66p may be omitted when the respective impurity densities of the p⁻-type semiconductor substrate 20, the p⁻-type well regions 22 and the n⁻-type well regions 21 permit.

Then, portions of the silicon dioxide film 63 are removed selectively to expose the major surfaces of the p⁻-type well regions 22 and the n⁻-type well regions 21 including portions, not shown, of the p⁻-type semiconductor substrate 20.

Subsequently, a gate insulating film 25 is formed over the respective exposed major surfaces of the p⁻-type well regions 22 and the n⁻-type well regions 21 in a thickness in the range of 15 to 25 nm by a high-temperature steam oxidation process at a temperature in the range of 800° to 1000° C.

Gate Wiring Forming Process

A polycrystalline silicon film is formed in a thickness in the range of 150 to 300 nm over the entire surface of the semiconductor substrate 20 including the gate insulating film 25 and the field insulating film 23 by a CVD process. An n-type impurity for reducing the electrical resistivity, such as P, is introduced into the polycrystallien film by a thermal diffusion process.

Then, a layer insulating film 27 is formed over the entire surface of the polycrystalline silicon film. The layer insulating film 27 consists of a lower silicon dioxide film 27A formed over the surface of the polycrystalline silicon film, and an upper silicon dioxide film 27B stacked on the lower silicon dioxide film 27A. The lower silicon dioxide film 27a is formed in a thickness in the range of 20 to 50 nm by thermal oxidation in an oxygen gas atmosphere at at temperature in the range of 800° to 1000° C. The upper silicon dioxide film 27B is formed in a thickness, for example, in the range of 250 to 400 nm by a CVD process using inorganic silane gas, such as $SiH_4$ gas or $SiH_2Cl_2$ gas, and nitrogen oxide ($N_2O$) gas as source gases. The formation of the lower silicon dioxide film 27A over the surface of the polycrystalline silicon film prior to the formation of the upper silicon dioxide film 27B decomposes foreign matters and contaminants adhering to the surface of the polycrystalline silicon film by oxidation. The lower silicon dioxide film 27A formed by thermal oxidation prevents the outward diffusion of the impurity contained in the polycrystalline silicon film in forming the insulating film. Thus, the lower silicon dioxide film 27A prevents the formation of foreign matters by the interaction of the source gases and the impurity over the surface of the polycrystalline silicon film in forming the insulating film over the polycrystalline silicon film. Thus, the polycrystalline silicon film can satisfactorily be etched thereby increasing the yield of perfect DRAMs.

Then, as shown in FIG. 23, the layer insulating film 27 and the polycrystalline silicon film are etched sequentially by an anisotropic etching process using an etching mask formed of, for example, a photoresist to form gate electrodes 26 and word lines (WL). The respective top surfaces of the gate electrodes 26 and the word lines 26 are coated with the layer insulating film 27. The use of a chopping etching method enhances the anisotropic etching effect of etching action and suppresses overetching.

Lightly Doped Semiconductor Region Forming Process

A silicon dioxide film is formed over the entire surface of the semiconductor substrate 20 to suppress contamination attributable to doping. The silicon dioxide film is formed over major surface of the p⁻-type well regions 22 exposed by etching and the n⁻-type well regions 21, and the side surfaces of the gate electrodes 26 and the word lines 26. The silicon oxide film is formed in a thickness in the range of 10 to 80 nm at a high temperature in the range of, for example, 850° to 950° C. in an oxygen gas atmosphere.

Then, the major surfaces of the p⁻-type well regions 22 and the p⁻-type semiconductor substrate 20 in the regions for the memory cell arrays 11B, and the n-channel MISFETs $Q_n$ and $Q_o$ are doped with an n-type impurity, such as P or As, by using the field insulating film 23 and the layer insulating film 27 overlying the gate electrodes 26 by an ion implantation process of an energy level in the range of 80 to 120 KeV to form n-type semiconductor regions 28 having a low impurity density on the order of $10^{13}$ atoms/cm² and self-aligning with the gate electrodes 26 or the word lines 26. As mentioned above, at least the n-type semiconductor regions 28 to be connected to parts of the memory cell select MISFETs $Q_s$ of the memory cells M on the side of the stacked data storage capacitors C are formed by an ion implantation process in a low impurity density less than $10^{14}$ atoms/cm². Since the n-type semiconductor regions 28 have a low impurity density, the memory cell select MISFETs $Q_s$ and the n-channel MISFETs $Q_n$ and $Q_o$ can be formed in a LDD structure. During the formation of the n-type semiconductor regions 28, the regions for the p-channel MISFETs $Q_p$ are covered with a doping mask (a photoresist film). The memory cell select MISFETs $Q_s$ of the memory cells M are nearly completed by the process of forming the n-type semiconductor regions 28.

Then, the major surface of the n⁻-type well regions 21 in regions for the p-channel MISFETs $Q_p$ are doped with a p-type impurity, such as BF₂ or B, in an impurity density, for example, on the order of $10^{13}$ atoms/cm² by an ion implantation process of an energy level in the range of 60 to 100 KeV by using the field insulating film 23 and the layer insulating film 27 overlying the gate electrodes 26. In this doping process, the regions for the memory cell arrays 11B and the n-channel MISFETs $Q_n$ and $Q_o$ are covered with the doping mask (a photoresist film).

Then, at least regions for the drain regions of the n-channel MISFETs $Q_n$ in a region for an electrostatic breakdown preventing circuit, not shown, added to the input circuit (or the output circuit) of the DRAM 1 are doped with an n-type impurity in a low impurity density. The additional introduction of the n-type impurity into the drain regions of the n-channel MISFETs $Q_n$ enables an excessively high voltage, which causes electrostatic breakdown, applied to the drain region to pass easily to the p⁻-type well region 22, so that the electrostatic breakdown withstand voltage of the n-channel MISFETs $Q_n$ is enhanced.

Spacer Forming Process and Contact Hole forming Process 1

Then, as shown in FIG. 25, side wall spacers 29 are formed over the side surfaces of the gate electrodes 26, the word lines 26 and lands of the layer insulating film 27, respectively. The side wall spacers 29 are formed by depositing a silicon dioxide film and etching the silicon dioxide film by a depth corresponding to the thickness of the silicon dioxide film by anisotropic etching, such as RIE. The respective film qualities of the silicon dioxide film forming the side wall spacers 29 and the top silicon dioxide film 27B of the layer insulating film 27 are the same. The silicon dioxide film forming the side wall spacers 29 is formed in a thickness, for example, in the range of 200 to 400 nm by a CVD process using inorganic silane gas and nitrogen oxide gas as source gases. The length of the side wall spacers 29 along the gate length (channel length) is in the range of about 200 to 400 nm. The side wall spacers 29 may be formed only in a limited region if circumstances require.

Then, a layer insulating film 31 is formed over the entire surface of the semiconductor substrate 20 including the surfaces of the layer insulating film 27 and the side wall spacers 29. The layer insulating film 31 is used as an etching stopper layer in processing the electrode layers of the stacked data storage capacitors C. The layer insulating film 31 are formed for the electrical isolation of the lower electrodes 33 of the stacked data storage capacitors C from the gate electrodes 26 of the memory cell select MISFETs $Q_s$ and the word lines 26. The layer insulating film 31 is formed in a thickness including a loss in thickness caused by overetching in etching an upper conductive layer overlying the layer insulating film 31 and a loss in thickness in a washing process. The layer insulating film 31 is a silicon dioxide film deposited by a CVD process using inorganic silane gas and nitrogen oxide gas as source gases. The layer insulating film 31 reduces stress induced by the difference in thermal expansion coefficient between the adjacent films in a dielectric film 34 for the stacked data storage capacitors C, and the layer insulating film 27 underlying the layer insulating film 31. The layer insulating film 31 has a thickness, for example, in the range of 100 to 200 nm.

Then, as shown in FIG. 26, portions of the layer insulating film 31 over the other n-type semiconductor regions 28 connected to the lower electrodes 33 of the stacked data storage capacitors C of the memory cell select MISFETs $Q_s$ in the regions for the memory cells M are removed to form contact holes 31A and 32.

Gate Wiring Forming Process 2

Then, as shown in FIG. 27, the lower electrodes 33 of the stacked data storage capacitors C of the memory cells M are formed. Portions of the lower electrode layers 33 are connected through the contact holes 31a and 32 to the n-type semiconductor regions 28, and other portions of the same extend over the layer insulating films 27 and 31, respectively. Each lower electrode 33 is greater than the opening of the contact hole 31A formed in the layer insulating film 31 at least by a size corresponding to an allowance for aligning a mask.

The lower electrodes 33 are formed by the photolithographic etching of a polycrystalline silicon film of a thickness in the range of 200 to 400 nm deposited by a CVD process simultaneously with the second gate wiring and doped by a thermal diffusion process with an n-type impurity, such as P, for reducing the electrical resistivity of the polycrystalline silicon film. The photolithographic etching process includes a step of forming an etching mask (photoresist film) and a step of removing the etching mask. The etching mask is removed by a downstream plasma processing using freon gas (CHF₃) and oxygen gas (O₂). This downstream plasma processing reduces damages in the components of the DRAM 1. However, it was found that the freon gas etches selectively the n-type impurity (P) precipitated over the polycrystalline silicon film during the plasma processing for removing the etching mask. The selective etching of the precipitated n-type impurity entails disadvantages as the formation of minute pores in the surface of the lower electrodes 33 and reduction in the dielectric strength of the dielectric film 34. To eliminate such disadvantages, the present invention oxidizes the surface of the polycrystalline silicon film doped with the n-type impurity to form a thin silicon dioxide film having a thickness of several nanometers prior to the removal of the etching mask, and then the silicon dioxide film is removed together with the precipitated n-type impurity. This supplementary oxidizing process may be applied also to the processes respectively for forming the gate lines 26 (the first layer) and the upper electrodes 35 (the third layer).

The polycrystalline film is etched by an anisotropic etching. The anisotropic etching effect of the etching action can be enhanced, overetching depth can be reduced and the residual polycrystalline silicon film can surely be removed when chopping etching is employed in combination with anisotropic etching.

Thus, the removal of the n-type impurity precipitated over the surface of the polycrystalline silicon film prior to the removal of the etching mask prevents the formation of minute pores in the surface of the polycrystalline silicon film and hence the dielectric strength of the dielectric film 34 of the stacked data storage capacitors C of the DRAM 1 is improved.

The n-type impurity introduced into the film for the lower electrodes 33 diffuses into the major surface of the other n-type semiconductor regions 28 of the memory cell select MISFETs $Q_s$ in a region defined by the contact holes 32, and $n^+$-type semiconductor regions 33A are formed integrally with the n-type semiconductor regions 28, respectively. The $n^+$-type semiconductor region 33A improves the ohmic characteristics (reduces the contact resistance) of the interface between the other n-type semiconductor region 28 of the memory cell select MISFET $Q_s$ and the lower electrode 33.

Dielectric Film Forming Process

Figure 28:
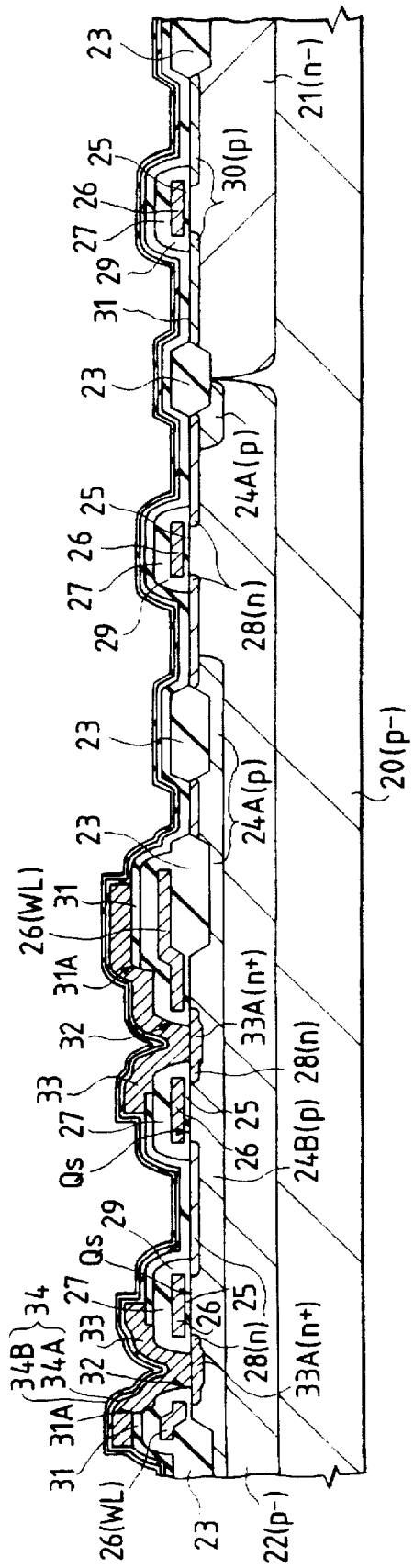

As shown in FIG. 28, a dielectric film 34 is formed over the entire surface of the semiconductor substrate 20 including the surfaces of the lower electrodes 33 of the stacked data storage capacitors C of the memory cells M. Basically, the dielectric film 34 is of a two-layer structure consisting of a silicon nitride film 34A and a silicon dioxide film 34B stacked in that order. The lower silicon nitride film 34A is deposited in a thickness in the range of 5 to 10 nm by a CVD process. In forming the silicon nitride film 34A, the involvement of oxygen is suppressed to the least possible extent. Since a very small amount of oxygen is involved in the silicon nitride film 34A when the silicon nitride film 34A is formed over the lower electrodes 33 (polycrystalline silicon film) under process control on an ordinary level, a silicon dioxide film, not shown, is formed naturally between the lower electrodes 33 and the silicon nitride film 34A.

The upper silicon dioxide film 34B of the dielectric film 34 is formed in a thickness in the range of 1 to 6 nm by subjecting the silicon nitride film 34A to a high-pressure oxidation process. Thus, the formation of the silicon dioxide film 34B decreases the thickness of the silicon nitride film 34A slightly, and hence the final thickness of the silicon nitride film 34A is in the range of 4 to 8 nm. Basically, the silicon dioxide film 34B is formed in a high-pressure oxygen atmosphere of a temperature in the range of 800° to 1000° C. and a pressure in the range of 1.5 to 10 atm. In this embodiment, the silicon dioxide film 34B is formed under a high temperature in the range of 3 to 4 atm by supplying oxygen gas (a source gas) at a flow rate in the range of 4 to 6 l/min and hydrogen gas (source gas) at a flow rate in the range of 3 to 10 l/min. The film deposition rate of the high-pressure oxidation process employed in forming the silicon dioxide film 34B is higher than that of the normal-pressure oxidation process (1 atm). Since the high-temperature oxidation process requires a comparatively short time for high-temperature processing, the depth of pn junction between the source and drain regions of the memory select MISFET $Q_s$ and the like may be small.

Thus, the dielectric film 34 has a three-layer structure consisting of the natural silicon dioxide film, the silicon nitride film 34A and the silicon dioxide film, which are 34B stacked in that order. The natural silicon dioxide film can be formed in a small thickness when oxygen involvement is suppressed. The natural silicon dioxide film may be nitrided to form the dielectric film 34 in a two-layer structure, which, however, requires an additional process.

Gate Wiring Forming Process 3

A polycrystalline silicon film is deposited over the entire surface of the semiconductor substrate 20 including the surface of the dielectric film 34 in a thickness in the range of 150 to 250 nm by a CVD process. This film forming process is the third gate line forming process. Then, the polycrystalline silicon film is doped with an n-type impurity, such as P, by thermal diffusion to reduce its electrical resistivity.

Figure 29:
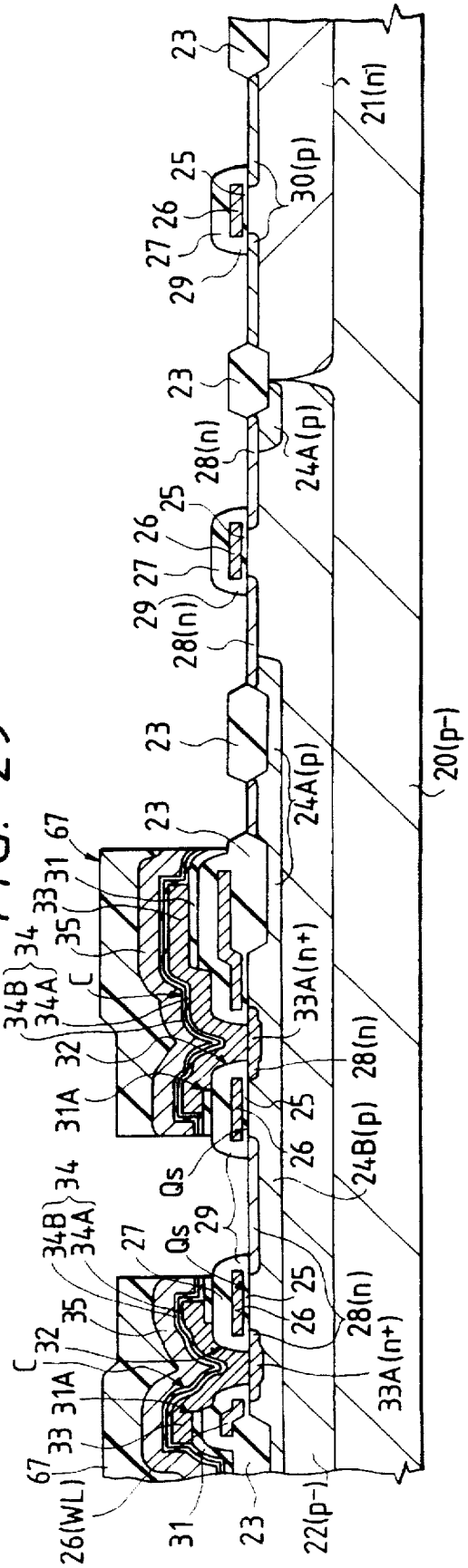

Then, an etching mask 67, such as a photoresist film, is formed over the polycrystalline silicon film by a photolithographic process to cover the entire regions for the memory cell arrays 11B excluding a region in which one of the n-type semiconductor regions 28 of each memory cell select MISFET $Q_s$ and the complementary data line are connected. Then, the polycrystalline silicon film and the dielectric film 34 are etched sequentially by using the etching mask 67 to form the upper electrodes 35 by the polycrystalline silicon film as shown in FIG. 29. The polycrystalline silicon film is etched by, for example, a plasma step etching process. The formation of the upper electrodes 35 is substantially the final process of forming the stacked data storage capacitors C. Thus, the memory cells M of the DRAM 1 are completed, and then the etching mask 67 is removed.

Heavily Doped Semiconductor Region Forming Process

An insulating film 36 is formed over the entire surface of the semiconductor substrate 20 including the surfaces of the upper electrodes 35 of the stacked data storage capacitors C, the n-channel MISFETs $Q_n$ and the p-channel MISFETs $Q_p$. The principal purpose of the insulating film 36 is the prevention of contamination during doping. The insulating film 36 is, for example, a silicon dioxide film formed in a thickness on the order of 30 nm by a CVD process using inorganic silane gas ($Si(OC_2H_5)_4$) as a source gas or a CVD process using inorganic silane gas and nitrogen oxide gas as source gases.

Then, an n-type impurity, such as As, is introduced into the major surfaces of the $p^-$-type well regions 22 in regions for the n-channel MISFETs $Q_n$ and $Q_o$ of the CMOSs of the peripheral circuit of the DRAM 1 in an impurity density, for example, in the range of $10^{15}$ to $10^{16}$ atoms/cm$^2$ by an ion implantation process of an energy level in the range of 70 to 90 KeV by using the gate electrodes 26, the layer insulating film 27 overlying the gate electrodes 26, and the side wall spacers 29 as a mask. In introducing the n-type impurity into major surfaces of the $p^-$-type well regions 22, the regions for the memory cells M and the regions for the p-channel MISFETs $Q_p$ are covered with a mask (photoresist film).

Then, a p-type impurity, such as $BF_2$, is introduced into the major surfaces of the $n^-$-type well regions 21 in the regions for the p-channel MISFETs $Q_p$ of the CMOSs in an impurity density, for example, on the order of $10^{15}$ atoms/cm$^2$ by an ion implantation process of an energy level in the range of 60 to 90 KeV by using the gate electrodes 26, the layer insulating film 27 overlying the gate electrodes 26, and the side wall spacers 29 as a mask. In introducing the p-type impurity into the major surfaces of the $n^-$-type well regions 21, the regions for the memory cells M and the regions for the n-channel MISFETs $Q_n$ are covered with a mask.

Figure 30:
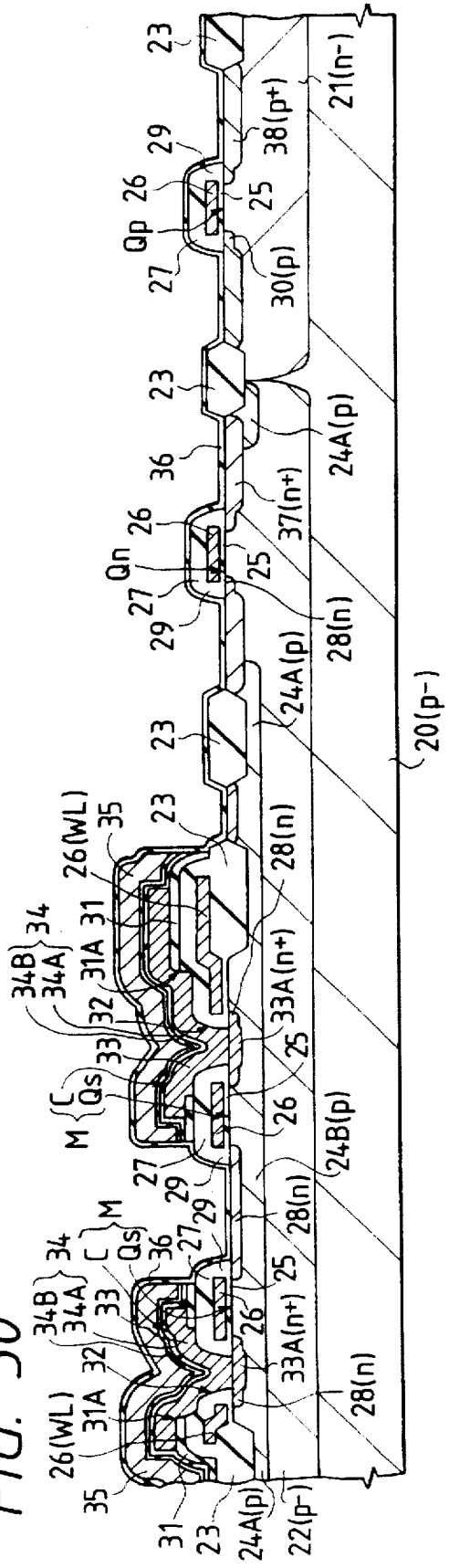

Then, the n-type and p-type impurities are caused to diffuse by subjecting the semiconductor substrate 20 to a high-temperature heat treatment at a temperature in the range of 900° to 1000° C. for abut ten minutes to form n⁺-type semiconductor regions 37 in the major surfaces of the p⁻-type well regions 22, and p⁺-type semiconductor regions 38 in the major surfaces of the n⁻-type well regions 21 as shown in FIG. 30. The n-channel MISFETs $Q_n$ are completed substantially by the formation of the n⁺-type semiconductor regions 37, and the p-channel MISFETs $Q_p$ are completed substantially by the formation of the p⁺-type semiconductor regions 38.

Layer Insulating Film Forming Process 1

Then, a lower layer insulating film 39 and an upper layer insulating film 40 are formed in that order over the entire surface of the semiconductor substrate 20 including the surfaces of the elements of the DRAM 1. The lower layer insulating film 39 is, for example, a silicon dioxide film deposited by a CVD process using organic silane gas as a source gas. The lower layer insulating film 39 is formed in a thickness, for example, in the range of 150 to 250 nm to prevent the leakage of impurities, such as P and B, from the upper layer insulating film 40 (BPSG film). The upper layer insulating film 40 is, for example, a silicon dioxide film (BPSG film) of a thickness in the range of 400 to 700 nm by a CVD process. The upper layer insulating film 40 is subjected to reflowing at a temperature in the range of about 900° to 1000° C. to flatten its surface.

Contact Hole Forming Process 2

Then, contact holes 40A are formed in the layer insulating films 39 and 40 in portions corresponding to the n-type semiconductor regions 28, the n⁺-type semiconductor regions 37 and the p⁺-type semiconductor regions 38 of the elements and the word lines 26, not shown, of the DRAM 1. Portions of the contact holes 40A in the upper layer insulating film 40 are formed by, for example, isotropic etching and portions of the same in the lower layer insulating film 39 are formed by anisotropic etching. The contact holes 40a are formed so as to enable wiring lines, such as the complementary data lines 50, to be formed in a satisfactory step coverage to obviate the breakage of the wiring lines. The contact holes 40A may be formed only by anisotropic etching.

Then, a thin silicon dioxide film is formed over the exposed portions of the major surfaces of the n-type semiconductor regions 28 and the n⁺-type semiconductor regions 37 exposed through the contact holes 40A to prevent the diffusion of B or P contained in the upper layer insulating film 40 through the contact holes 40A into the major surfaces of the n-type semiconductor regions 28, the n⁺-type semiconductor regions 37 and the p⁺-type semiconductor regions 38 in the following heat treatment process for forming an n⁺-type semiconductor regions 41 by diffusing an impurity. Introduction of B into the major surfaces of the n-type semiconductor regions 28 and the n⁺-type semiconductor regions 37 and introduction of P into the major surfaces of the p⁺-type semiconductor regions 38 reduce the effective impurity densities of those regions increasing contact resistances between those semiconductor regions and the lines 50 connected thereto. The silicon dioxide film has a thickness in the range of 12 to 50 nm.

Figure 31:
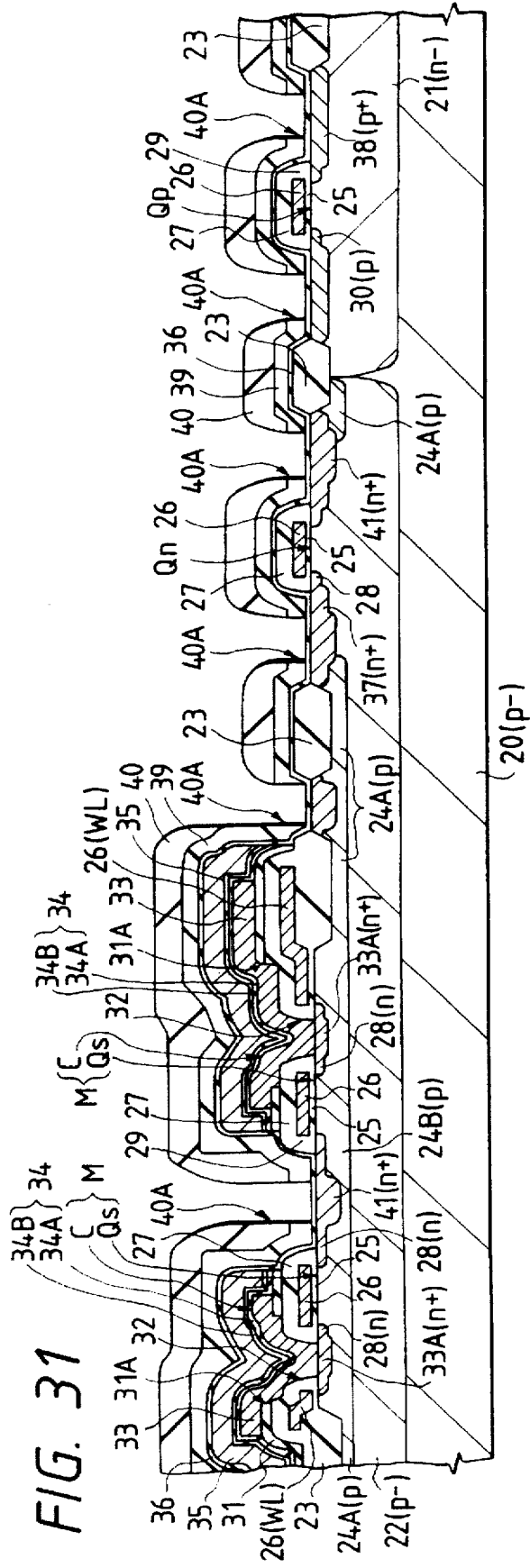

Then, an n-type impurity is introduced through the thin silicon dioxide film into the major surfaces of the exposed portions of the n-type semiconductor regions 28 and the n⁺-type semiconductor regions 37 exposed through the contact holes 40A in the regions for the memory cell select MISFETs $Q_s$ and the n-channel MISFETs $Q_n$ and $Q_o$, and then the n-type impurity is diffused to form n⁺-type semiconductor regions 41 having a high impurity density as shown in FIG. 31. The n⁺-type semiconductor regions 41 prevent short circuit between the p⁻-type well regions 22 and the lines 50 deposited in the contact holes 40A in case the contact holes 40A are dislocated relative to the n-type semiconductor regions 28 and the n⁺-type semiconductor regions 37 due to the misalignment of the mask. The n⁺-type semiconductor regions 41 is doped with the n-type impurity, such as As, in a high impurity density, for example, on the order of $10^{15}$ atoms/cm² by an ion implanting process of an energy level in the range of 110 to 130 KeV. Each n⁺-type semiconductor region 41 is integral with one of the n-type semiconductor regions 28 of the memory cell select MISFET $Q_s$ of each memory cell M and forms a portion of the source or drain region. Since the n⁺-type semiconductor region 41 has a high impurity density, the contact resistance between the n⁺-type semiconductor region 41 and the associated line, for example, the complementary data line 50 is small.

Wiring Forming Process 1

Then, as shown in FIG. 32, a film for the lines 50 connected through the contact holes 40A to the n⁺-type semiconductor regions 41 and the p⁺-type semiconductor regions 38 is formed over the layer insulating film 40. The lines 50 are formed by the first wiring layer forming process. The lines 50 are used as the complementary data lines DL between the memory cell arrays 11B and the column address decoder circuits 12. The film for the lines 50 is of a three-layer structure formed by stacking a lower transition metal film 50A, an aluminum film (or an aluminum alloy film) 50B and an upper transition metal film 50C in that order.

The lower transition metal film 50a of the film for the lines 50 is, for example, a WSi₂ film of a thickness in the range of 50 to 200 nm deposited by a CVD process. The WSi₂ film is formed through a chemical reaction at a temperature in the range of 650° to 700° C. expressed by a reaction formula:

The aluminum film 50B is formed in a thickness in the range of 300 to 600 nm by, for example, a sputtering process.

The upper transition metal film 50C is, for example, a MoSi₂ film formed in a thickness in the range of 10 to 40 nm by a sputtering process.

The lines 50 are formed by the photolithographic etching of the stacked layers of the lower transition metal film 50A, the aluminum film 50B and the upper transition metal film 50C. Processes of forming the lines 50 and lines 53 overlying the lines 50 will be described in detail afterward.

Layer Insulating Film Forming Process 2

Then, a layer insulating film 51 is formed over the entire surface of the semiconductor substrate 20 including the lines 50. The layer insulating film 51 is of a three-layer structure formed by stacking a deposited silicon dioxide film 51A, a applied silicon dioxide film 51B and a deposited silicon dioxide film 51C in that order.

The lower silicon dioxide film 51A is formed in a thickness in the range of 400 to 700 nm by a plasma CVD process.

The middle silicon dioxide film 51B is formed by applying silicon dioxide in a thickness in the range of 100 to 150 nm by a SOG method in a flat film, baking the film at a temperature on the order of 450° C., and then partially removing the baked film by partial etching so that only portions thereof filling recesses in the lower silicon dioxide film 51A remain unremoved. The partial etching removes the raised portions of the lower silicon dioxide film 51A to prepare a flat surface for the upper silicon dioxide film 51C. An organic film, such as a polyimide resin film, may be substituted for the middle silicon dioxide film 51B.

The upper silicon dioxide film 51C is formed to reinforce the layer insulating film 51 in a thickness in the range of 500 to 700 nm by, for example, a plasma CVD process.

Contact Hole Forming Process 3

Then, as shown in FIG. 33, contact holes 52 are formed in the layer insulating film 51. Each contact hole 52 has a lower portion 52A formed in the lower silicon dioxide film 51A by anisotropic etching, and an upper portion 52B formed in the upper silicon dioxide film 51c by isotropic etching. After forming the contact holes 52, the semiconductor substrate 20 carrying the elements is subjected to a heat treatment at a temperature on the order of 400° C. to mend damages caused by etching.

Wiring Forming Process 2

Then, as shown in FIG. 1, a film for the lines 53 is formed over the layer insulating film 51 so that the lines 53 are connected through the contact holes 52 to the lines 50, respectively. As mentioned above, the film for the lines 53 is of a three-layer structure formed by stacking a lower transition metal film 53A, an aluminum film (or an aluminum alloy film) 53B and an upper transition metal film 53C in that order.

The lower transition metal film 53A is, for example, a $MoSi_2$ film of a thickness in the range of 50 to 100 nm deposited by a sputtering process.

The middle aluminum film 53B is formed in a thickness in the range of 700 to 1000 nm by a sputtering process.

The upper transition metal film 53C is, for example, a $MoSi_2$ film of a thickness in the range of 10 to 40 nm deposited by a sputtering process.

The lines 53 are formed processing the three-layer film of the lower transition metal film 53A, the aluminum film 53B and the upper transition metal film 53C by photolithographic etching, which will be described afterward.

The semiconductor substrate 20 carrying the elements and the lines is subjected to a heat treatment to mend damages caused by the photolithographic etching in forming the lines 53.

Passivation Film Forming Process

As shown in FIGS. 1 and 15, a passivation film 54 is formed over the entire surface of the semiconductor substrate 20 including the surfaces of the lines 53. The passivation film 54 is, as mentioned above, of a three-layer structure formed by stacking a silicon dioxide film 54A, a silicon nitride film 54B and a resin film 54C in that order. The silicon dioxide film 54A has a thickness in the range of 150 to 600 nm. The silicon nitride film 54B is formed in a thickness in the range of 1.0 to 1.2 µm by, for example, a plasma CVD process. The resin film 54C is, for example, a polyimide resin film of a thickness in the range of 3 to 12 µm formed by application.

Then, Bonding openings 56 are formed in the resin film 54C of the passivation film 54 at positions respectively corresponding to the bonding pads BP of the DRAM 1 by a photolithographic etching process. Then, portions of the middle silicon nitride film 54B and the lower silicon dioxide film 54A corresponding to the bonding openings 56 are removed by, for example, an anisotropic etching process to form bonding openings 55. The anisotropic etching process also removes portions of the transition metal film 53C of the lines 53 corresponding to the bonding pads BP as shown in FIG. 15.

Thus, the DRAM 1 of the present invention is completed by the series of those processes.

Essential steps of those processes for fabricating the DRAM 1 will be described in detail hereinafter.

Gate Wiring Forming Process 2

The lower electrodes 33 of the stacked data storage capacitors C of the memory cells M shown in FIG. 27 are formed by a chopping etching process.

Figure 34:
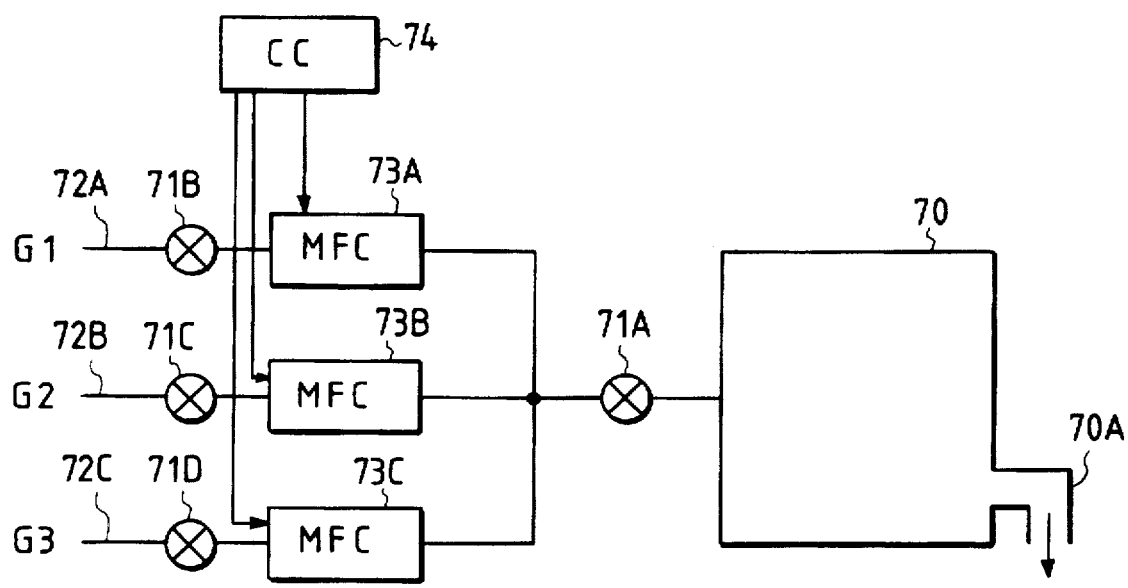
FIG. 34 is a block diagram of an essential portion of a chopping etching apparatus.

Referring to FIG. 34, a chopping etching apparatus for carrying out the chopping etching process comprises an etching chamber 70, a plurality of etching gas supply pipes 72A, 72B and 72C connected respectively through a control valve 71A, and a discharge pipe 70A connected to the etching chamber 70. The etching gas supply pipe 72A is connected through a control valve 71B and a mass flow controller (MFC) 73A to the control valve 71A to supply an etching gas G1 into the etching chamber 70; the etching gas supply pipe 72B is connected through a control valve 71c and a mass flow controller 73B to the control valve 71A to supply an etching gas G2 into the etching chamber 70; the etching gas supply pipe 72C is connected through a control valve 71d and a mass flow controller 73C to the control valve 71A to supply an etching gas G3 into the etching chamber 70. A chopping controller (CC) 74 controls the mass flow controllers 73A, 73B and 73C. The chopping controller 74 is capable of alternately controlling the respective flow rates of the etching gases G1, G2 and G3 supplied respectively through the etching gas supply pipes 72A, 72B and 72C.

Figure 35:
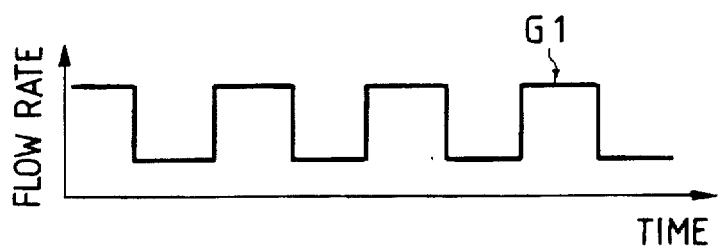
FIGS. 35 to 37 are time charts of assistance in explaining the supply of gases to the chopping etching apparatus of FIG. 34.
Figure 38:
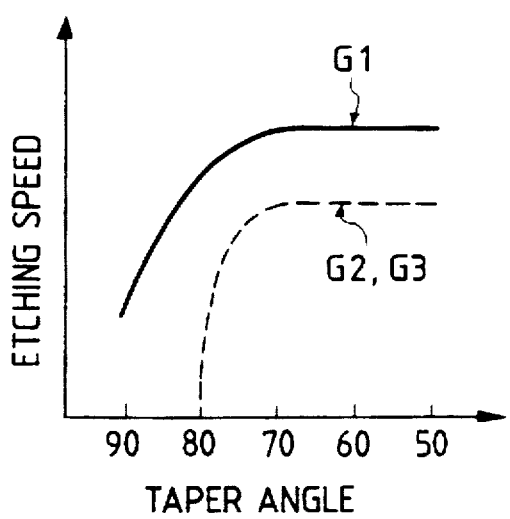
FIG. 38 is a graph showing the variation of etching rate with cone angle.

The etching gas G1 is an anisotropic etching gas, such as a halide gas, for example, $C_2Cl_2F_4$. The flow rate of the etching gas G1 is varied periodically as shown in FIG. 35 by the chopping controller 74. As is obvious from FIG. 38, increase in the flow rate of the etching gas G1 enhances the anisotropic etching effect.

Figure 36:
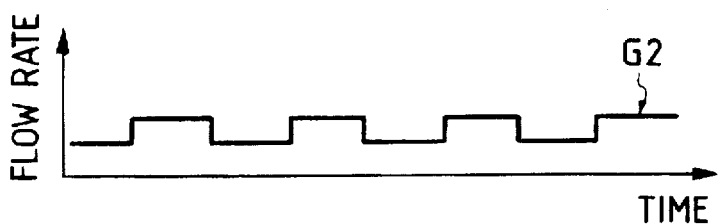
Figure 37:
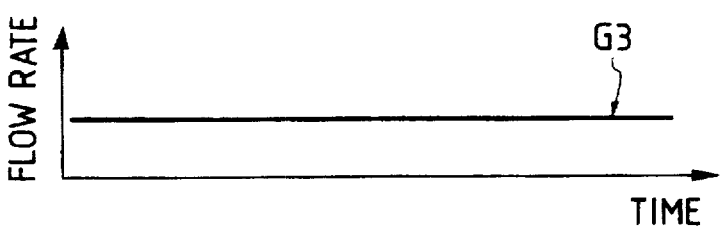

The etching gases G2 and G3 supplied through the etching gas supply pipes 72b and 72C are isotropic etching gases, such as $SF_6$. The flow rate of the etching gas G2 is varied periodically as shown in FIG. 36 by the chopping controller 74 so that the flow rate of the etching gas G2 is on a high level when that of the etching gas G1 is on a low level, and vice versa. As is obvious from FIG. 38, increase in the flow rate of the etching gas G2 enhances the isotropic etching effect. The flow rate of the etching gas G3 is held constant as shown in FIG. 37 by the chopping controller 74. The level of the flow rate of the etching gas G3 is lower than the high level of flow rate of the etching gas G1 and higher than the low level of the same. As is obvious from FIG. 38, the etching gas G3 enhances the isotropic etching effect.

In the etching process, the etching gases G1 and G2 are supplied into the etching chamber 70 in modes represented by FIGS. 35 and 36 to etch the polycrystalline silicon film for forming the lower electrodes 33 of the stacked data storage capacitors C. Thus, the chopping etching apparatus executes anisotropic etching and isotropic etching alternately to form the lower electrodes by etching the polycrystalline silicon film. The isotropic etching and the anisotropic etching alternate with each other at a very short period of 1 second or below. In such a rapid alternation of the isotropic etching and anisotropic etching, the anisotropic etching makes an organic polymer adhere to the side surfaces of the etched portions of the polycrystalline silicon film, and the next anisotropic etching cycle is carried out to make the organic polymer adhere further to the side surfaces before the organic polymer adhered previously to the side surfaces is destroyed by the isotropic etching. The organic polymer adhering to the side surfaces of the etched portions of the polycrystalline silicon film forms a stopper layer for suppressing the side etching effect of the isotropic etching, so that the anisotropic etching effect is enhanced. Ordinarily, since portions of the polycrystalline silicon film corresponding to stepped portions of the surface underlying the polycrystalline silicon film remain unetched when the polycrystalline silicon film is etched by an anisotropic etching process, the polycrystalline silicon film is overetched to a degree on the order of 500% for perfect etching. However, the chopping etching process removes the residual portions of the polycrystalline film by isotropic etching, maintaining the anisotropic etching effect.

Concretely, when the flow rate of the etching gas G1 is about 10% of the total flow rate of the etching gases, the anisotropic etching effect is very conspicuous, and the isotropic etching effect is conspicuous when the flow rate of the etching gas G2 is on the order of 30% of the total flow rate. It was found through experiments that the residual portions of the polycrystalline silicon film can satisfactorily be removed by overetching of a degree in the range of about 100 to 150%.

The chopping etching process may use the etching gas G3 (constant flow rate) and the etching gas G1 (periodically variable flow rate) in combination.

Thus, in fabricating the DRAM 1, the lower electrodes 33 are formed by patterning the polycrystalline silicon film formed over the layer insulating film 31 by alternate isotropic and anisotropic etching cycles. Since this etching method is able to reduce residues in portions of the etched polycrystalline film corresponding to the stepped portions of the underlying surface, maintaining the anisotropic etching effect, the degree of overetching can be reduced to prevent damaging or destroying the underlying surface.

In repeating the isotropic etching cycle and the anisotropic etching cycle alternately, the anisotropic etching cycle is started before the organic polymer formed in the preceding anisotropic etching cycle and adhering to the side surfaces of the etched polycrystalline silicon film is destroyed in the isotropic etching cycle subsequent to the preceding anisotropic etching cycle. Since the organic polymer produced in the anisotropic etching cycle serves as a stopper layer in the isotropic etching cycle, the depth of side etching in the isotropic etching cycle can be reduced and the anisotropic etching effect can be enhanced.

The chopping etching apparatus comprises the etching chamber 70, a first gas supply system for supplying the anisotropic etching gas G1, including the mass flow controller 73A, a second gas supply system for supplying the isotropic etching gas G2 or G3, including the mass flow controllers 73B and 73C, and a chopping controller 74 for controlling the mass flow controllers 73A, 73b and 73C to supply the anisotropic etching gas G1, and the isotropic etching gas G2 or G3 alternately to the etching chamber 70 for chopping etching. Thus, the chopping etching apparatus is capable of carrying out the chopping etching process.

The chopping etching process uses the anisotropic etching gas G1, and the isotropic etching gas G2 or G3 alternately and continuously without discharging the anisotropic etching gas G1 from the etching chamber 70 before supplying the isotropic etching gas G2 or G3, and without discharging the isotropic etching gas G2 or G3 before supplying the anisotropic etching gas G1, so that the chopping etching can be completed in a remarkably reduced time.

The chopping etching process employed in etching the polycrystalline silicon film to form the lower electrodes 33 is applicable also to etching the polycrystalline silicon films to form the gate electrodes 26 of the memory cell select MISFETs $Q_s$ and the upper electrodes 35 of the stacked data storage capacitors C.

The chopping etching process is applicable also to etching the film having the aluminum film as the main constituent to form the lines 50 and 53. In this case, $CF_4$, $CHF_3$, $CClF_3$ or the like is used as the anisotropic etching gas, $Cl_2$ or the like is used as the isotropic etching gas G2, and $BCl_3$ or the like is used as the isotropic etching gas G3.

Gate Wiring Forming Processes 1, 2, 3

A low-temperature anisotropic etching process is employed in forming the gate electrodes 26 (including the word lines 26) of the memory cell select MISFETs $Q_s$ of the memory cells M shown in FIG. 23, the lower electrodes 33 of the stacked data storage capacitors C of the memory cells M shown in FIG. 27, and the upper electrodes 35 of the stacked data storage capacitors C shown in FIG. 29.

A semiconductor wafer carrying the DRAMs 1, namely, a semiconductor wafer before dicing, held by an electrostatic holding plate is attached directly to a lower electrode disposed in an etching chamber. The lower electrode is cooled continuously to maintain the semiconductor wafer at a temperature below an ordinary temperature. Then, the semiconductor wafer is subjected to anisotropic etching to form the gate electrodes 26, the lower electrodes 33 or the upper electrodes 35 by etching the polycrystalline silicon film in a predetermined pattern by an anisotropic etching gas.

Since the anisotropic etching gas (a halide as $C_2Cl_3F_4$) tends to accumulate over the surface of the semiconductor wafer of a temperature lower than that of the walls of the etching cheer, the low-temperature etching process requires the supply of the anisotropic etching gas at a comparatively low flow rate and suppresses the contamination of the inner surfaces of the walls of the etching chamber.

Wiring Forming Processes 1, 2

Figure 39:
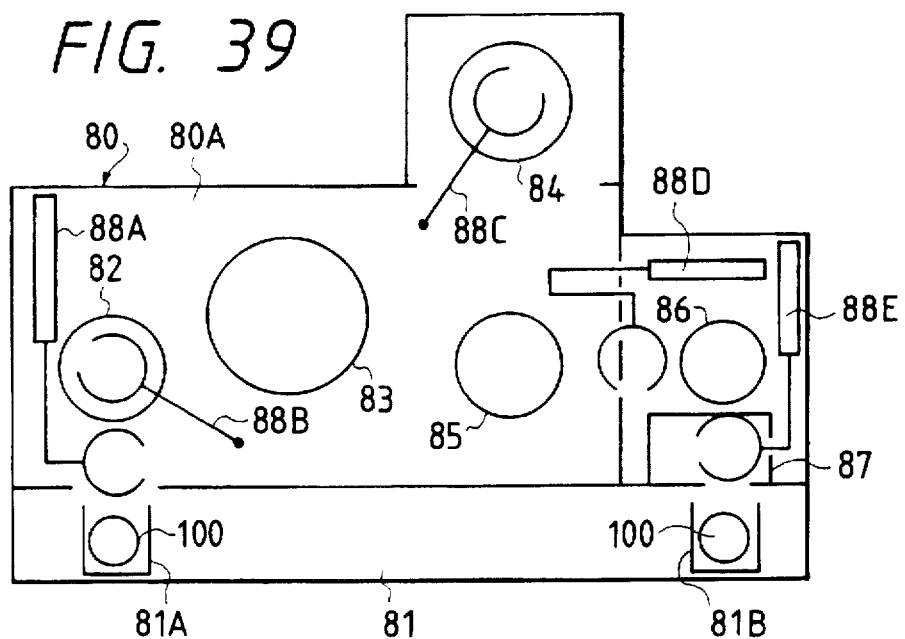
FIGS. 39 to 41 are diagrammatic illustrations of continuous processing apparatus.

The lines 50 shown in FIG. 32 and the lines 53 shown in FIG. 1 are formed by a continuous processing apparatus 80 shown in FIG. 39 capable of continuously carrying out an etching process, an ashing process, a wet process and a drying process.

The continuous processing apparatus 80 has, in a consecutive arrangement, a loading/unloading chamber 81, a loading cheer 82, an etching chamber 83, an ashing chamber 84, an unloading chamber 85, a washing chamber 86 and a baking chamber 82. The loading chamber 82, the etching chamber 83, the ashing chamber 84 and the unloading chamber 85 are disposed within a buffer chamber 80A, namely, within the same vacuum system, isolated from the atmosphere. The buffer chamber 80a is maintained at a vacuum in the range of $10^{-3}$ to $10^{-6}$ atm.

A loading cassette 81A capable of containing a plurality of semiconductor wafers 100 is removably provided in the loading/unloading chamber 81 of the continuous processing apparatus. A transfer arm 88A transfers the semiconductor wafer 100 contained in the loading cassette 81A from the loading/unloading chamber 81 to the loading chamber 82 provided in the buffer chamber 80A.

Then, the semiconductor wafer 100 is transferred from the loading chamber 82 to the etching chamber 83 by a transfer arm 88B. The lines 50 or 53 are formed in the etching chamber 83 by an anisotropic etching process (or the chopping etching process) using an etching mask (photoresist film) formed by photolithography. A mixed gas of a halide, such as $BCl_3+CF_4$) and a halogen ($Cl_2$) is used as an anisotropic etching gas. The etching chamber 83 is evacuated for etching to a vacuum, for example, in the range of $10^-q$ to $10^{-3}$ atm.

After the completion of the anisotropic etching process, the semiconductor wafer 100 is transferred from the etching chamber 83 to the ashing chamber 84 by a transfer arm 88C without being exposed to the atmosphere. The etching mask (the photoresist film) is removed by using a mixture of a halide ($CF_4$ or $CHF_3$) and oxygen ($O_2$) at a temperature in the range of about 25° to 200° C. in the ashing chamber 84 evacuated at a vacuum on the order of $10^{-1}$ atm.

After the completion of the ashing process, the semiconductor wafer 100 is transferred from the ashing chamber 84 to the unloading chamber 85 by a transfer arm 88C, and from the unloading chamber 85 to the washing chamber 86 by a transfer arm 88d. The washing chamber 86 and the baking chamber 87 are disposed outside the buffer chamber 80A and are maintained at the atmospheric pressure.

Since the halogen ($Cl_2$) produced in the etching process corrodes the exposed surfaces of the aluminum film (or the aluminum alloy film) 50B of the lines 50 or the aluminum film (or the aluminum alloy film) 53B of the lines 53 in the presence of air, particularly, moist air, the halogen is washed out with water in the washing chamber 86. Then, the semiconductor wafer 100 is transferred from the washing chamber 86 to the baking chamber 87 for drying by a transfer arm 88E. Then, the dried semiconductor wafer 100 is put in the unloading cassette 81B.

The semiconductor wafer 100 contained in the unloading cassette 81B is transferred to another apparatus and is subjected to a washing process, a drying process and a deactivating process. The washing process removes foreign matters remaining on the semiconductor wafer 100 after the etching process and side films, such as thin films of compounds containing aluminum, adhering to the exposed surfaces of the aluminum film 50B of the lines 50 or the aluminum film 53B of the lines 53 by using an alkali solution or an acid Solution. The washed semiconductor wafer 100 is dried in the drying process. An oxide film is formed over the exposed surfaces of the aluminum film 50B or 53B in the deactivating process.

Thus, the method of fabricating the DRAM 1 comprises: a wiring forming process of depositing the aluminum film 50B or 53B and forming an etching mask (photoresist film) over the aluminum film 50b or 53B; a patterning process of patterning the aluminum film 50B or 53B in a predetermined pattern by anisotropic etching using a mixed etching gas of a halogen and a halide in a vacuum system (the buffer chamber 80A); an ashing process of removing the etching mask by ashing using a mixed gas of a halide and oxygen in the same vacuum system as that used for the patterning process; a washing process of washing out chlorine produced in the patterning process, in a system isolated from the atmosphere, and a drying process. Since the anisotropic etching process and the ashing process are carried out in the same vacuum system and the chlorine produced in the anisotropic etching process can be washed out in the system isolated from the atmosphere, the corrosion of the aluminum film 50B or 53B can be suppressed.

Figure 40:
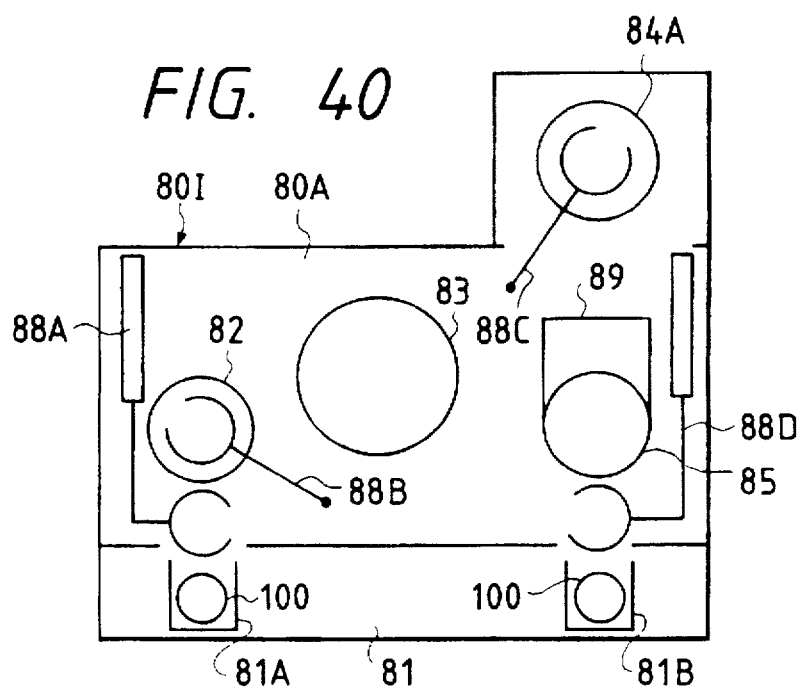

The lines 50 and 53 can be formed by another continuous processing apparatus 80I shown in FIG. 40 capable of continuously and sequentially carrying out an etching process, a low-temperature ashing process, and a vacuum baking process.

The continuous processing apparatus 80I has, in a consecutive arrangement, a loading/unloading cheer 81, a loading chamber 82, an etching chamber 83, a low-temperature ashing chamber 84A, a nitrogen gas blow vacuum baking chamber 89 and an unloading chamber 85. The loading chamber 82, the etching chamber 83, the low-temperature ashing chamber 84a, the nitrogen blow vacuum baking chamber 89 and the unloading chamber 85 are disposed in a buffer chamber 80A.

After the completion of the etching process, a semiconductor wafer 100 is transferred from the etching chamber 83 to the low-temperature ashing chamber 84A by a transfer arm 88C to remove the etching mask by ashing at a low temperature not higher than an ordinary temperature (about 20° C.) by using a mixed gas of a halide and oxygen. The low-temperature ashing process suppresses the production of $Al_2O_3$ through the oxidation of aluminum contained in side films adhering to the side surfaces of the aluminum film 50B of the lines 50 or the aluminum film 53B of the lines 53, and the side surfaces of the etching mask.

After the completion of the low-temperature ashing process, the semiconductor wafer 100 is transferred to the nitrogen gas blow vacuum baking chamber 89 by a transfer arm 88C, in which the surface of the semiconductor wafer 100 is heated at a temperature in the range of about 200° to 400° C. by a heating lamp to reduce a halogen produced in the etching process. During the nitrogen gas blow vacuum baking process, high-purity nitrogen gas ($N_2$ gas having a dew point of −60° C. or below) is supplied as a carrier gas into the nitrogen gas blow vacuum baking chamber 89 to reduce the air and oxygen concentrations of the baking atmosphere.

After the completion of the vacuum baking process, the semiconductor wafer 100 is subjected sequentially to a washing process, a drying process and a deactivating process.

This method of fabricating the DRAM 1, including a process of patterning the aluminum film 50B or 53B by anisotropic etching, comprises: a film forming process of depositing the aluminum film 50B or 53B and forming an etching mask over the surface of the aluminum film 50B or 53B; an anisotropic etching process of etching the aluminum film 50B or 53B in a predetermined pattern in a vacuum system by anisotropic etching using a mixed etching gas of a halogen and a halide; a low-temperature ashing process of removing the etching mask by low-temperature ashing at a low temperature not higher than a room temperature by using a mixed gas of a halide and oxygen in the same vacuum system as that employed in the anisotropic etching process; and a vacuum baking process of baking the patterned aluminum film 50B or 53B in a vacuum. Since the anisotropic etching process and the low-temperature ashing process are carried out in the same vacuum system, the production of $Al_2O_3$ through the oxidation of aluminum contained in side films adhering to the side surfaces of the etched aluminum film 50B or 53B, and the etching mask is suppressed, and the side films can easily be removed. Since the aluminum film 50B or 53B is processed in the same vacuum system without being exposed to the atmosphere during the anisotropic etching process through the vacuum baking process and chlorine produced in the anisotropic etching process can be reduced by the vacuum baking process, the corrosion of the aluminum film 50B or 53B can be suppressed.

Figure 41:
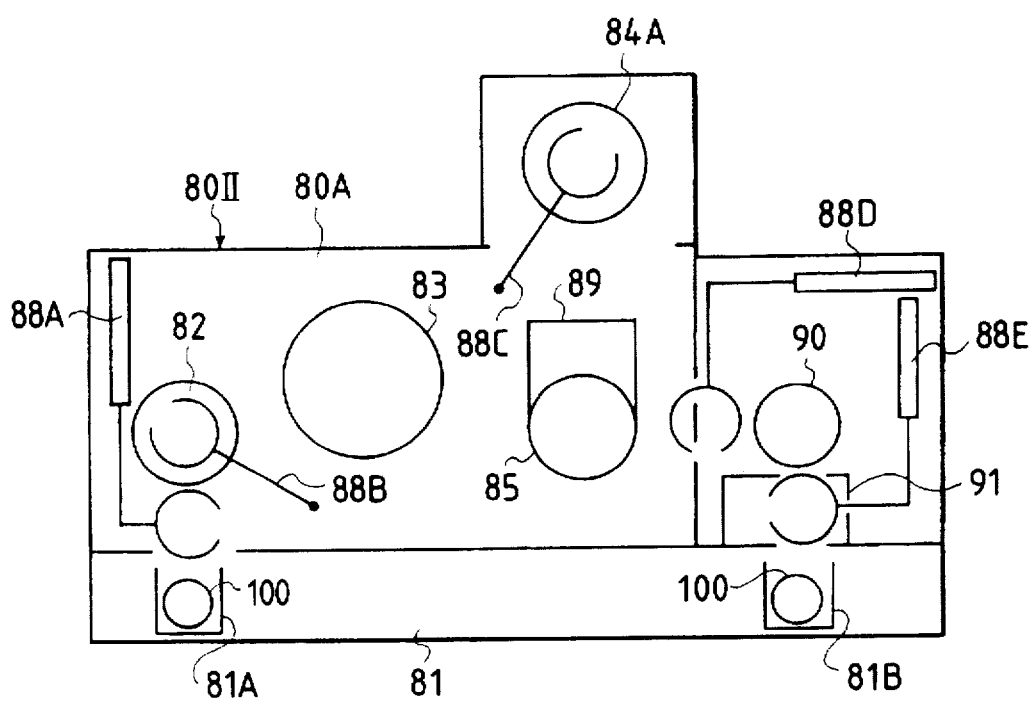

The lines 50 and 53 may be formed by a continuous processing apparatus 80II shown in FIG. 41 capable of continuously and sequentially carrying out an etching process, a low-temperature ashing process, a vacuum baking process, a washing process and a deactivating process.

The continuous processing apparatus 80II has, in a consecutive arrangement, a loading/unloading chamber 81, a loading chamber 82, an etching chamber 83, a low-temperature ashing chamber 84A, a nitrogen gas blow vacuum baking chamber 89, an unloading chamber 85, a washing chamber 90 and a deactivating chamber 91. The continuous processing apparatus 80II is a combination of the continuous processing apparatus 80I, the washing chamber 90 and the deactivating chamber 91. In the washing unit 90, the side films and foreign matters are removed by washing with acid and alkali solutions or an acid solution. In the deactivating chamber 91, an oxide film is formed over the surface of the aluminum film 50B or 53B.

As mentioned above, a mixed gas of a halide, such as $CF_4$, and oxygen is used for the low-temperature ashing process or the ashing process; oxygen removes the etching mask, and the halide enhances the etching mask removing action of oxygen. The thin transition metal film 50C of the lines 50, and the thin transition metal film 53C of the lines 53 are removed by over-ashing in the ashing process. In the ashing process or the low-temperature ashing process, the etching mask is ashed by using the mixed gas for just ashing until the surface of the transition metal film 50C of the lines 50 or the transition metal film 53C of the lines 53 is exposed, and then the transition metal film 50C or 53C is removed by over-ashing by using oxygen gas.

Second Embodiment

A DRAM 1 in a second embodiment according to the present invention comprises memory cells M having an area smaller than that of the memory cells M of the DRAM 1 in the first embodiment, and has a degree of integration greater than that of the DRAM 1 in the first embodiment.

Figure 42:
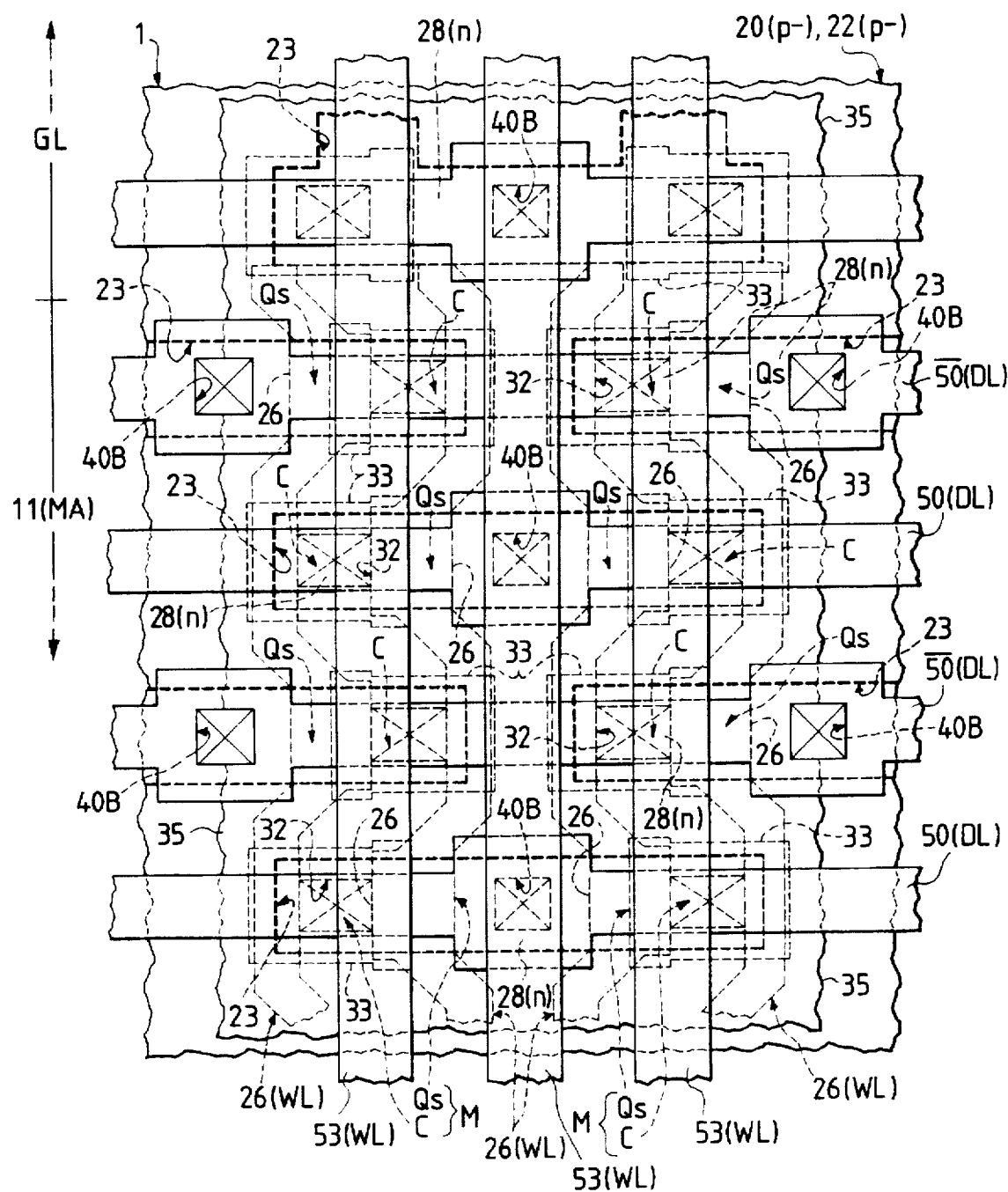
FIG. 42 is a sectional view of an essential portion of a DRAM in a second embodiment according to the present invention.

Referring to FIG. 42 showing an essential portion of the DRAM 1 in the second embodiment, a contact hole 40B for connecting one of the n-type semiconductor regions 28 of the memory cell select MISFET $Q_s$ of each memory cell M and a complementary data line (DL) is formed so as to self-align with the upper electrode 35 of the stacked data storage capacitor C of the memory cell M. The complementary data line 50 and the upper electrode 35 are isolated electrically from each other by an isolating insulating film 35A, not shown, in the contact hole 40B.

A method of fabricating the DRAM 1 will concretely be described hereinafter with reference to FIGS. 43, 44 and 45.

Similarly to the process of fabricating the DRAM 1 in the first embodiment explained previously with reference to FIG. 29, a polycrystalline silicon film for the upper electrodes 35 of the stacked data storage capacitors C of the memory cells M is deposited, and then an etching mask 67A, which is different from the etching mask 67 shown in FIG. 29, is formed over the polycrystalline silicon film so as to cover entirely a region for memory cell arrays 11B including regions for connecting the memory cells M and the complementary data lines 50.

Figure 43:
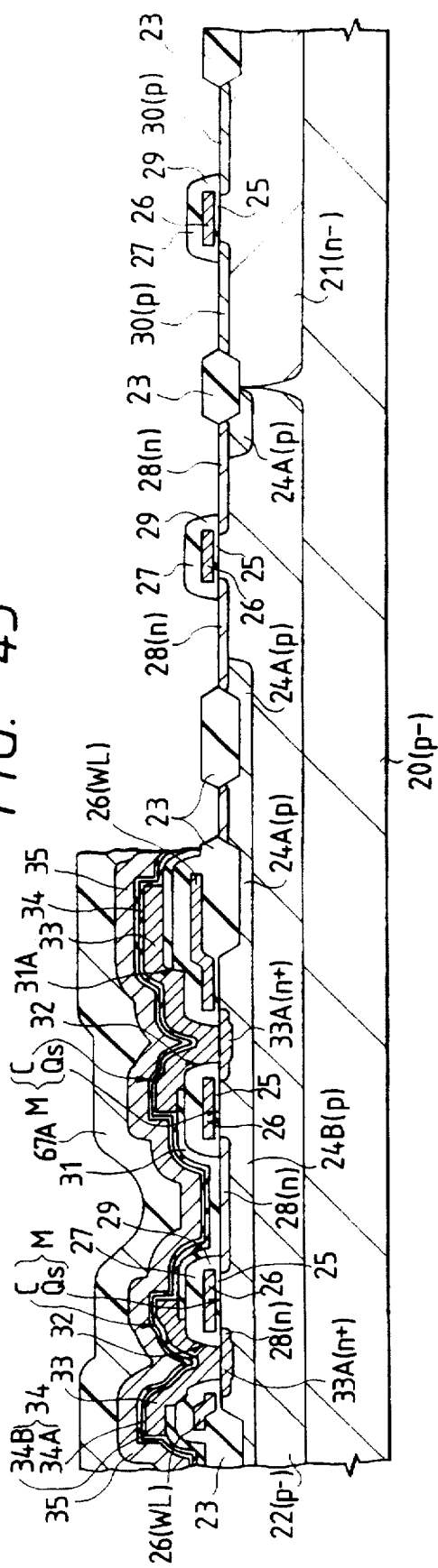
FIGS. 43 to 45 are sectional views of the DRAM of FIG. 42 in different stages of fabrication.

Then, portions of the polycrystalline silicon film corresponding to regions for the peripheral circuits, a dielectric film 34 and a layer insulating film 31 are removed sequentially by etching using the etching mask 67A to form the upper electrodes 35 as shown in FIG. 43 to complete substantially the stacked data storage capacitors C.

Figure 44:
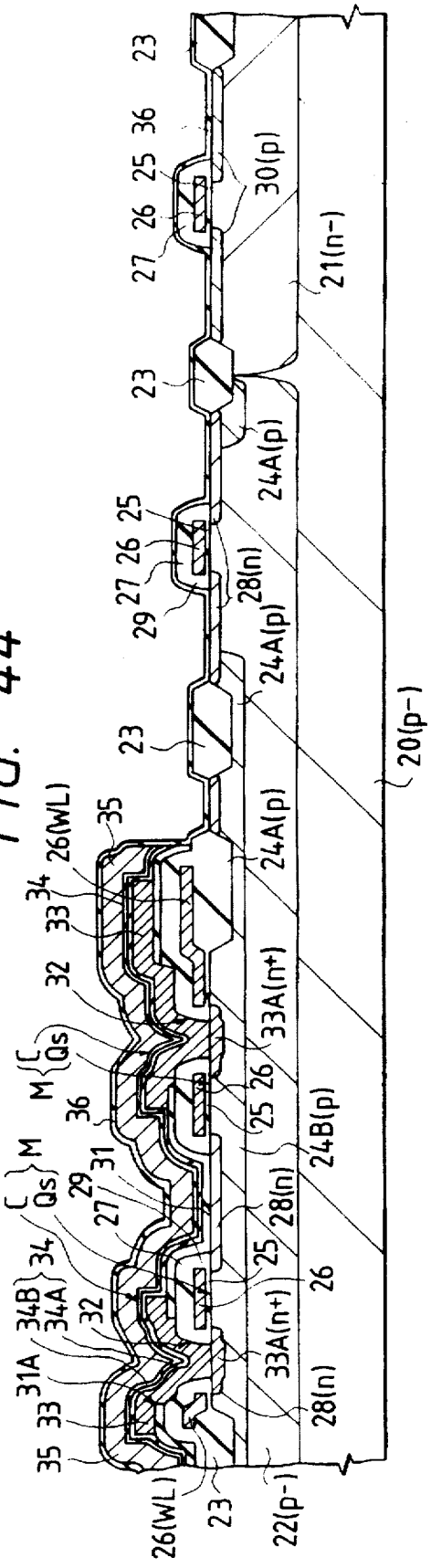
Figure 45:
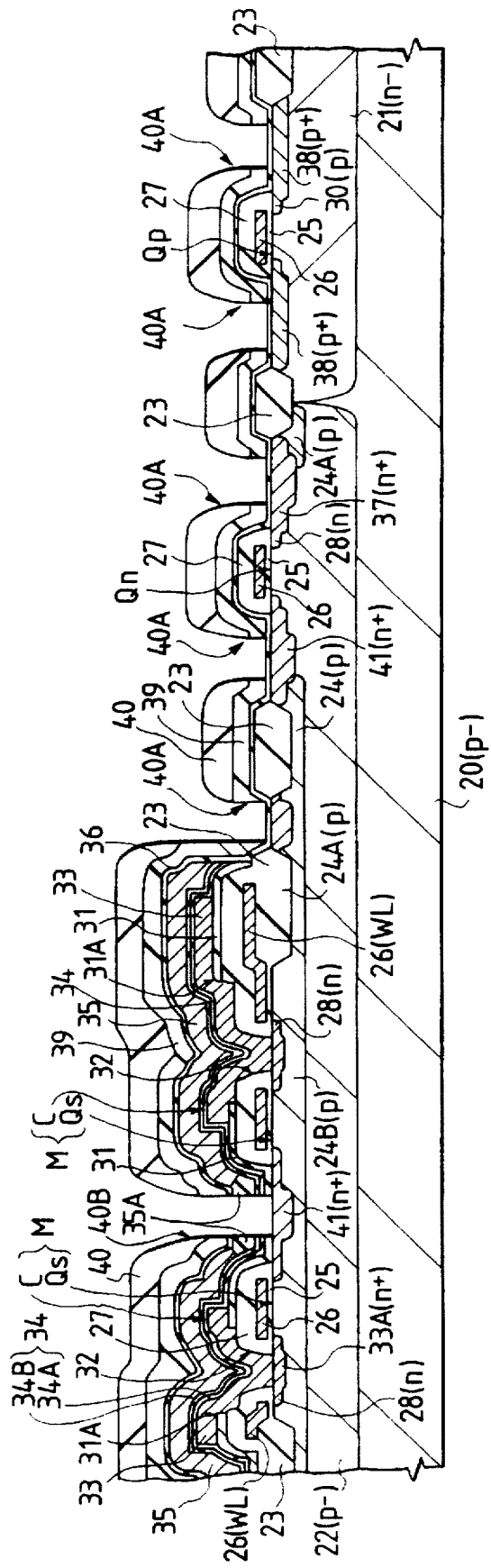

Then, as shown in FIG. 44, an insulating film 36 is formed over the entire surface of the semiconductor substrate 20 including the surfaces of the upper electrodes 35, and then a layer insulating films 39 and 40 are formed in that order over the insulating film 36.

Then, portions of the layer insulating films 40 and 39, the insulating film 36 and the upper electrodes 35 corresponding to regions for connecting the memory cells M of the memory cell arrays 11B and the complementary data lines 50 are removed sequentially by anisotropic etching or combined anisotropic and isotropic etching to form a portion of each of the contact holes 40B, in which the dielectric film 34 or the layer insulating film 31 is used as a etching stopper layer.

Then, the surface of the upper electrode 35 exposed in the inner surface of the portion of each contact hole 40B is oxidized by using a portion of the dielectric film 34, particularly, the silicon nitride film 34A, as an oxidation-resistant mask for oxidation to form the isolating insulating film 35A having a thickness not less than about 100 nm. Then, portions of the dielectric film 34 and the layer insulating film 31 exposed in the portions of the contact holes 40B are removed sequentially by etching to complete the contact holes 40B. In forming the isolating insulating film 35A, an oxidation-resistant mask formed by another process may be used instead of the dielectric film 34, which, under some etching condition, is removed by etching.

Then, $n^+$-type semiconductor regions 41 are formed by a process similar to that employed in the first embodiment, and then the complementary data lines and other lines 50 are formed. The rest of the processes are the same as those employed in the first embodiment and hence the description thereof will be omitted.

In forming the memory cells M of the DRAM 1 of the first embodiment, the gate electrode 26 of each memory cell select MISFET $Q_s$, and the upper electrode 35 of each stacked data storage capacitor C have each an allowance in size for alignment with the contact hole 40A for the complementary data line 50. The upper electrode 35 has an allowance for alignment with the lower electrode 33 underlying the same, and the lower electrode 33 has an allowance for alignment with the gate electrode 26 underlying the same. However, in fabricating the DRAM 1 of the second embodiment, the contact hole 40B is formed in self-alignment with the upper electrodes 35 and hence the upper electrode 35 need not be provided with any allowance in size; consequently, the region for each memory cell M is reduced by an area corresponding to the allowance and the degree of integration of the DRAM 1 is increased.

Third Embodiment

A DRAM 1 in a third embodiment according to the present invention has stacked data storage capacitors C having a charge storage capacity greater than that of the stacked data storage capacitors C of the DRAM 1 of the first embodiment, memory cells M of an area smaller than that of the memory cells M of the DRAM 1 of the first embodiment, and complementary data lines having step coverage higher than that of the complementary data lines of the DRAM 1 of the first embodiment.

A method of fabricating the memory cell arrays and peripheral circuits of the DRAM 1 in the third embodiment will be described with reference t FIGS. 46 to 50.

A polycrystalline silicon film for gate electrodes 26 and word lines 26, and a layer insulating film 27C are formed in that order over the entire surface of a semiconductor substrate including the surface of gate insulating film 25 by the same process as that explained previously with reference to FIG. 23 for the first embodiment. The layer insulating film 27C is formed by a CVD process using inorganic silane gas and nitrogen oxide gas as source gases in a comparatively large thickness on the order of 600 nm to form stacked data storage capacitors C having a high charge storage capacity as compared with that of the stacked data storage capacitors C in the first embodiment.

In regions for the memory select MISFETs $Q_s$ of the memory cell arrays 11B, and the n-channel MISFETs $Q_n$ and p-channel MISFETs $Q_p$ of the peripheral circuits, portions of the layer insulating film 27C are etched to form a layer insulating film 27 having a small thickness, for example, on the order of 300 nm.

Figure 46:
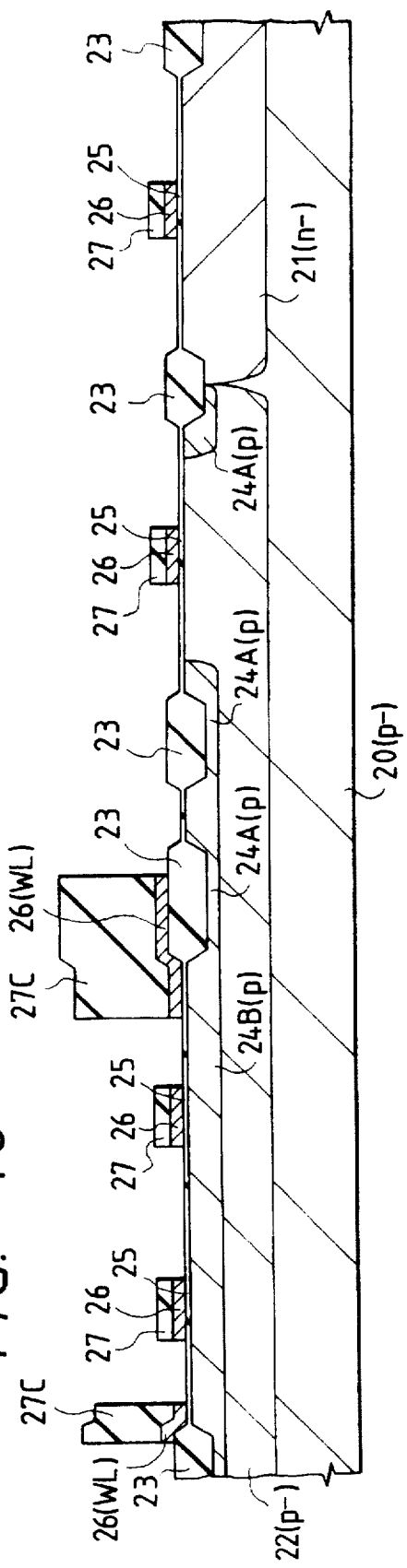

Then, as shown in FIG. 46, the layer insulating films 27 and 27C and the polycrystalline silicon film are etched sequentially by anisotropic etching to form gate electrodes 26 and word lines 26. The gate electrodes 26 of the memory cell select MISFETs $Q_s$, the n-channel MISFETs $Q_n$ and the p-channel MISFETs $Q_p$ are coated with the thin layer insulating film 27, and the word lines 26 are coated with the thick layer insulating film 27c.

Figure 47:
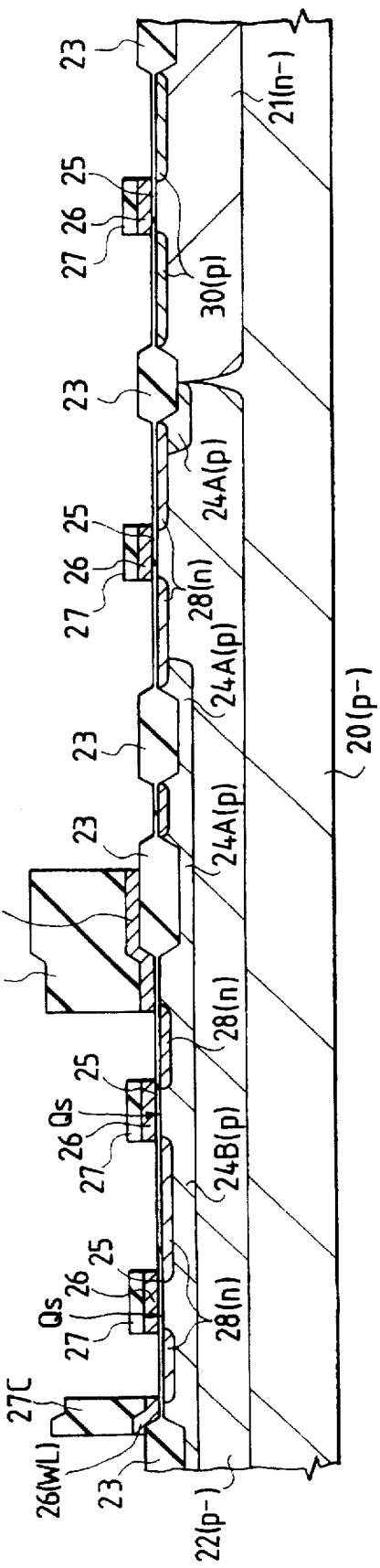

Then, as shown in FIG. 47, the memory cell select MISFETs $Q_s$ are completed substantially by forming n-type semiconductor regions 28 and p-type semiconductor regions 30.

Then, as shown in FIG. 48, side wall spacers 29 are formed over the side surfaces of the gate electrodes 26 and the layer insulating film 27 overlying the gate electrodes, and side wall spacers 29A are formed over the side surfaces of the word lines 26 and the layer insulating film 27C.

Then, a layer insulating film 31 is formed over the entire surface of the semiconductor substrate including the surfaces of the layer insulating films 27 and 27C, and then contact holes 31a and 32 are formed as shown in FIG. 49 by the same process as that employed in the first embodiment.

Figure 50:
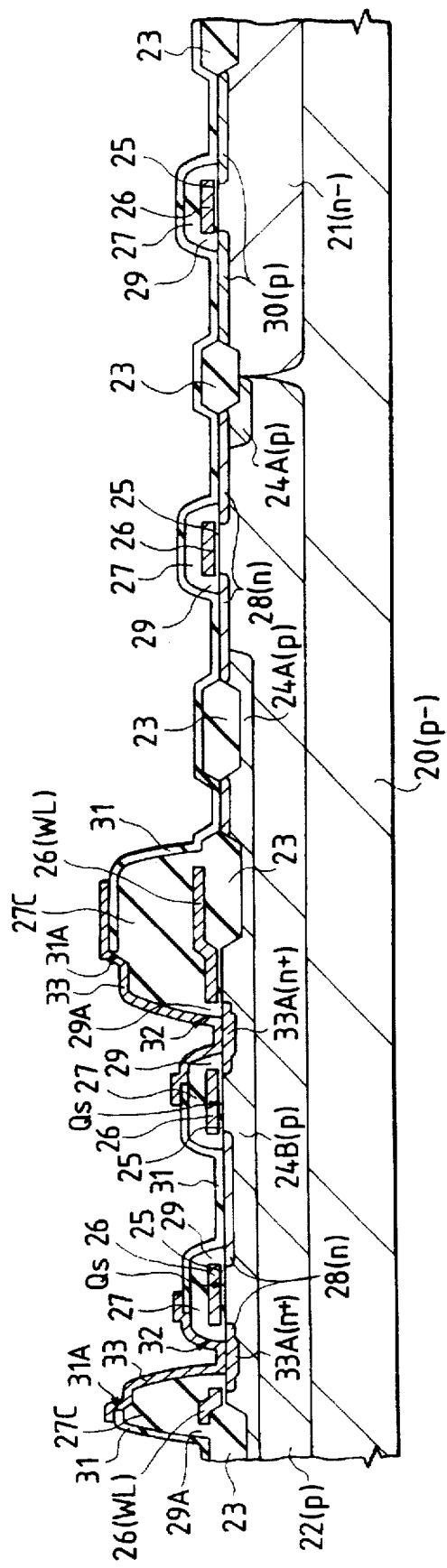

Then, as shown in FIG. 50, the lower electrodes 33 of the stacked data storage capacitors C are formed in regions for the memory cells M. The lower electrodes 33 overlap the layer insulating films 27 and 27C with a layer insulating film 31 therebetween. Since each lower electrode 33 has a portion extending heightwise over the word line 26, the stacked data storage capacitor C has a large charge storage capacity as compared with the stacked data storage capacitor C in the first embodiment. Since the lower electrodes 33 reduce irregularities (aspect ratio) in the surface overlying the gate electrodes 26, the film for the complementary data lines can be formed in a satisfactory step coverage in regions for connecting the complementary lines 50 and the memory cells M. Since the heightwise extension of the lower electrode 33 increases the charge storage capacity of the corresponding stacked data storage capacitor C, the lower electrode 33 may be formed in a comparatively small thickness to facilitate the introduction of an n-type impurity and the processing of the film for the lower electrodes 33.

The rest of the processes subsequent to the process of forming the lower electrodes 33 are the same respectively as those employed in the first embodiment and hence the description thereof will be omitted.

In the DRAM 1 comprising the memory cells M disposed respectively at the intersections of the complementary word lines and the word lines 26 and each consisting of a series circuit of the memory cell select MISFET $Q_s$ and the stacked data storage capacitor C, the lower electrode 33 of each stacked data storage capacitor C is formed so as to overlap the gate electrode 26 of the memory cell select MISFET $Q_s$ of the same memory M and the word line 26 for selecting the memory cell M adjacent to the former memory cell M with respect to the width of the gate, and the layer insulating film 27C formed between the lower electrode 33 and the gate electrode 26 has a thickness greater than that of the layer insulating film 27. Accordingly, the portion of the lower electrode 33 extending heightwise increases the charge storage capacity of the stacked data storage capacitor C, the comparatively thin layer insulating film 27 formed between the lower electrode 33 and the gate electrode 26 reduces the aspect ratio of the connecting region for connecting the memory cell select MISFET $Q_s$ and the complementary data line 50 to reduce the possibility of breakage of the complementary data lines. Consequently, the alpha particle soft error soft immunity is improved, the degree of integration of the DRAM 1 is increased, and the electrical reliability of the DRAM 1 is improved.

The layer insulating films 27 and 27C may be formed respectively by separate film forming processes.

Fourth Embodiment

A DRAM 1 in a fourth embodiment according to the present invention is similar in construction to the DRAM 1 in the first embodiment except that the DRAM 1 in the fourth embodiment has memory cells M each having a stacked data storage capacitor C having a lower electrode of a thickness greater than that of the lower electrode of the stacked data storage capacitor C of the DRAM 1 of the first embodiment and having a charge storage capacity greater than that of the latter.

The construction of the memory cells M of the DRAM 1 in the fourth embodiment will be described with reference to FIGS. 51 to 54.

Figure 51:
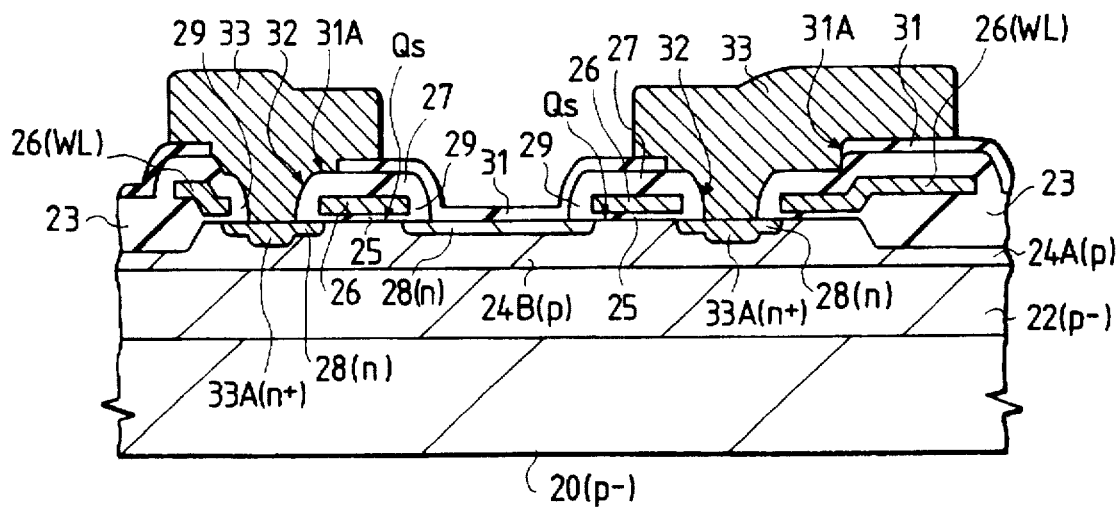
FIGS. 51 to 54 are sectional views of an essential portion of a DRAM in a fourth embodiment according to the present invention in different stages of fabrication.

Referring to FIG. 51, the lower electrode 33 of the stacked data storage capacitor C of the memory cell M is formed so that a corresponding contact hole 32 is filled up with the lower electrode 33 and the surface of the lower electrode 33 is flat. For example, when the size of the opening of the contact hole 32 (the distance between a gate electrode 26 and a word line 26) L is about 1.0 μm, the thickness T of the lower electrode 33 is about 500 nm; that is, $T \geq L/2$.

The lower electrode 33 of the stacked data storage capacitor C thus formed has a comparatively large surface area to increase the charge storage capacity of the stacked data storage capacitor C. Accordingly, the memory cells M can be formed in a comparatively small area to increase the degree of integration of the DRAM 1.

Figure 52:
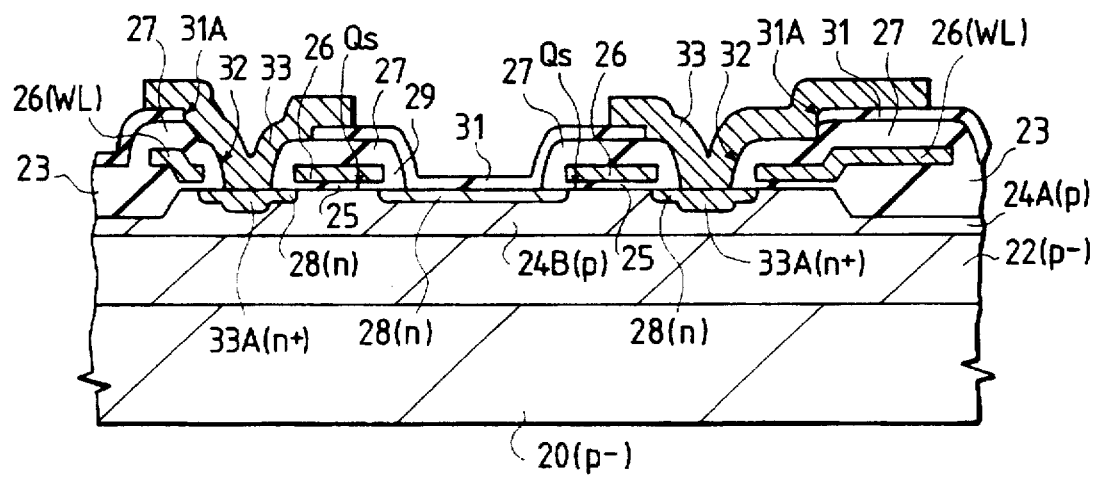

FIG. 52 shows a modification of the memory cell M of FIG. 51. In this modification, the lower electrode 33 of the stacked data storage capacitor c is formed so as to extend along the surface of the upper portion of a corresponding contact hole 32 without filling up the contact hole 32. Since the lower electrode 33 is comparatively thick, the side surfaces of the lower electrode 33 and the portion of the lower electrode 33 extending along the stepped surfaces of the contact holes 32 and 31A increases the area of the lower electrode 33, so that the lower electrode 33 increases the charge storage capacity of the stacked data storage capacitor C; that is, the stacked data storage capacitors C may be formed in a reduced size without decreasing the charge storage capacity to increase the degree of integration of the DRAM 1.

Figure 53:
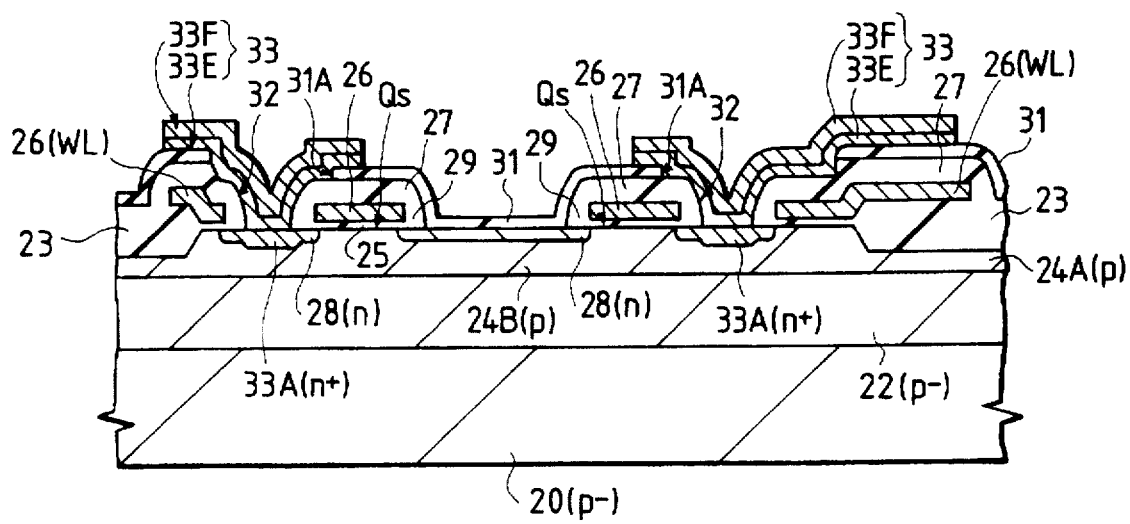
Figure 54:
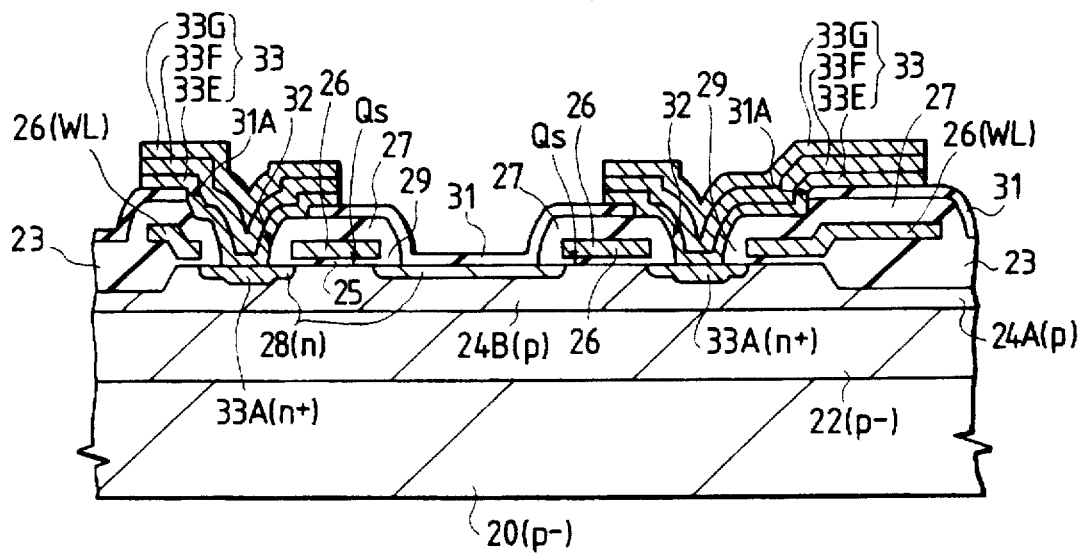

FIGS. 53 and 54 show further modifications of the memory cell M of FIG. 51. The lower electrode 33C of the stacked data storage capacitor C of a memory cell M shown in FIG. 53 is of a two-layer structure consisting of lower electrode films 33E and 33F. The lower electrode 33 is formed by depositing a first polycrystalline silicon film for the lower electrode film 33E, doping the first polycrystalline silicon film with an n-type impurity by a thermal diffusion process or an ion implantation process, depositing a second polycrystalline silicon film for the lower electrode film 33F over the doped first polycrystalline silicon film, doping the second polycrystalline silicon film with the n-type impurity, and processing the doped first and second polycrystalline silicon films. Since it is difficult to control the distribution of the impurity density properly when the lower electrode 33 is formed of a single film having a large thickness, the lower electrode 33 is divided into a plurality of thinner films and the plurality of thinner films are doped individually with the n-type impurity to form the lower electrode 33 in a uniform impurity density. The lower electrode 33 of a stacked data storage capacitor C shown in FIG. 54 is of a three-layer structure consisting of lower electrode films 33E, 33F and 33G, the purpose of which is the same as that of the lower electrode films 33E and 33F of the stacked data storage capacitor C of FIG. 53. The lower electrode 33 thus formed has uniform impurity density.

Fifth Embodiment

A DRAM 1 in a fifth embodiment according to the present invention is similar in construction to the DRAM 1 in the first embodiment except that narrow-channel effect in the memory cell select MISFETs $Q_s$ of the memory cells M and n-channel MISFETs $Q_n$ is suppressed.

In fabricating the DRAM 1 in the fifth embodiment, p-type impurity 24p is introduced into p-type well regions 22 by a high-energy ion implantation process of an energy level in the range of about 100 to 150 KeV to form channel stopper regions 24A in a stage corresponding to that shown in FIG. 20. When the high-energy ion plantation process is employed in doping the p⁻-type well regions 22 with the p-type impurity 24p, the depth of a doped portion having a maximum impurity density is greater than the filed insulating film 23. A mask (a photoresist film) formed by processing the mask 62 may be used for doping with the p-type impurity 24p. Since it is possible that the p-type impurity 24p penetrates through the silicon dioxide film 60A into the major surface of the n⁻-type well region 21, a mask is formed so as to cover the major surfaces of the n⁻-type well region 21 in doping the p⁻-type well regions 22 with the p-type impurity 24p. After the completion of doping with the p-type impurity 24p, the field insulating film 23 is formed simultaneously dispersing the p-type impurity 24p to form the p-type channel stopper regions 24A and p-type semiconductor regions 24B by the same process as that employed in the first embodiment.

Thus, the high-energy ion implantation process is used for forming the p-type channel stopper regions 24A by doping the p⁻-type well regions 22 with the p-type impurity 24p in fabricating the DRAM 1 to make the p-type impurity 24p penetrates to the deep portions of the p⁻-type well regions so that the lateral diffusion of the p-type impurity is suppressed in forming the field insulating film 23. Accordingly, increase in the impurity density in the p⁻-type well regions 22, particularly, the channel forming regions, is suppressed to suppress the narrow-channel effect in the memory cell select MISFETs $Q_s$ and the n-channel MISFETs $Q_n$ and $Q_p$. Since the p-type impurity 24p is introduced deep into the p⁻-type well regions 22 to prevent decrease in the p-type impurity density during the formation of the field insulating film 23, the p-type channel stopper regions 24A can be formed in a high impurity density to increase the threshold voltage of the parasitic MOS, so that the elements can be isolated surely from each other.

Sixth Embodiment

Figure 55:
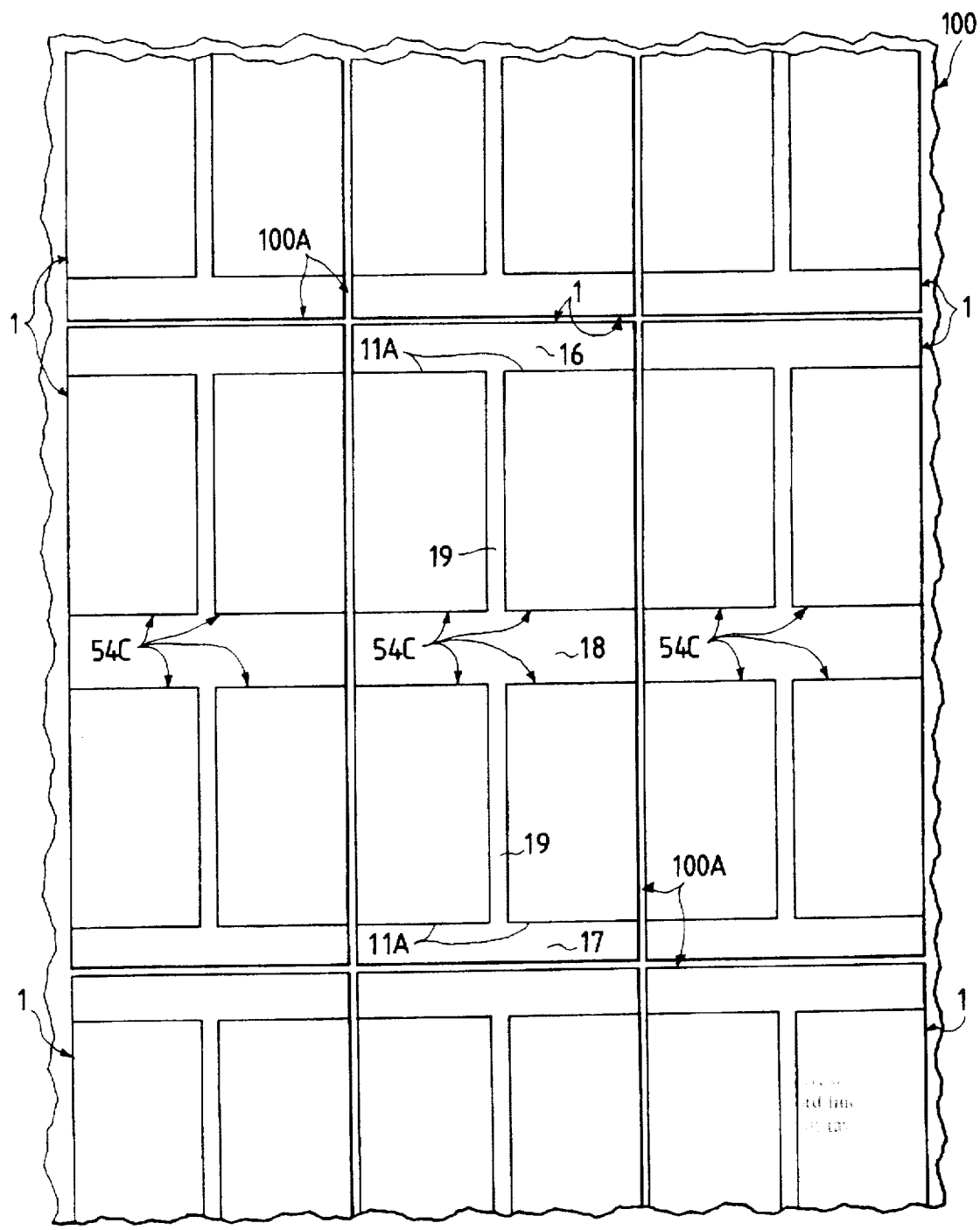
FIG. 55 is a plan view of an essential portion of a semiconductor wafer employed in a DRAM in a fifth embodiment according to the present invention.

A DRAM 1 in a sixth embodiment according to the present invention is similar in construction as the DRAM 1 in the first embodiment except that the top resin film among the three films constituting the passivation film is divided as shown in FIG. 55.

Referring to FIG. 55, a semiconductor wafer 100 before being diced has a matrix of plurality of DRAMs 1, which are the same as the DRAM 1 in the first embodiment. Each DRAM 1 is disposed in a region demarcated by scribing areas (dicing areas) 100A.

The surface of each DRAM 1 provided on the semiconductor wafer 100 is coated with a passivation film 54, which is similar to the passivation film 54 employed in the first embodiment, consisting of a lower silicon dioxide film 54A, a middle silicon nitride film 54B and an upper resin film (for example, a polyimide resin film) 54C. The resin film 54C is not formed in the scribing areas 100A and in areas corresponding to the bonding pads BP of the DRAM 1, and is divided into a plurality of sections. The principal purpose of the resin film 54C being the enhancement of alpha particle soft error immunity, the resin film 54C is formed over areas corresponding to the memory cell arrays 11A, and part of the direct peripheral circuit required of alpha particle soft error immunity, such as the sense amplifiers (SA) 13 and the column address decoder circuits (YDEC) 12; that is, the resin film 54C is not formed in areas corresponding to other parts of the direct peripheral circuit which are not required of alpha particle soft error immunity, such as the row-address decoder circuits (XDEC) 14 and the word driver circuits (WD) 15, and the indirect peripheral circuits including the clock circuit and the buffer circuits. The areas not covered with the resin film 54C are the demarcating areas. The division of the resin film 54C reduces stresses in the films underlying the resin film 54C, such as the silicon nitride film 54B, and the semiconductor wafer 100.

The sectional resin film 54C is formed by the following method.

A resin is applied in a film over the silicon nitride film 54B, and then the film is subjected to a first baking process, which comprises a first baking cycle for baking the resin film at a temperature, for example, in the range of 80° to 90° C. for a time, for example, in the range of 800 to 1000 sec, and a subsequent second baking cycle for baking the resin film again at a temperature, for example in the range of 120° to 140° C. for a time, for example, in the range of 800 to 1000 sec.

Then, the portions of the resin film corresponding to the scribing areas 100A, the bonding pads BP and the dividing areas are removed by a photolithographic etching process.

Then, the resin film is subjected to a second baking process to complete the resin film 54C. The second baking process comprises a first baking cycle for baking the resin film at a temperature, for example, in the range of 150° to 200° C. for a time, for example, 800 to 1000 sec, and a second baking cycle for baking the resin film at a temperature, for example, in the range of 300° to 400° C. for a time, for example, in the range of 800 to 1000 sec. Although a maximum stress is induced in the films underlying the resin film 54C, and the semiconductor wafer 100, the division of the resin film 54c limits the stress to a low level.

The semiconductor wafer 100 is diced to provide individual chips each of the DRAM 1 having divided regions coated with the resin film 54c.

The resin film 54C of the DRAM 1, coating the surfaces of the memory cell arrays 11A, the direct peripheral circuits for directly controlling the write and read operations of the memory cells M, and the indirect peripheral circuits formed on the major surface of the p⁻-type semiconductor substrate 22, i.e., the semiconductor wafer 100 is divided into a plurality of sections to reduce stresses inevitably induced in the resin film 54C and the p⁻-type semiconductor substrate 22, i.e., the semiconductor wafer 100 due to the difference in thermal expansion coefficient between the p⁻-type semiconductor substrate 22 and the resin film 54C; consequently, the warping of the p⁻-type semiconductor substrate 22 and the development of cracks in the films formed over the major surface of the p⁻-type semiconductor substrate 22 can be prevented. Since the resin film 54C is formed by application and baking before dicing the semiconductor wafer 100, the possibility of erroneous contact of the probe during testing the DRAM 1 is reduced to improve the reliability of the wafer inspection process, and the yield of perfect DRAMs is improved.

Thus, the sectional resin film 54C is formed by a sequential steps of applying the resin in a resin film to the entire major surface of the semiconductor wafer 100 having a matrix of regions for the DRAMs 1, removing portions of the resin film corresponding to the scribing areas 100a and regions for the bonding pads BP and dividing a portion of the resin film corresponding to the region for each DRAM 1 into a plurality of sections, and scribing the scribing areas 100A of the semiconductor wafer 100 to divide the semiconductor wafer 100 into the plurality of DRAMs 1. Since the resin film 54C is divided in the process of removing the portions of the resin film 54C corresponding to the scribing areas 100A of the semiconductor wafer 100 and the areas for the bonding pads BP, any special process is not necessary for dividing the resin film 54C.

Seventh Embodiment

A DRAM 1 in the seventh embodiment according to the present invention has column address decoder circuits less than those of the DRAM 1 in the first embodiment.

Figure 56:
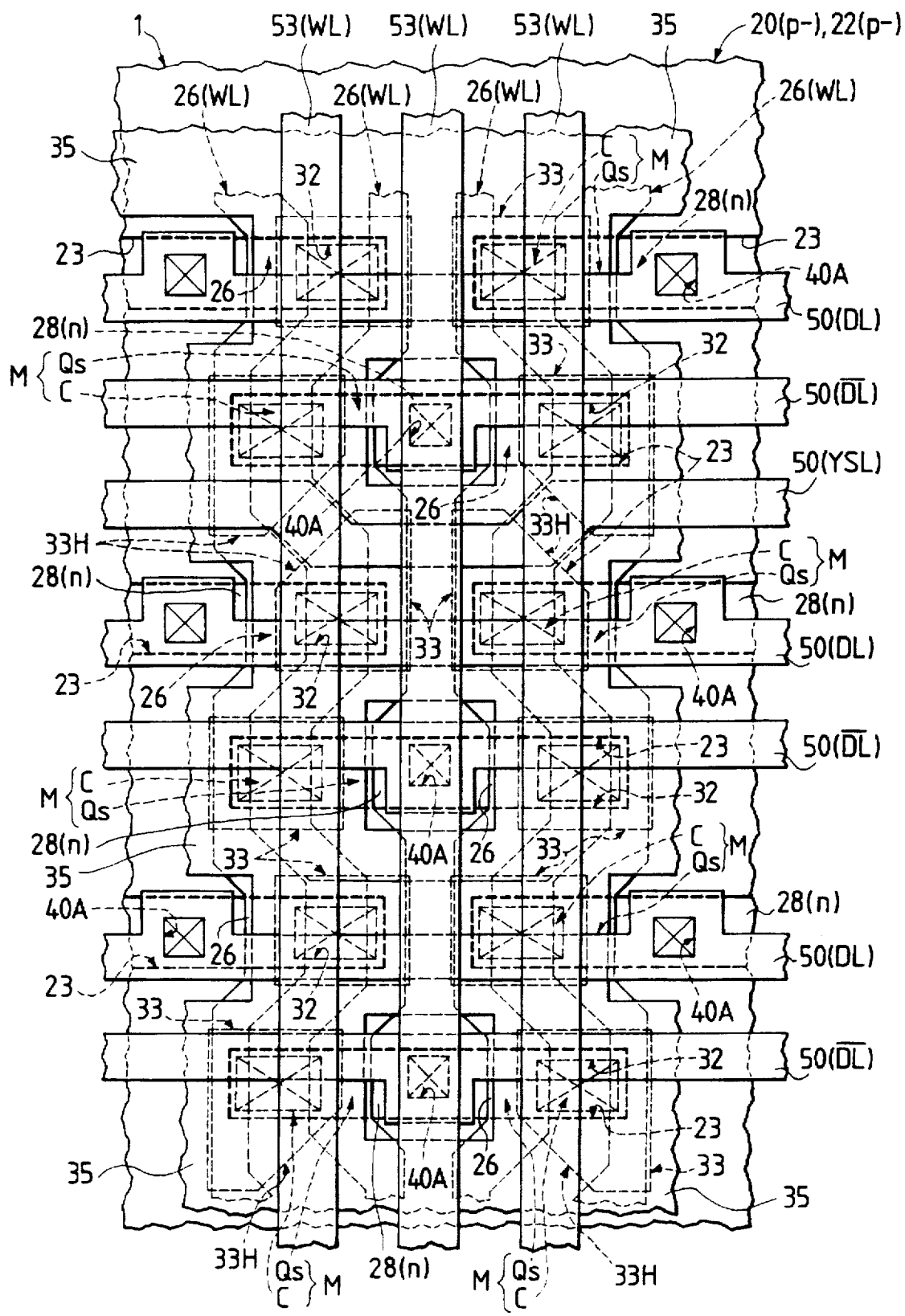
FIG. 56 is a plan view of an essential portion of a DRAM in a sixth embodiment according to the present invention.
Figure 57:
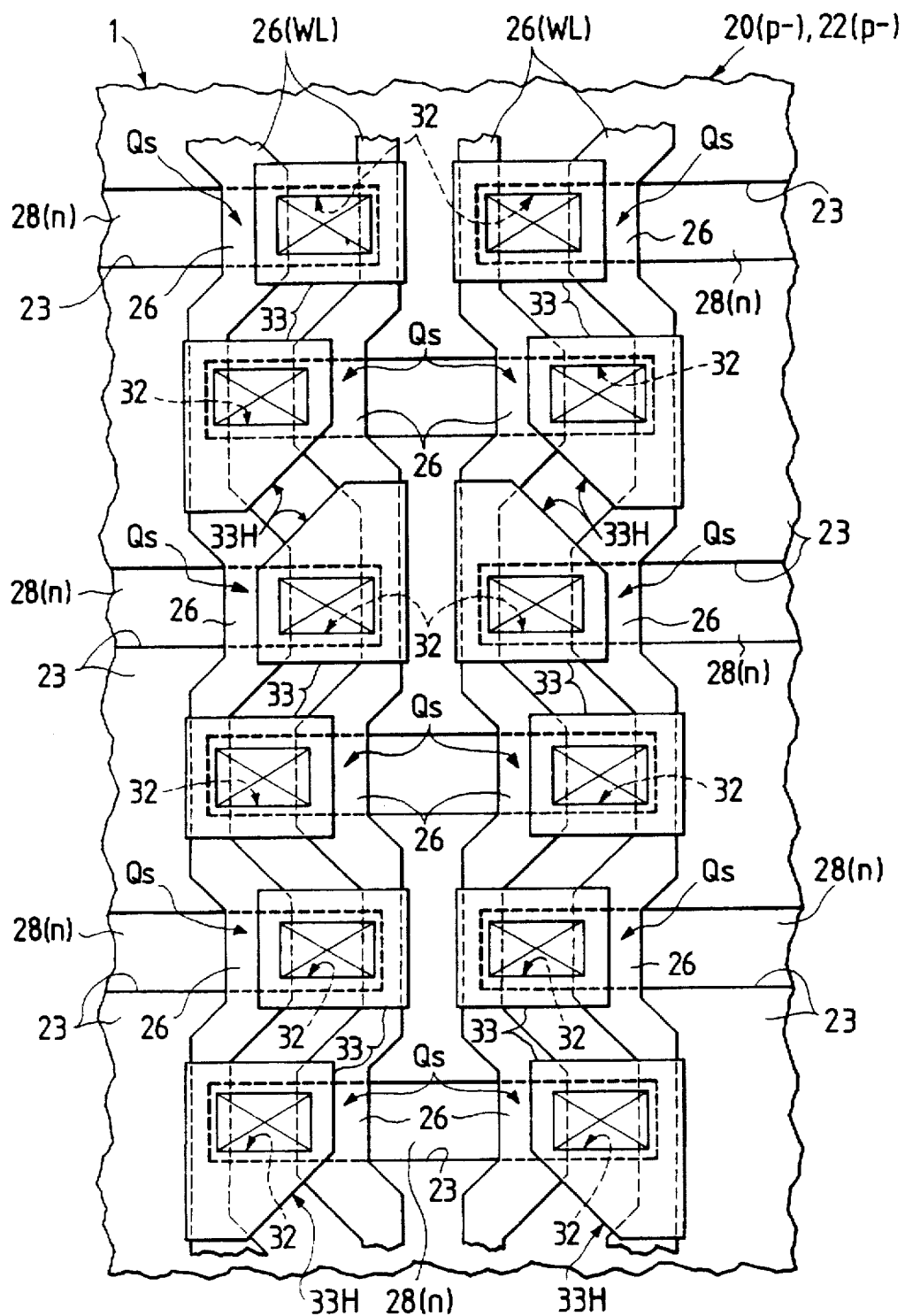
FIG. 57 is a plan view of an essential portion of the DRAM of FIG. 56 in a stage of fabrication.

FIGS. 56 and 57 show the memory cell arrays of the DRAM 1 in the seventh embodiment.

As shown in FIG. 56, the DRAM 1 is provided with column select signal lines (YSL) 50 to decrease the number of the column address decoder circuits (YDEC) 12 as compared with that of the column address decoder circuits (YDEC) of the DRAM 1 in the first embodiment. The column select signal line 50 is connected to the column address decoder circuit 12 to control A column switching n-channel MISFET $Q_y$. The column switching n-channel MISFET $Q_y$ connects the complementary data line 50 and the common data line I/O. The column select signal lines 50 are formed of a wiring material having a small electrical resistivity to enable high-speed read and write operations. The column select signal liens 50 and the complementary data lines 50 are formed by processing the same conductive film by the same process.

Although dependent on the arrangement of the column switching n-channel MISFETs $Q_y$, basically one column select signal line 50 is provided for one set of complementary data lines 50. The DRAM 1 in the seventh embodiment has one column select signal line 50 for two sets of complementary data lines 50, namely, two data lines DL and two data lines $\overline{DL}$. Ordinarily, a dummy column select signal line is extended between one of the two sets of complementary data lines 50 and the other set of complementary data lines 50. The dummy column selector line is provided to prevent increase in the interval between the complementary data lines 50 in the region between the two sets of complementary data lines 50 and to secure the arrangement of the complementary data lines 50 at regular intervals. That is, the dummy column select line is provided to suppress reduction in size of portions of an etching mask extending with an increased interval therebetween due to diffraction in forming the etching mask by etching a photoresist mask by a photolithographic etching process. Etching masks respectively for forming the lower electrodes 33 of the stacked data storage capacitors C, the complementary data lines 50 and the shunt word lines 53 are subject to such dimensional reduction. However, the DRAM 1 in the seventh embodiment is not provided with any dummy column select line because such dimensional reduction is negligible.

The column select signal lines 50, similarly to the dummy column select signal lines, increases the intervals between the complementary data lines 50. The lower electrode 33 of the stacked data storage capacitor C of the memory cell M adjacent to the column select signal line 50 has a size (charge storage capacity) greater than that of the stacked data storage capacitors C of other memory cells M to make allowance for such dimensional reduction. This larger lower electrode 33 is provided with an expansion 33H underlying the column select signal line 50 to increase the size. Since the expansion 33H can be formed in an area occupied by the column select signal line 50 without requiring an additional area, the degree of integration of the DRAM 1 can be increased.

The normal lower electrode 33, namely, the smaller lower electrode 33, has a size sufficient to secure the least necessary charge storage capacity for data reading operation and for sufficient alpha particle soft error immunity. The larger lower electrode 33, namely, the lower electrode 33 provided with the expansion 33H, has a design size making allowance for dimensional reduction to secure at least the least necessary charge storage capacity even if the design size is reduced due to reduction in size of the etching mask by diffraction during the photolithographic etching process. No problem arises when the size of the lower electrode 33 is greater than the least necessary size. Thus, the DRAM 1 has two kinds of stacked data storage capacitors C differing from each other in the size of the lower electrodes 33.

Thus, the DRAM 1 has the memory cells M disposed respectively at the intersections of the complementary data lines 50 and the word lines 26 and each consisting of a series circuit consisting of the memory cell select MISFET $Q_s$ and the stacked data storage capacitor C, and the column select signal lines 50 each for the two sets of complementary data lines 50, extended in the same layer in the same direction as the complementary data lines 50. The lower electrode 33 of the stacked data storage capacitor C of the memory cell M connected to one of the complementary data lines 50 adjacent to the column select signal line 50 is larger than the lower electrodes 33 of the stacked data storage capacitors C of other memory cells M. Since the size of the lower electrode 33 of the stacked data storage capacitor C of the memory cell M connected to one of the complementary data lines 50 adjacent to the column select signal line 50 is increased relative to the size of other lower electrodes 33 by an increment corresponding to the decrease in size of the etching mask for forming the lower electrodes due to diffraction resulting from increase in the interval between the complementary data lines 50 for extending the column select signal line 50 between the complementary data lines 50, the size of the lower electrode 33 is not reduced below the least necessary size, so that the stacked data storage capacitor C is able to secure a sufficient charge storage capacity and, consequently, the alpha particle soft error immunity is improved, the memory cells M can be formed in a reduced area to increase the degree of integration of the DRAM 1.

Eighth Embodiment

A CVD apparatus in an eighth embodiment according to the present invention forms a layer insulating film having an improved quality as compared with that of the DRAM 1 in the first embodiment.

Figure 58:
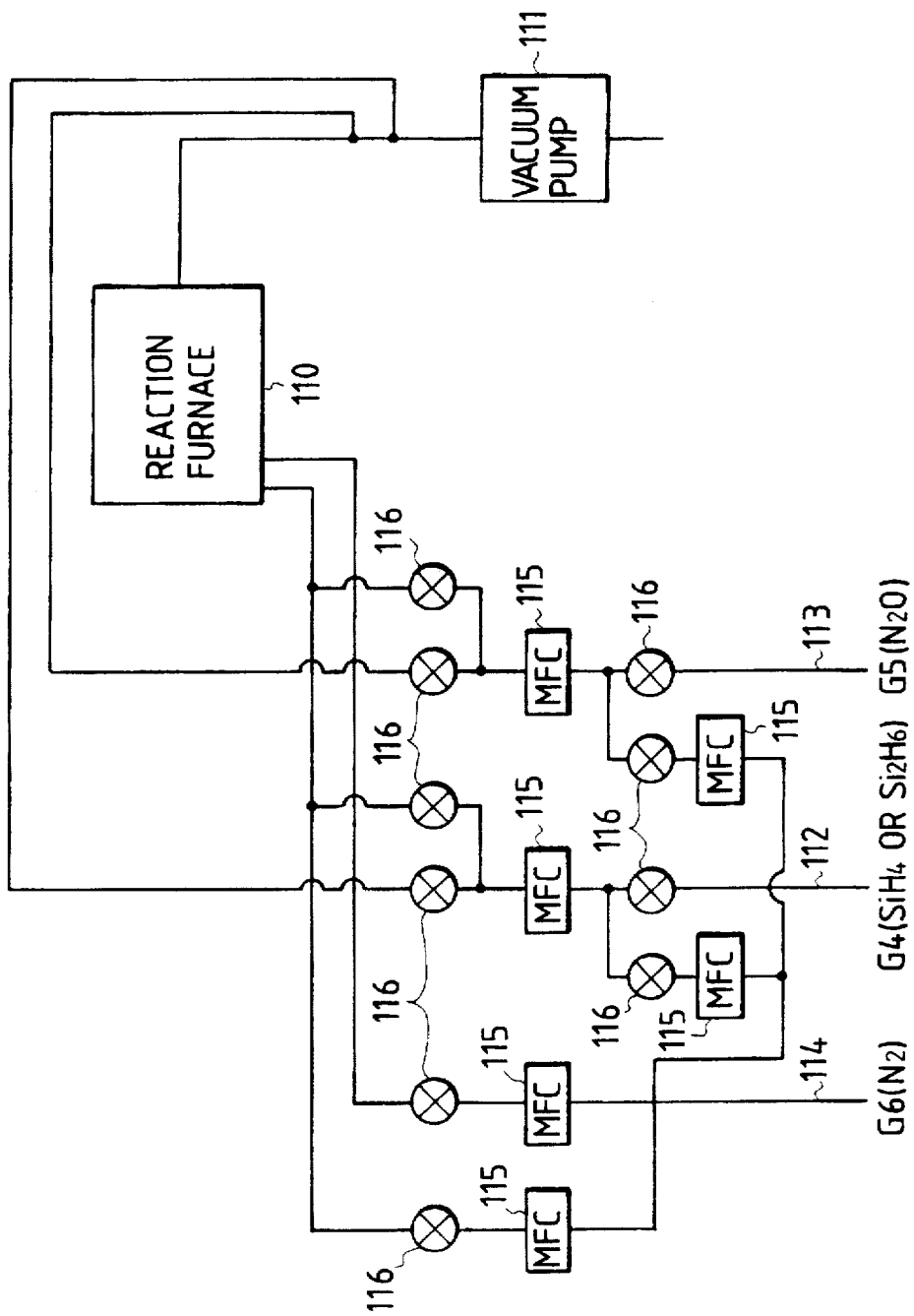
FIG. 58 is a block diagram of a gas supply system included in a CVD apparatus in a seventh embodiment according to the present invention.

Referring to FIG. 58, the CVD apparatus in the eighth embodiment comprises, as the principal components, a reaction furnace 110, a vacuum pump 111, a source gas supply pipes 112 and 113, a carrier gas supply pipe 114, mass flow controllers 115 provided in the gas supply lines, and control valves 116. This CVD apparatus forms silicon dioxide films having high step coverage and having a small shrinkage for the layer insulating film 27, the side wall spacers 29 and the layer insulating film 31 of the DRAM 1 in the first embodiment.

A source gas G4, for example, an inorganic silane gas, such as $SiH_4$ or $Si_2H_6$, is supplied through the source gas supply pipe 112 to the reaction furnace 110. A source gas G5, for example, nitrogen oxide gas (N₂O) is supplied through the source gas supply pipe 113 to the reaction furnace 110. A carrier gas G6, for example, nitrogen gas (N₂) is supplied through the carrier gas supply pipe 114 to the reaction furnace 110.

Figure 59:
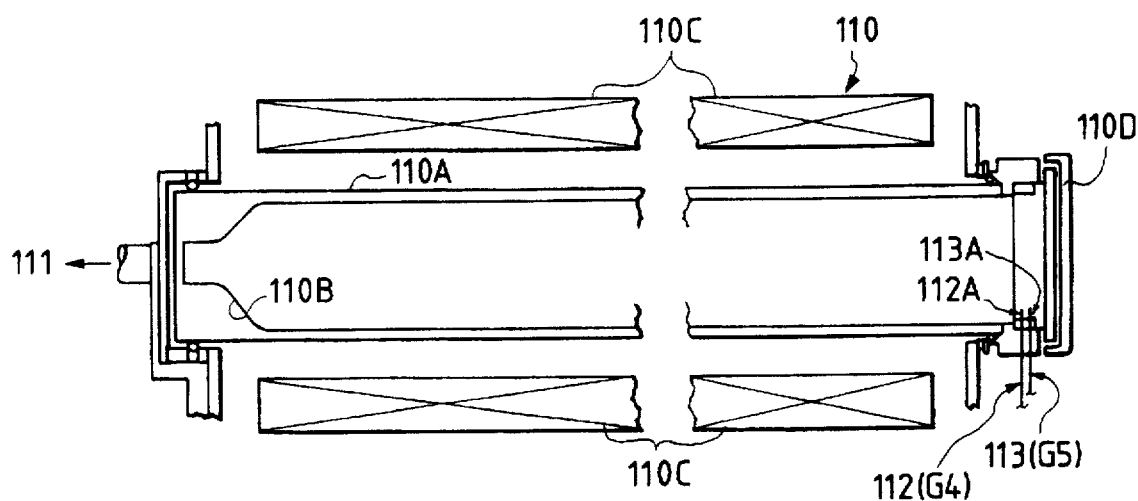
FIG. 59 is a schematic view of an essential portion of the CVD apparatus of FIG. 58.

Referring to FIG. 59, the reaction furnace 110 comprises an outer reaction tube 110A, an inner reaction tube 110B, and a heating unit 110C surrounding the outer reaction tube 110A. One end, i.e., the left-hand end as viewed in FIG. 59, of the outer reaction tube 110A is connected to the vacuum pump 111. A door 110D is provided at the right-hand end, as viewed in FIG. 59, of the reaction furnace 110 to put a plurality of semiconductor wafers 100 into the reaction furnace 110 for batch processing. The semiconductor wafers 100 are held in a standing position, as viewed in FIG. 59, so that the surfaces of the semiconductor wafers 100 on which silicon dioxide films are to be formed intersect the direction of flow of the reaction gas.

Figure 60:
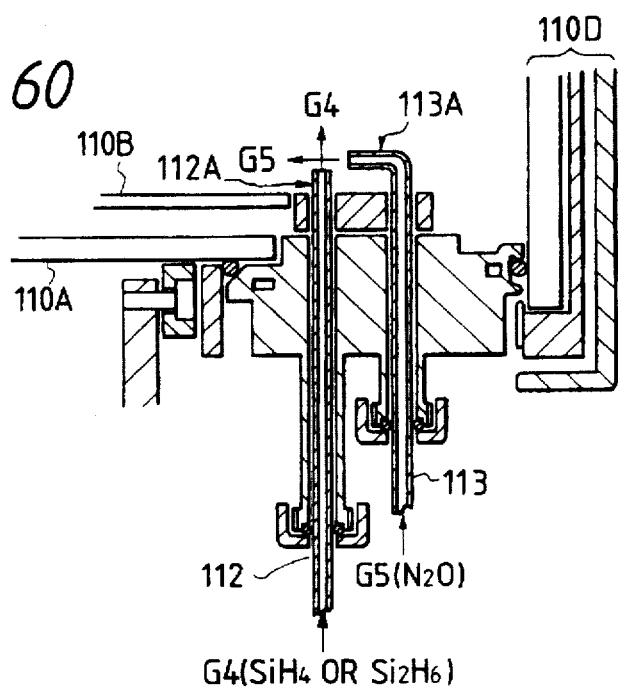
FIG. 60 is an enlarged sectional view of an essential portion of the CVD apparatus of FIG. 58.

A nozzle 112A connected to the source gas supply pipe 112, and a nozzle 113A connected to the source gas supply pipe 113 are provided within the inner reaction tube 110B at the right-hand end of the reaction furnace 110. As shown in an enlarged sectional view in FIG. 60, The nozzles 112A and 113A are formed and disposed so that the source gas G4 injected into the inner reaction tube 110B and the source gas G5 injected into the inner reaction tube 110B through the nozzle 113A are mixed in the inner reaction tube 110B; that is, the nozzles 112A and 113A are formed and disposed so that the respective directions of flow of the source gases G4 and G5 intersect each other.

The respective thermal decomposition points of the source gas G4, such as SiH₄, supplied through the nozzle 112A and the source gas G5, such as N₂O, are about 400° C. and about 550° C. If the source gases G4 and G5 are supplied individually in a simple manner into the inner reaction tube 110b, the source gas G4 (SiH₄) is decomposed first by heat and to contaminate the inner surface of the inner reaction tube 110B and the surfaces of the semiconductor wafers 100 with silicon particles or porous silicon dioxide films. The CVD apparatus mixes the source gases G4 and G5 before the source gas G4 is heated to its thermal decomposition point to dilute the source gas G4 to prevent the contamination of the inner surface of the inner reaction tube 110B and the surfaces of the semiconductor wafers 100.

Concrete conditions for forming the silicon dioxide film by the CVD apparatus are as follows.

1. Source Gas Flow Rate (Source gas G5)/Source gas G4)=15/1 to 20/1
2. Gas Pressure 40 to 60 Pa
3. Film Forming Temperature 800° to 830° C.

The source gases G4 and G5 may be mixed in a place outside the inner reaction tube 110B, i.e., in the source gas supply line.

Thus, the CVD apparatus holds the semiconductor wafers 100 in the reaction furnace and supplies the source gas G4 (inorganic silane gas) and the source gas G5 (nitrogen oxide gas) through one end of the reaction furnace 110 into the reaction furnace 110 to form silicon dioxide films respectively over the surfaces of the semiconductor wafers 100. The source gases G4 and G5 are mixed at a temperature below the thermal decomposition point of the source gas G4 to produce a mixed source gas, and then the mixed source gas is supplied into the reaction furnace 110 internally holding the semiconductor wafers 100. Since the source gas G4 is diluted at a temperature below its thermal decomposition point, the dispersion of foreign matters including silicon particles within the reaction furnace 110 and the adhesion of such foreign matters to the inner surface of the reaction furnace 110 are suppressed; consequently, silicon dioxide films of an improved quality can be formed because the inclusion of foreign matters in the silicon dioxide films formed respectively over the surfaces of the semiconductor wafers 100 is reduced and the contamination of the inner surface of the reaction furnace with the foreign matters is suppressed.

Ninth Embodiment

A continuous processing apparatus in a ninth embodiment according to the present invention forms an insulating film of a three-layer structure having an improved quality. The continuous processing apparatus will be described as applied to forming the insulating film 51 of a three-layer structure formed between the lines 50 and the lines 53 of the DRAM 1 in the first embodiment. The continuous processing apparatus forms successively and continuously the middle silicon dioxide film 51B by application over the lower silicon dioxide film formed previously by deposition by a separate process, and the upper silicon dioxide film 51C by deposition over the middle silicon dioxide film 51B.

Figure 61:
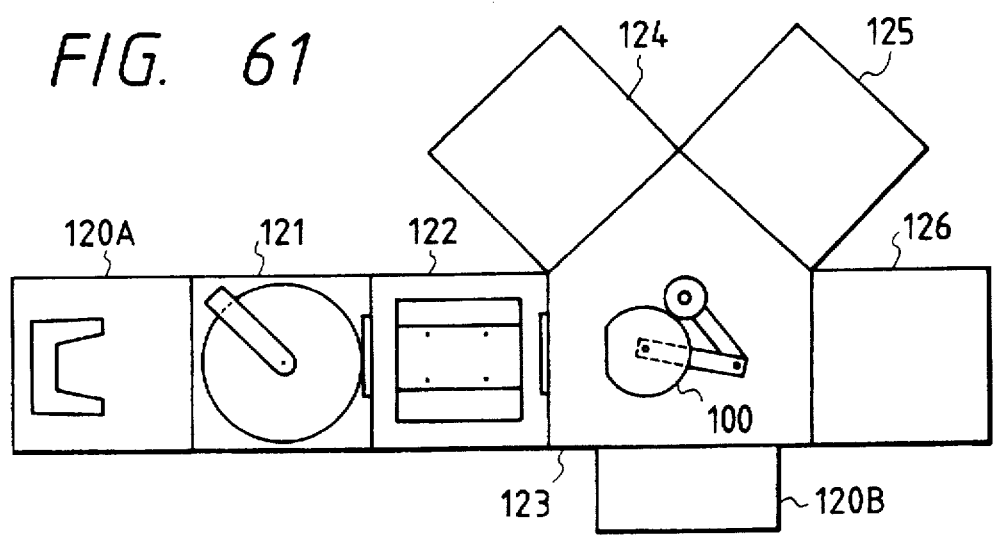
FIGS. 61 and 62 are diagrammatic illustrations of a continuous processing apparatus in an eighth embodiment according to the present invention.

Referring to FIG. 61, the continuous processing apparatus comprises, as the principal units, a wafer loading unit 120A, a SOG applying unit 121, a load lock unit 122, a wafer transfer unit 123, an annealing unit 124, an etching unit 125, a film depositing unit 126, and a wafer unloading unit 120B.

A plurality of semiconductor wafers 100 are contained in the wafer loading unit 120A. The lower silicon dioxide film 51A is formed previously over the lines 50 formed on the surface of each semiconductor wafer 100 by the preceding film forming process. The middle silicon dioxide film 51B, i.e., an applied silicon dioxide film, is formed over the silicon dioxide film 51a by a SOG process in the SOG applying unit 121.

Then, the semiconductor wafer 100 coated with the silicon dioxide film 51B is transferred via the load lock unit 122 and the wafer transfer unit 123 to the annealing unit 124. The silicon dioxide film 51b is subjected to a low-temperature baking process for mineralization, and a hardening baking process.

Then, the baked semiconductor wafer 100 is transferred from the annealing unit 124 to the etching unit 125 by the wafer transfer unit 123. The etching unit 125 etches (etchback) the surface of the silicon dioxide film 51B to remove unnecessary portions of the silicon dioxide film 51B, namely, portions corresponding to the contact holes 52.

Immediately after the completion of the etching process by the etching unit 125, the semiconductor wafer 100 is transferred to the film depositing unit 126 by the wafer transfer unit 123. The film depositing unit 126 deposits the silicon dioxide film 51C over the silicon dioxide film 51B.

Then, the semiconductor wafer 100 coated with the silicon dioxide film 51C is transferred to the wafer unloading unit 120B by the wafer transfer unit 123.

Thus, the continuous processing apparatus carries out continuously the steps of forming the silicon dioxide film 51B over the silicon dioxide film 51A, baking the silicon dioxide film 51B, etching the baked silicon dioxide film 51B and forming the silicon dioxide film 51C over the silicon dioxide film 51B immediately after etching without exposing the silicon dioxide film 51B to the external atmosphere.

Thus the method of fabricating the DRAM 1, including baking the silicon dioxide film 51B formed by application over the underlying surface (the silicon dioxide film 51A formed by deposition) and depositing the silicon dioxide film 51C over the baked silicon dioxide film 51B carries out successively within a system isolated from the external atmosphere (the apparatus) the process of forming the silicon dioxide film 51B by application, the process of baking the silicon dioxide film 51B, the process of etching back the silicon dioxide film 51B and the process of depositing the silicon dioxide film 51C over the silicon dioxide film 51B. Therefore, the silicon dioxide film 51B is coated with the silicon dioxide film 51C without being exposed to the external atmosphere after being baked, so that the moisture absorption of the silicon dioxide film 51B is reduced and the deterioration of the quality of the silicon dioxide film 51B is suppressed. Consequently, the adhesion of the silicon dioxide film 51C to the silicon dioxide film 51B underlying the silicon dioxide film 51C is improved and the variation of etching rate in etching the silicon dioxide film is prevented.

Figure 62:
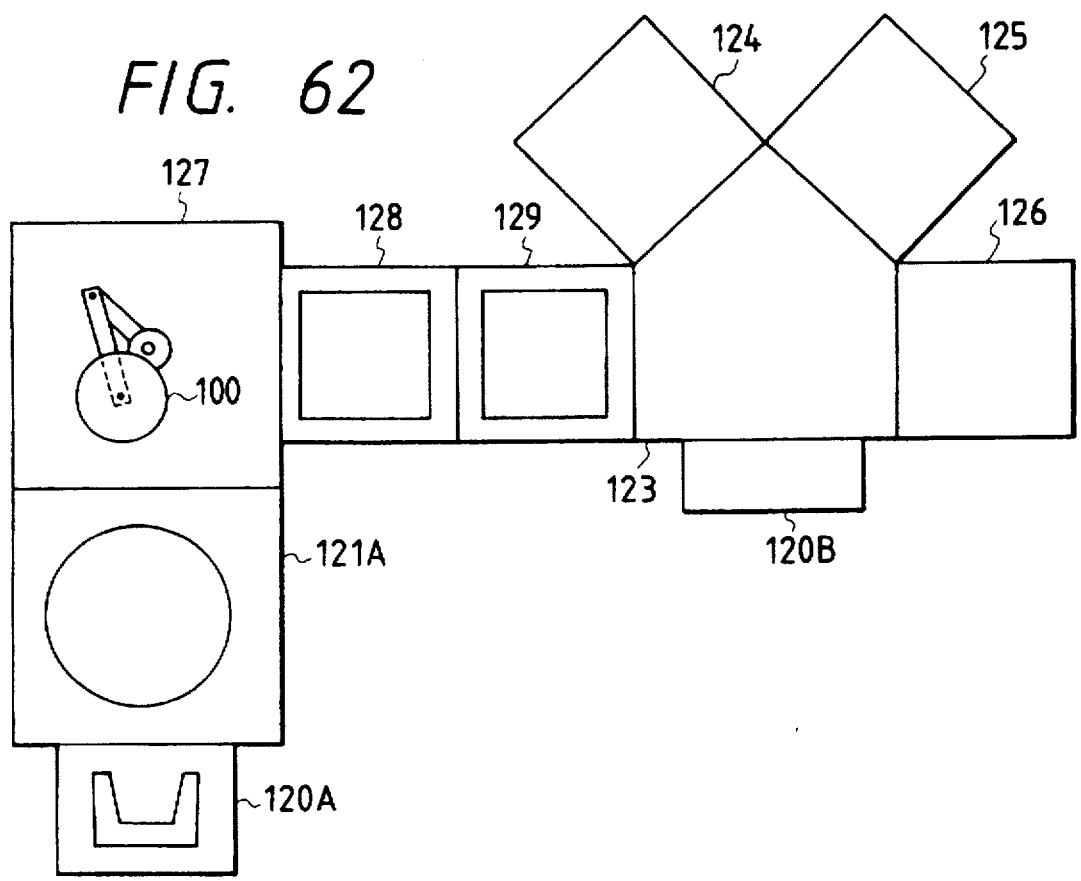

A continuous processing apparatus shown in FIG. 62 may be employed in fabricating the DRAM 1 of the present invention. This continuous processing apparatus comprises a wafer loading unit 120A, a batch type SOG applying unit 121A, a wafer transfer unit 127, a wafer cooling unit 128, a wafer storage unit 129, a wafer transfer unit 123, an annealing unit 124, an etching unit 125, a film depositing unit 126 and a wafer unloading unit 120B. This arrangement is optimum when semiconductor wafers cannot be subjected to the baking process immediately after forming the silicon dioxide films 51B by application on a plurality of semiconductor wafers in a batch. The semiconductor wafers are stored after the silicon dioxide films 51B are formed on the semiconductor wafers by application without being exposed to the external atmosphere until the semiconductor wafers are transferred to the annealing unit 124.

While the invention has been shown and described with reference to the preferred embodiments thereof, those embodiments are illustrative and not restrictive, and various changes and modifications may be made in the invention without departing from the spirit and scope thereof.

For example, the present invention may be applied to a semiconductor device, such as a microcomputer (one-chip computer) or the like employing a DRAM as one of the components.

The present invention is not limited in its application only to the DRAM, but may be applied to various semiconductor integrated circuits having data storage function, such as SRAMs and ROMs.

Principal effects of the present invention are as follows.

(1) Increase of the degree of integration of data storage semiconductor devices (2) improvement of the soft error immunity of data storage semiconductor devices (3) Enhancement of the operating speed of data storage semiconductor devices (4) Improvement of the electrical reliability of data storage semiconductor devices (5) Improvement of processing accuracy of processes of fabricating data storage semiconductor devices (6) Improvement of the yield of perfect data storage semiconductor devices (7) Reduction in the number of steps of the process of fabricating data storage semiconductor devices (8) improvement of the quality of insulating films for data storage semiconductor devices (9) Provision of an apparatus capable of forming insulating films having an improved quality

(10) Enhancement of the external device driving ability of data storage semiconductor devices

(11) Formation of elements having flat surfaces for data storage semiconductor devices

(12) Stabilization of the process of fabricating data storage semiconductor devices

(13) Provision of an apparatus capable of stably carrying out the process of fabricating data storage semiconductor devices

(14) Enhancement of the breakdown strength of data storage semiconductor devices.

What is claimed is:

1. A semiconductor integrated circuit having a DRAM comprising: memory cell arrays each consisting of a matrix of memory cells each consisting of a series circuit consisting of a memory cell select MISFET and a stacked data storage capacitor formed over the memory cell select MISFET; and peripheral circuits arranged in peripheral regions around the memory cell arrays, the stacked data storage capacitor extending to a greater height than a height of the peripheral circuits, the semiconductor integrated circuit further comprising at least one leveling layer between the memory cell arrays and the peripheral circuits, including outside of the memory cell arrays.

2. A semiconductor integrated circuit according to claim 1, wherein guardring regions are formed between the memory cell arrays and the peripheral circuits, and said at least one leveling layer is formed on the guardring regions.

3. A semiconductor integrated circuit according to claim 2, wherein a width of each guardring region is equal to a gate width of the memory cell select MISFETs of said memory cells.

4. A semiconductor integrated circuit according to claim 1, wherein the stacked data storage capacitor has a lower electrode and an upper electrode.

5. A semiconductor integrated circuit according to claim 4, wherein the at least one leveling layer is formed of a same conductive layer from which the upper electrode of the stacked data storage capacitor is formed, or is formed of a same conductive layer from which the lower electrode of the stacked data storage capacitor is formed, or is formed of same conductive layers respectively from which the lower electrode and upper electrode of the stacked data storage capacitor are formed.

6. A semiconductor integrated circuit according to claim 1, wherein the at least one leveling layer is provided on first and second portions between the memory cell arrays and the peripheral circuits, the first portion being closer to the memory cell arrays and the second portion being closer to the peripheral circuits, and wherein the at least one leveling layer provided on the first portion is formed of same conductive layers respectively from which the lower electrode and the upper electrode are formed, and the at least one leveling layer provided on the second portion is formed of a same conductive layer from which the lower electrode or the upper electrode is formed.

7. A semiconductor integrated circuit according to claim 6, wherein the at least one leveling layer provided on the first portion includes a first sub-layer formed from the same conductive layer from which the lower electrode is formed and a second sub-layer formed from the same conductive layer from which the upper electrode is formed, the second sub-layer being above the first sub-layer.

8. A semiconductor integrated circuit according to claim 7, wherein the lower electrode of a respective stacked data storage capacitor is individual to the respective stacked data storage capacitor, and the upper electrode is common to stacked data storage capacitors of adjacent memory cells.

9. A semiconductor integrated circuit according to claim 1, wherein the at least one leveling layer is made of a conductive material.

10. A semiconductor integrated circuit according to claim 1, wherein the at least one leveling layer is provided to reduce a step height between the stacked data storage capacitor and a height in the peripheral regions, as compared to a step height therebetween without the at least one leveling layer.

11. A semiconductor integrated circuit according to claim 1, wherein the peripheral regions enclose the memory cell arrays.

12. A semiconductor integrated circuit according to claim 2, wherein the guardring regions are of a second conductivity type on a semiconductor substrate of a first conductivity type opposite to the second conductivity type, source and drain regions of the memory cell select MISFET also being provided on said semiconductor substrate.

13. A semiconductor integrated circuit according to claim 1, wherein the lower electrode of a respective stacked data storage capacitor is individual to the respective stacked data storage capacitor, and the upper electrode is common to stacked data storage capacitors of adjacent memory cells.

* * * * *